(12) United States Patent
Powell et al.

(10) Patent No.: US 7,449,065 B1
(45) Date of Patent: Nov. 11, 2008

(54) METHOD FOR THE GROWTH OF LARGE LOW-DEFECT SINGLE CRYSTALS

(75) Inventors: J. Anthony Powell, North Olmsted, OH (US); Philip G. Neudeck, Olmsted Falls, OH (US); Andrew J. Trunek, Chargin Falls, OH (US); David J. Spry, Medina, OH (US)

(73) Assignee: Ohio Aerospace Institute, Cleveland, OH (US)

( * ) Notice: Subject to any disclaimer, the term of this patent is extended or adjusted under 35 U.S.C. 154(b) by 178 days.

(21) Appl. No.: 11/633,111

(22) Filed: Dec. 2, 2006

(51) Int. Cl.
*C30B 25/12* (2006.01)
*C30B 25/14* (2006.01)

(52) U.S. Cl. .................. 117/84; 117/93; 117/108; 117/109

(58) Field of Classification Search .......... 117/84, 117/93, 108, 109; 438/478
See application file for complete search history.

(56) References Cited

U.S. PATENT DOCUMENTS

| | | | |
|---|---|---|---|
| 2,854,364 A | 9/1958 | Lely et al. | |
| 3,346,414 A | 10/1967 | Ellis et al. | |
| 3,721,732 A | 3/1973 | Knippenberg et al. | |
| 3,944,640 A | 3/1976 | Haggerty et al. | |
| 4,013,503 A | 3/1977 | Knippenberg et al. | |
| 5,463,978 A | 11/1995 | Larkin et al. | |
| 5,704,985 A | 1/1998 | Kordina et al. | |
| 5,746,827 A | 5/1998 | Barrett et al. | |
| 5,915,194 A | 6/1999 | Powell et al. | |
| 6,165,874 A | 12/2000 | Powell et al. | |
| 6,428,621 B1 | 8/2002 | Vodakov et al. | |
| 6,488,771 B1 | 12/2002 | Powell et al. | |
| 6,783,592 B2 | 8/2004 | Neudeck et al. | |

OTHER PUBLICATIONS

Chapter 6, in the VLSI Handbook edited by Wai-Kai Chen, CRC Press LCC, Boco Raton, Florida, 2000.
M. Dudley et al., "Quantitative Analysis of Screw Dislocation in 6H-SiC Single Crystals," II Nuovo Cimento, vol. 19D, No. 2-4, pp. 153-164, 1997 (Presented at the 3rd European Symposium on X-ray Topography and High-Resolution X-ray Diffraction (X-TOP '96, Apr. 22-24, 1996, Palermo, Italy).
J. A. Powell, P. Pirouz, and W. J. Choyke, "Growth and Characterization of Silicon Carbide Polytypes for Electronic Applications," Chapter 11 in *Semiconductor Interfaces, Microstructures, and Devices: Properties and Applications*, Z. C. Feng, Ed. Bristol, United Kingdom: Institute of Physics Publishing, 1993, pp. 257-293.

(Continued)

*Primary Examiner*—Felisa C Hiteshew
(74) *Attorney, Agent, or Firm*—John P McMahon

(57) ABSTRACT

A method and the benefits resulting from the product thereof are disclosed for the growth of large, low-defect single-crystals of tetrahedrally-bonded crystal materials. The process utilizes a uniquely designed crystal shape whereby the direction of rapid growth is parallel to a preferred crystal direction. By establishing several regions of growth, a large single crystal that is largely defect-free can be grown at high growth rates. This process is particularly suitable for producing products for wide-bandgap semiconductors, such as SiC, GaN, AlN, and diamond. Large low-defect single crystals of these semiconductors enable greatly enhanced performance and reliability for applications involving high power, high voltage, and/or high temperature operating conditions.

46 Claims, 18 Drawing Sheets

OTHER PUBLICATIONS

P.G. Neudeck and J. A. Powell, "Homoepitaxial and Heteroepitaxial Growth in Step- Free SiC Mesas," in *Silicon Carbide-Recent Major Advances*, W. J. Chovke, H. Matsunami, and G. Pensl, Eds. Heidelberg, Germany: Springer-Verlag, 2003, pp. 179-205.

A.R. Powell, J.J. Sumakeris et al, Status of 4H-SiC Substrate and Epitatial Materials for Commerical Power Applications Mat. Res. Soc. Symp. Proc. vol. 815@ 2004 Material Research Society.

H. Lendenmann, F. Dahlquist, J. P. Bergman, H. Bleichner, and C. Hailen, "High-Power SiC Diodes: Characteristics, Reliability and Relation to Material Defects," Mat. Sci. Forum, vol. 389-393, pp. 1259-1264, 2002 (ICSCRM 2001).

S. Ha, P. Mieszkowski, M. Skowronski, and L. B. Rowland, "Dislocation conversion in 4H silicon carbide epitaxy," *Journal of Crystal Growth*, vol. 244, pp. 257-266, 2002.

H. Matsunami, "Technological Breakthroughs in Growth Control of Silicon Carbide for High Power Electronic Devices," *Jpn. J. of Appl. Phys.*, vol. 43, pp. 6835-6847, 2004.

K. Semmelroth, N. Schulze, and G. Pensl, "Growth of SiC polytypes by the physical vapour transport technique," *Journal of Physics: Condensed Matter*, vol. 16, pp. Si597, 2004.

B. Sundqvist, A. Ellison, A. Jonsson, A. Henry, C. Hallin, J. P. Bergman, B. Magnusson, and E. Janzen, "Growth of High Quality p-type 4H-SiC Substrates by HTCVD," Mat. Sci. Forum, vols. 473-436, pp. 21-24, 2003 (presented at ECSCRM 2002).

N. Schulze, D. L. Barrett, and G. Pensl, "Near-Equilibrium Growth of Micropipe-Free 6H-SiC Single Crystals by Physical Vapor Transport," *Applied Physics Letters*, vol. 72, pp. 1632-1634, 1998.

M. Tuominenm, R. Yakimova, A. Vehanen, and E. Janzen, "Defect Origin and Development in Sublimation Grown SiC Boules," Materials Science and Engineering B57, pp. 228-233, 1999.

K. Nakayama, Y. Miyanagi, H. Shiomi, S. Nishino, T. Kimoto, and H. Matsunami, "The Development of 4H-SiC {0338} Wafers," Mat. Sci. Forum, vols. 389-393, pp. 123-126, 2002 (presented at ICSCRM 2001).

E. N. Mokhov, M. G. Ramm, M. S. Ramm, A. D. Roenkov, Y. A. Vodakov, S. Y. Karpov, Y. A. Makarov, and H. Helava, "Growth of Faceted Free-Spreading SiC Bulk Crystals by Sublimation," Mat. Sci. Forum, vol. 433-436, pp. 29-32, 2003, (presented at ECSCRM 2002).

D. Nakamura, I. Gunjishima, S. Yamaguchi, T. Ito, A. Okamoto, H. Kondo, S. Onda, and K. Takatori, "Ultrahigh-quality silicon carbide single crystals," *Nature*, vol. 430, pp. 1009-1012, 2004.

D. Nakamua, in oral discussion following Invited Talk at the European Conference on Silicon and Related Materials, Aug. 31-Sep. 4, 2004, Bologna, Italy (ECSCRM 2004).

S.N. Gorin and L.M. Ivanova, "Cubic Silicon Carbide (3C-SiC): Structure and Properties of Single Crystals Grown by Thermal Decomposition of Methyl Trichlorosilane in Hydrogen," Phys. Stat. Sol. (b), vol. 202, pp. 221-245, 1997.

H. Nagasawa, K. Yagi, T. Kawahara, and N. Hatta "Reducing Planar Defects in 3C-SiC", Chemical Vapor Deposition, vol. 12, pp. 502-508.

J. A. Powell, "Crystal Growth of 2H Silicon Carbide", J. Appl. Phys., vol. 40, pp. 4660-4662, 1969.

M. Dudley, W. Huang, W. M. Vetter, P. Neudeck, and J. A. Powell, "Synchrotron White Beam Topography Studies of 2H SiC Crystals", in Silicon Carbide and Related Materials 1999, C. H. Carter, Jr., R. P. Devaty, and G. S. Rohrer, Editions, 2000, Trans Tech Publications: Switzerland, pp. 465-468.

Philip R. Tavernier and David R. Clarke, "Progress Toward Making Gallium Nitride Seed Crystals Using Hydride Vapor-Phase Epitaxy," J. Am. Ceram. Soc., vol. 85, No. 1, pp. 49-54, 2002.

A. Franzosi, L. Giarda, and L. Pelosini, "Process of Deposition of Single Crystal Silicon Directly from the Vapour Phase", PB82-187444, Commision of the European Communities, Energy, EUR-7093-EN, 1981.

H. J. Scheel, "Historical Aspeccts of Crystal Growth Technology," J. Crystal Growth, vol. 211, pp. 1-12, 2000.

R.L. Myers, O. Kordina, S. Rao, R. Everly, and S.E. Saddow, "Increased Growth Rate in a SiC Reactor Using HCl as an Additive," Mat. Sci. Forum, vols. 483-485, pp. 73-76, 2005, (ECSCRM 2004).

J. A. Powell and H. A. Will, "Expitaxial Growth of 6H Silicon Carbide in the Temperature Range 1320° to 1390°C," J. Appl. Phys., vol. 44, pp. 5177-5178, 1973.

C. Jacquier, G. Ferro, C. Balloud, M. Zielinski, J. Camassel, E. Polychroniadis, J. Stoemenos, F. Cauwet, and Y. Monteil, "Growth and Characterization of Heavily Al-Doped 4H- SiC Layers Grown by VLS in an Al-Si Melt," Mat. Sci. Forum, vols. 457-460, pp. 735-738, 2004, (ICSCRM 2003).

L. B. Griffiths and A. I. Mlavsky, "Growth of $\alpha$-SiC Single Crystals from Chromium Solution," J. Electrochem. Soc., vol. 111, No. 7, pp. 805-810, 1964.

D. Reyes Ardila, M R. B. Andreeta, S. L. Cuffini, A. C. Hernandes, J. P. Andreeta, Y. P. Mascarenhas, "Single-Crystal Sr $TiO_3$ Fiber Grown by Laser Heated Pedestal Growth Method: Influence of Ceramic Feed Rod Preparation in Fiber Quality", Mat. Res., vol. 1, No. 1, pp. 11-17, 1998.

S. Nakamura , T. Kimoto, and H. Matsunami, "Effect of C/Si Ratio on Spiral Growth on 6H-SiC (0001)," *Jpn. J. of Appl. Phys.*, vol. 42, pp. L846-L848, 2003.

P. G. Neudeck, A. J. Trunek, and J. A. Powell, "Atomic Force Microscope Observation of Growth and Defects on As-Grown (111) 3C-SiC Mesa Surfaces," Mat. Res. Soc. Symp. Proc., vol. 815, pp. Materials Research Society, 2004.

R. Singh, "Reliability and Performance Limitations in SiC Power Devices" Microelectronics and Reliability, vol. 46, pp. 713-730, 2006.

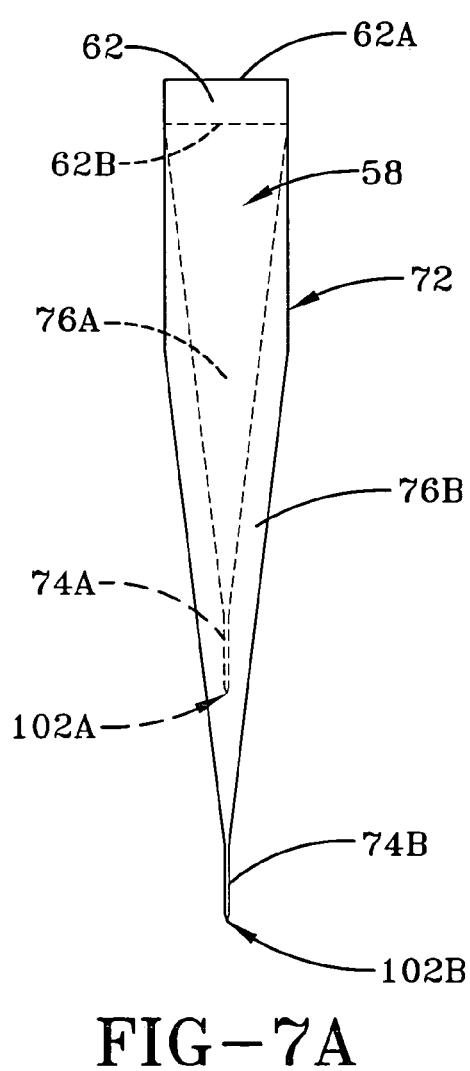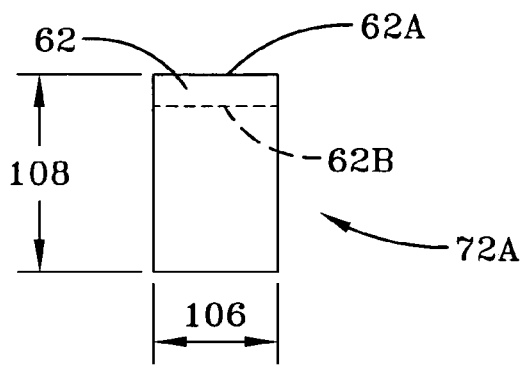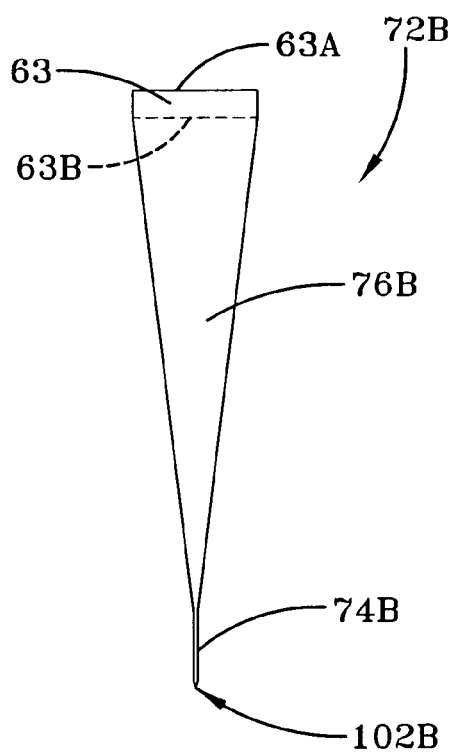
FIG-7C
FIG-7B
FIG-7A

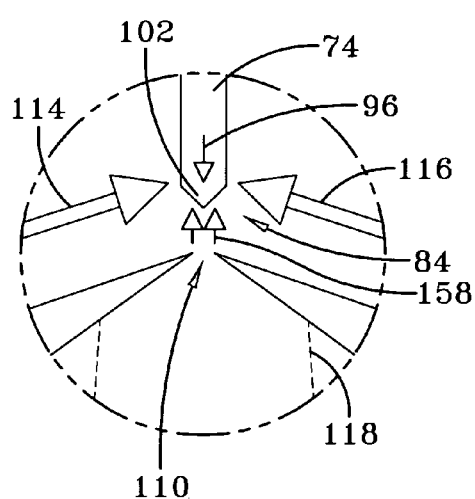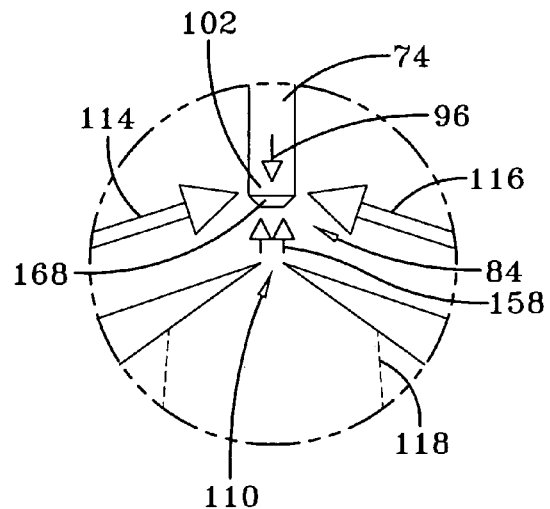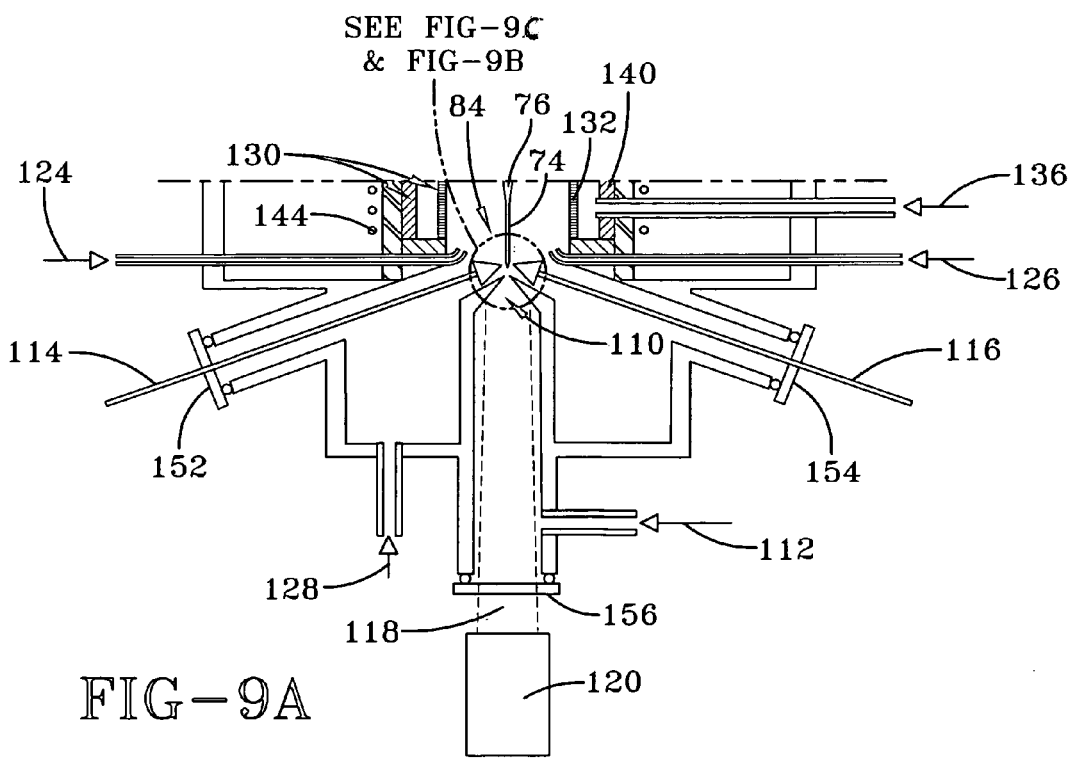

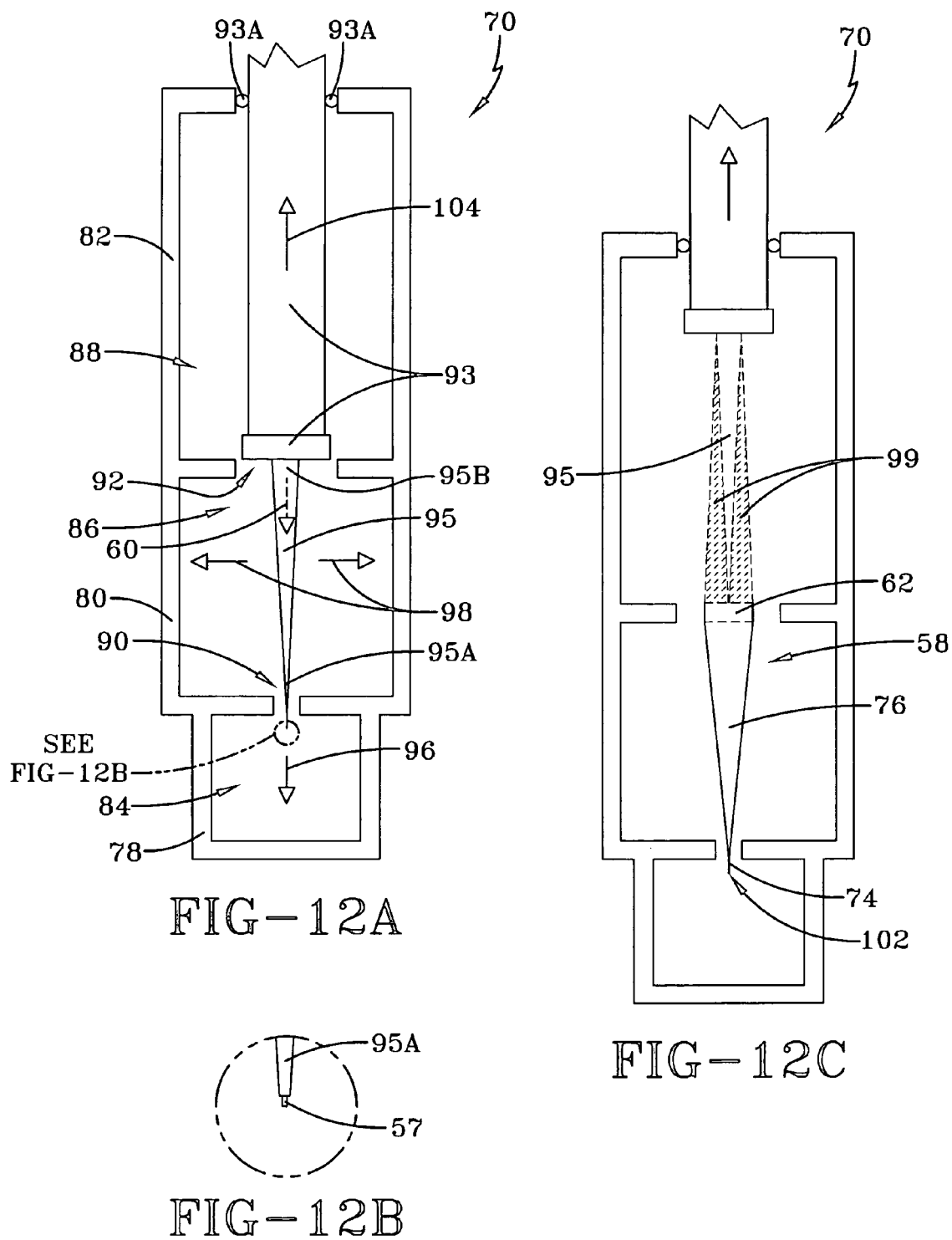

METHOD FOR THE GROWTH OF LARGE LOW-DEFECT SINGLE CRYSTALS

ORIGIN OF THE INVENTION

The invention described herein was made in the performance of work under NASA contracts and is subject to the provisions of Section 305 of the National Aeronautics and Space Act of 1958, Public Law 85-568 (72 Stat. 435; 42 U.S.C. 2457).

FIELD OF THE INVENTION

The invention relates to the crystal growth of wide-bandgap semiconductor bulk crystals, and more particularly, to a method for growing relatively large single crystals that are nearly free of extended structural crystal defects. In some embodiments, the invention provides a method that utilizes single-dislocation-assisted growth of the small-diameter end of a large tapered crystal seed in an axial direction parallel to a selected crystal direction, combined with lateral growth on the side wall of the large tapered crystal seed. In other embodiments, crystal growth proceeds without dislocations. The invention has application in the growth of single crystals to be used as (a) semiconducting materials for use in harsh-environment and/or high power electronics and micromechanical systems, and (b) colorless and colored gemstones for jewelry and other product applications. The semiconductor materials are used in electronic devices for application in high power, high frequency, high temperature and high radiation environments, as well as used in optoelectronic devices such as lasers and light-emitting diodes.

BACKGROUND OF THE INVENTION

Semiconductor devices, all types of which are related to the present invention, are used in a wide variety of electronic applications. Semiconductor devices include diodes, transistors, integrated circuits, sensors, and opto-electronic devices, such as light-emitting diodes, diode lasers, radiation detectors, and solid-state photodetectors. Various semiconductor devices using silicon or compound semiconductors, such as gallium arsenide (GaAs) and gallium phosphide (GaP), are commonly used. In order to fabricate semiconductor devices with desired operational electrical performance characteristics, it is necessary to be able to grow high-quality, low-defect-density single crystal films with controlled impurity incorporation while possessing good surface morphology. The substrate upon which the film is grown should also be a high-quality, low-defect-density single crystal as crystal film quality is well-known to depend upon substrate quality to a large extent. In recent years, there has been an increasing interest in research on wide-bandgap (WBG) semiconductors for use in high temperature, high power, high frequency, and/or high radiation operating conditions under which silicon and conventional Group III-V semiconductors cannot adequately function. Particular research emphasis has been placed on SiC, and Group III-Nitride compounds and their alloys, including AlN, GaN, InGaN, AlGaN, and others. Diamond is also a potentially important WBG material.

Conventional semiconductors are unable to meet some of the increasing demands of the automobile and aerospace industries as they move to smarter and more electronic systems. New wide-bandgap (WBG) single-crystal semiconductor materials are being developed to meet the diverse demands for more power at higher operating temperatures. Two of the most promising emerging wide bandgap semiconductors are silicon carbide (SiC) and gallium nitride (GaN). The bandgap of these materials is two to three times as large as that of silicon. This advantage theoretically translates into very large improvements in power handling capabilities and higher operating temperatures that will enable revolutionary product improvements. Once material-related technology obstacles are overcome, SiC's properties are expected to dominate high power switching and harsh-environment electronics for manufacturing and engine control applications, while GaN will enable high-power, high-frequency microwave systems at frequencies beyond 10 GHz. To date, the best SiC devices to our knowledge are fabricated in homoepitaxial films while Group III-Nitride (also referred to herein as III-Nitride) devices are mostly fabricated in heteroepitaxial films (i.e., grown on SiC or sapphire wafers with electrically-active device layers of GaN, AlGaN, AlN, etc.) because production of bulk III-Nitride wafers is currently in an early stage of development.

The performance and the commercialization of high-electric-field SiC power devices is well known to be severely limited by the presence of dislocations in the SiC substrate that, until now, have propagated into the epitaxial layers making up the SiC devices. The best performing SiC high field devices have always been those that are small enough to fit between crystal dislocations, since device performance degrades as the sizes of the devices increase to encompass more and more dislocations. This performance degradation is more fully described in Chapter 6, of the VLSI Handbook, edited by Wai-Kai Chen, CRC Press LCC, Boco Raton, Fla., 2000. One kind of dislocation found in abundance in SiC substrates and epilayers are screw dislocations. Screw dislocations in SiC are further described in three technical articles of M. Dudley et al, "Quantitative Analysis of Screw Dislocation in 6H—SiC Single Crystals," II Nuovo Cimento, Vol. 19D, No. 2-4, pp 153-164, 1997 (Presented at the $3^{rd}$ European Symposium on X-ray Topography and High-Resolution X-ray Diffraction (X-TOP '96, 22-24 Apr. 1996, Palermo, Italy); J. A. Powell, P. Pirouz, and W. J. Choyke, "Growth and Characterization of Silicon Carbide Polytypes for Electronic Applications," Chapter 11 in *Semiconductor Interfaces, Microstructures, and Devices: Properties and Applications*, Z. C. Feng, Ed. Bristol, United Kingdom: Institute of Physics Publishing, 1993, pp. 257-293, and P. G. Neudeck and J. A. Powell, "Homoepitaxial and Heteroepitaxial Growth on Step-Free SiC Mesas," in *Silicon Carbide-Recent Major Advances*, W. J. Choyke, H. Matsunami, and G. Pensl, Eds. Heidelberg, Germany: Springer-Verlag, 2003, pp. 179-205. Additionally, processes for relocating screw dislocations are described in the already mentioned technical article of P. G. Neudeck et al and U.S. Pat. No. 6,783,592B2.

Silicon carbide crystals exist in hexagonal, rhombohedral and cubic crystal structures called polytypes. A general discussion of SiC crystal structure can also be found in the previously mentioned technical article of J. A. Powell, P. Pirouz, and W. J. Choyke. Generally, the cubic structure, with the zincblende structure, is referred to as β-SiC or 3C—SiC, whereas numerous polytypes of the hexagonal and rhombohedral structures are collectively referred to as α-SiC. To our knowledge, only bulk (i.e., large) crystals of the α polytypes, with sufficient quality for beneficial electronic devices, have been grown to date. The β (or 3C) polytype can only be obtained as (1) small (less than 1 $cm^2$) blocky crystals or thick epitaxial films on small (less than 1 $cm^2$) 3C substrates or as (2) crystal films grown heteroepitaxially on some other substrate. The most commonly available α-SiC polytypes are 4H—SiC and 6H—SiC; these are commercially available as polished wafers that are cut from large crystal boules grown by a sublimation process, described herein. Commercial wafers are presently available up to 100 mm in diameter. But these commercial wafers have a high density of structural imperfections (i.e. dislocation defects) to be described herein more fully. Each of the SiC polytypes has its own specific advantages over the others. For example, (1) 4H—SiC has a significantly higher electron mobility compared to 6H—SiC, (2) 6H—SiC is used as a substrate for the commercial fabrication of GaN blue light-emitting diodes (LEDs), and (3) 3C—SiC has a high electron mobility similar to that of 4H and may function over wider temperature ranges, compared to the α polytypes, but 3C—SiC crystals of sufficient quality and size for beneficial electronic devices have not been available.

The WBG semiconductors, SiC and the III-Nitride compounds, exhibit tetrahedral bonding. In this configuration, each atom of one element is surrounded by (and bonded to) four atoms of the other element type that form the corners of a tetrahedron. Silicon carbide polytypes are formed by the stacking of double layers (also referred to herein as bilayers) of Si and C atoms. Each double layer may be situated in one of three positions known as A, B, and C to be described hereinafter. The sequence of stacking determines the particular polytype; for example, the repeat sequence for 3C is ABCABC ... (or ACBACB ...) the repeat sequence for 4H is ABACABAC .... The repeat sequence for 6H is ABCACBABCACB .... The number in the polytype designation gives the number of double layers in the repeat sequence and the letter denotes the structure type (cubic, hexagonal, or rhombohedral). The SiC polytype 3C—SiC has a crystal structure that is commonly known as the zinc blende crystal structure, and the SiC polytype 2H—SiC (with a repeat sequence of ABAB ...) has a crystal structure commonly known as the wurtzite crystal structure. The stacking direction is designated as the crystal c-axis; it is perpendicular to the basal plane which is the crystal (0001) plane (denoted by the Miller index for the crystal plane). The use of Miller indices to describe various crystal directions and planes is well known to those skilled in the art. Any crystal direction perpendicular to the c-axis is designated as an a-direction. The SiC polytypes are polar in the c-axis directions; in one direction, the crystal face is terminated with silicon (Si) atoms (in this direction, the c-axis is denoted by <0001>, the Miller index for this crystal direction); in the other direction, the crystal face is terminated with carbon (C) atoms (in this direction, the c-axis is denoted by <000$\bar{1}$>). These two faces of the (0001) plane are known as the Si-face and C-face, respectively.

The 3C—SiC (i.e., cubic) polytype has four equivalent stacking directions, and thus there are four equivalent planes, the set of four {111} planes, that are basal planes. Herein, any of the set {111} planes shall be referred to as a (111) plane. Any (111) plane of the cubic structure is equivalent to the (0001) plane of the α polytypes. Herein, the term "cubic crystal" shall also refer to crystals with the zincblende structure and to crystals with the diamond cubic structure. As used herein, "basal plane" shall refer to either the (0001) plane for a α-SiC, or the (111) plane of 3C—SiC or the (111) plane of any crystal with the cubic structure. The term "vicinal (0001) wafer" shall be used herein for wafers whose polished surface (the growth surface) is misoriented less than 10° from the basal plane. The term "mesa" is meant to represent an isolated growth region. The angle of misorientation of a crystal surface from the (0001) plane shall be referred to herein as the tilt angle. The term "homoepitaxial" shall be referred to herein as epitaxial growth, whereby the film and the substrate (wafer) are of the same polytype and material, and the term "heteroepitaxial" shall be referred to herein as epitaxial growth whereby the film is of a different polytype or material than the substrate.

Current theories explaining epitaxial single-crystal growth are well known. Crystal growth can take place by several mechanisms. Two of these are: (1) growth can take place by the lateral growth of existing atomic-scale steps on the surface of a crystal substrate and (2) growth can take place by the formation of two-dimensional atomic-scale nuclei on the surface followed by lateral growth from the steps formed by the nuclei. The lateral growth from steps is sometimes referred to as "step-flow growth." In the first mechanism, growth proceeds by step-flow from existing steps without the formation of any two-dimensional nuclei (i.e., without 2D nucleation). In the nucleation mechanism, the nucleus must reach a critical size in order to be stable; in other words, a potential energy barrier must be overcome in order for a stable nucleus to be formed. Contamination or defects on the substrate surface can lower the required potential energy barrier at a nucleation site.

Among the structural defects that are observed in commercial 4H— and 6H—SiC wafers are the following: micropipes, dislocations, and low-angle grain boundaries. Dislocations that are observed include: screw dislocations, basal plane dislocations, and threading edge dislocations. As is known to those skilled in the art, the Burgers vector of a screw dislocation (herein also called an axial screw dislocation) is parallel to the line of the dislocation, and the Burgers vector of an edge dislocation is perpendicular to the line of the dislocation.

As described in the previously mentioned technical articles of M. Dudley et al. and U.S. Pat. No. 6,783,592B2, micropipes are a special case of an axial screw dislocation with a large Burgers vector (i.e. more than 2 to 3 times the c-axis repeat distance for a given polytype). They are tubular hollow-core dislocations approximately parallel to the crystal c-axis. This defect is sometimes referred to as a "killer defect" because it effectively shorts out junction devices at low voltage levels. Recently, the density of micropipes has been reduced significantly in commercial SiC wafers, suggesting that micropipes probably will not be a long-range problem. Typical present-day micropipe densities in commercial wafers are in the range 1 to 30 cm$^{-2}$. The recent reduction in density and the present-day micropipe densities are more fully described in the technical article of A. R. Powell, J. J. Sumakeris, R. T. Leonard, M. F. Brady, St. G. Muller, V. F. Tsvetkov, H. McD. Hobgood, A. A. Burk, M. J. Paisley, R. C. Glass, and C. H. Carter, Jr., "Status of 4H—SiC Substrate and Epitaxial Materials for Commercial Power Applications", pp. 3-14, *Silicon Carbide* 2004—*Materials, Processing and Devices*, Mat. Res. Soc. Symp. Proc. Vol. 815, Editors: M. Dudley, P. Gouma, T. Kimoto, P. G. Neudeck, S. E. Saddow, Materials Research Society, 2004.

Elementary screw dislocations are structurally similar to micropipes, but have a Burgers vector equal to one c-axis repeat distance for a polytype and have a solid (instead of hollow) core. The total density of all kinds of dislocations is about 10$^4$ cm$^{-2}$ in commercial SiC wafers. This includes: axial screw dislocations (10$^3$-10$^4$ cm$^2$), threading edge dislocations (10$^3$-10$^5$ cm$^2$), and basal plane dislocations (10$^1$-10$^5$ cm$^{-2}$). These different types of dislocations are more fully described in the technical articles of H. Lendenmann, F. Dahlquist, J. P. Bergman, H. Bleichner, and C. Hallen, "High-Power SiC Diodes: Characteristics, Reliability and Relation to Material Defects," *Mat. Sci. Forum*, Vols. 389-392, pp. 1259-1264, 2002 (presented at ICSCRM 2001), and S. Ha, P. Mieszkowski, M. Skowronski, and L. B. Rowland, "Dislocation Conversion in 4H Silicon Carbide Epitaxy," *Journal of Crystal Growth*, vol. 244, pp. 257-266, 2002.

During SiC crystal growth in the c-axis direction, each axial screw dislocation generates a growing spiral of atomic-scale steps on the growth surface. These steps become preferred deposition sites with the result that growth occurs by step-flow growth as the spiral of steps continually grow outward from the screw dislocation. The growth associated with screw dislocation is further described in the technical article of H. Matsunami, "Technological Breakthroughs in Growth Control of Silicon Carbide for High Power Electronic Devices," *Jpn. J of Appl. Phys.*, vol. 43, pp. 6835-6847, 2004. In fact, the screw dislocation replicates the crystal stacking information for growth of a specific SiC polytype in the c-axis direction. For basal-plane surfaces with multiple screw dislocations, the spiral steps from each screw dislocation must coalesce perfectly in order avoid the formation of additional defects. This is not the case for pure edge dislocations, and basal plane dislocations. These latter two dislocations cannot provide the stacking information for crystal growth and do not generate spiral growth steps. However, their presence can have a deleterious effect on electronic devices fabricated from the material which is further described in the technical article by R. Singh, "Reliability and Performance Limitations in SiC Power Devices," *Microelectronics and Reliability*, vol. 46, pp. 713-730, 2006.

The term "defect free" shall be referred to herein as a single crystal that is free of extended structural defects, such as dislocations that propagate over numerous atoms in at least one direction. The term "defect free" is not meant to describe isolated point defects that involve at most 1 or 2 atoms at an isolated 3D point in the crystal, such as atomic vacancy point defects, interstitial point defects, and impurity point defects.

To date, variations of the physical vapor transport (PVT) (also called the modified Lely process) have been the primary method that has been employed to mass-produce and commercialize electronic quality single-crystal SiC wafers compatible with standard semiconductor wafer fabrication equipment and methods. The modified Lely process is further described in the previously mentioned technical article of A. R. Powell et al, as well as the technical article of K. Semmelroth, N. Schulze, and G. Pensl, "Growth of SiC polytypes by the physical vapour transport technique," *Journal of physics: Condensed Matter*, vol. 16, pp. S11597, 2004. In this process, SiC powder is sublimed at approximately 2400° C. and condensed on the surface of a large-area seed crystal (and the subsequent growing boule) which is at a slightly lower surface temperature. Temperature gradients of the order of 25° C./cm are used as the driving force for deposition. This method for growing large reproducible α-SiC crystals relies on the presence of a high density of screw dislocations distributed over the growth surface of the large-area seed crystal to provide growth steps to grow the crystal along the c-axis in order to maintain a uniform polytypic structure. The mechanism of screw-dislocation assisted crystal growth is well known and documented in prior art. In addition to screw dislocations, the α-SiC crystals produced by the seeded sublimation method are also plagued with numerous edge-type dislocations as well as dislocations that lie along the basal plane of the crystal.

The term "Lely seed crystal" is meant to represent a platelet SiC crystal grown by the Lely process and is more fully described in U.S. Pat. No. 2,854,364 of Jan Anthony Lely. Lely seed crystals are typically less than 1 cm$^2$ in area and less than 2 mm in thickness; they also typically have much lower extended defect density than commercial SiC wafers, but the growth process so far has not been suitable for producing the large-diameter wafers needed for commercial device mass production.

A method known as high temperature chemical vapor deposition (HTCVD) may be used for growing large boules of SiC. Instead of a solid source of SiC, the method uses gaseous sources. This method is further described in U.S. Pat. No. 5,704,985 of O. Kordina et al and a technical article of B. Sundqvist, A. Ellison, A. Jonsson, A. Henry, C. Hallin, J. P. Bergman, B. Magnusson, and E. Janzen, "Growth of High Quality p-type 4H—SiC Substrates by HTCVD," Mat. Sci. Forum, Vols. 473-476, pp. 21-24, 2003 (presented at ECSCRM 2002). The method has an advantage over the PVT method in that composition of the delivered material does not change as a function of time through the growth process. But it still has the problem of using a large-area seed crystal with a high density of extended defects in order to enable commercially-viable growth rates. The result is single crystal boules with a high density of extended defects. Other processes using the approach of HTCVD have been suggested, but to our knowledge, they all have the problem of using large-area seed crystals with a high density of extended defects (i.e. screw dislocations) to enable growth in the c-axis direction.

A two-stage process is known whereby in a first stage of growth, a Lely seed crystal (6-10 mm in diameter), with low-defect density, is grown laterally (in a-directions) to form a larger diameter (25-50 mm) thin crystal by a sublimation process under near isothermal conditions. In a second stage of the two-stage process, sublimation growth in the c-axis direction produces a large boule. This two-stage process is further described in U.S. Pat. No. 5,746,827 of D. L. Barrett et al. However, in a technical article of N. Schulze, D. L. Barrett, and G. Pensl "Near-Equilibrium Growth of Micropipe-Free 6H—SiC Single Crystals by Physical Vapor Transport," *Applied Physics Letters*, vol. 72, pp. 1632-1634, 1998 it was reported that near-equilibrium conditions were required to produce micropipe-free crystal growth on low-defect Lely seed crystals. This required a low temperature gradient (less than 5° C./cm) as the driving force for the sublimation growth. This resulted in a maximum growth rate of about 0.3 mm/h for 6H—SiC which is much lower than can be achieved with the standard commercial PVT process for 6H—SiC. It appears that SiC boule growth based on sublimation growth on low-defect seed crystals as taught by U.S. Pat. No. 5,746,827 will require much longer-duration growth runs than current commercial processes. This would render this approach to be more expensive and commercially uncompetitive. A technical article of M. Tuominenm, R. Yakimova, A. Vehanen, and E. Janzen, "Defect Origin and Development in Sublimation Grown SiC Boules," Materials Science and Engineering B57, pp. 228-233, 1999 also reported poor SiC crystal growth results using Lely seed crystals. In using Lely seed crystals (with a low-density of screw dislocations), several dislocations become dominant resulting in multiple hillocks with valleys in between. Many defects were reported to form in the valleys between the hillocks as more fully described in the technical article of M. Tuominenm et al.

A SiC bulk growth process is known, whereby growth takes place on large-area seed crystals in a {03$\bar{3}$8} crystal direction. This process is more fully described in the technical article of K. Nakayama, Y. Miyanagi, H. Shiomi, S. Nishino, T. Kimoto, and H. Matsunami, "The Development of 4H—SiC {03$\bar{3}$8} Wafers," Mat. Sci. Forum, Vols. 389-393, pp. 123-126, 2002 (presented at ICSCRM 2001). This does yield boules that contain small regions with reduced density of extended defects. However, most of the resulting boule has a high density of stacking faults and other extended crystal defects.

A two-stage sublimation process is known for producing bulk SiC crystals with regions of reduced defect density. This process is further described in the technical article of E. N. Mokhov, M. G. Ramm, M. S. Ramm, A. D. Roenkov, Y. A. Vodakov, S. Y. Karpov, Y. A. Makarov, and H. Helava, "Growth of Faceted Free-Spreading SiC Bulk Crystals by Sublimation," Mat. Sci. Forum, Vols. 433-436, pp. 29-32, 2003, (presented at ECSCRM 2002), as well as in U.S. Pat. No. 6,428,621B1 of Y. A. Vodakov et al. In their process, growth conditions in a first stage produce crystal growth in directions both axial (normal to a planar seed crystal) and lateral relative to the seed crystal. This creates two zones of growth: a central axial core region (due to axial growth) approximately the diameter of the seed crystal with a defect density approximately the same as the seed crystal and a peripheral zone (due to the lateral growth) with a reduced defect density. The first stage of growth is followed by a second stage in which growth is predominately axial (i.e. lateral growth is suppressed). This second stage produces growth in the vertical axial direction with a constant lateral diameter (equal to the larger diameter resulting from the first stage growth). This second stage growth contains (1) a continuation of the core region with a defect density approximately the same as the seed crystal, and (2) a continuation of the reduced density in a peripheral region around the core region with reduced defect density. This process suffers from the same problem described in the previous sections where growth of SiC in the c-axis direction depends on the existence of multiple step sources (i.e. multiple axial screw dislocations). If the coalescence of growth steps from multiple step sources is not perfect (and indeed, this appears to be the case), then defects will be produced by the imperfect coalescence the growth steps in both the core and peripheral regions.

A recently published multi-stage (in different growth directions) process has produced single crystal boules of SiC with a much lower dislocation density and is discussed in the technical article of D. Nakamura, I. Gunjishims, S. Yamaguchi, T. Ito, A. Okamoto, H. Kondo, S. Onda, and K. Takatori, entitled "Ultrahigh-Quality Silicon Carbide Single Crystals," and published in *Nature*, vol. 430, pp. 1109-1012, 2004. In each stage of this process, growth starts with a large-area planar seed crystal. By cutting each successive boule in different crystallographic directions (e.g. at each successive stage, a new planar wafer-shaped seed crystal is cut approximately perpendicular to the seed crystal of the previous stage). The final growth stage returns to growth nearly parallel to the c-axis direction. This process results in significant reduction of dislocations in each successive stage except for the last stage that is grown approximately in the c-axis direction. However, in an oral presentation at the European Conference on Silicon Carbide and Related Materials (ECSCRM) Aug. 31-Sep. 4, 2004, at Bologna, Italy, D. Nakamura reported that the growth rate in the c-axis direction in the final growth stage of this new process must be reduced significantly in order to maintain the higher quality of the resulting final boule. This is consistent with the work reported in the previously mentioned technical article of N. Schulze et al and, thus, gives credence to D. Nakamura's oral report. One can conclude that the far fewer remaining screw dislocations must supply spiral steps for step flow growth over much larger areas of the top growth surface compared to conventional SiC boules that are grown with a much higher screw dislocation density. Hence, only a few screw dislocations will dominate the growth surface. Apparently, from the work discussed in the previously mentioned technical articles of N. Schulze et al and M. Tuominenm et al (both groups used low-defect Lely platelets as seed crystals), seed crystals with multiple dislocations (but much fewer than conventional seed crystals used with the modified-Lely process) produce crystals with micropipes and other unwanted defects if growth is carried out at growth rates comparable to the conventional commercial modified-Lely process. It appears that structural defects will continue to be a problem for growth processes that are dependent on the coalescence of steps from multiple step sources (either a high density or a low density of step sources) that are scattered over the surface of a large-area seed crystal. It may be concluded from prior art experience, that the use of large-area seed crystals with multiple step sources (regardless of the density of the step sources) will continue to cause problems (i.e., undesired dislocations) for any commercially-viable growth process for hexagonal or rhombohedral SiC polytypes.

A method for the growth of 3C—SiC crystals is described in the technical article of S. N. Gorin and L. M. Ivanova, "Cubic Silicon Carbide (3C—SiC): Structure and Properties of Single Crystals Grown by Thermal Decomposition of Methyl Trichlorosilane in Hydrogen," Phys. Stat. Sol. (b), Vol. 202, pp. 221-245, 1997. These individuals grew crystals of 3C—SiC on a heated rod of graphite using chemical vapor deposition. This produced multiple seed crystals each with numerous twin planes (e.g. planar dislocations). As the seed crystals grew, the twin planes propagated throughout the growing crystals and this resulted in crystals with poor morphology and numerous planar dislocations.

A growth of 3C—SiC films on Si is described in the technical article of H. Nagasawa, K. Yagi, T. Kawahara, and N. Hatta, "Reducing Planar Defects in 3C—SiC," *Chemical Vapor Deposition*, vol. 12, pp. 502-508, 2006. These individuals grew 3C—SiC films on "undulant" grooved single-crystal (001) Si substrates using chemical vapor deposition. A high density of planar defects was generated at the film/substrate boundary, and the density decreased as the thickness of the films increased. However, the defect density did not decrease to zero, as defects along certain directions could not be eliminated with this process.

In known processes, thin films of low-defect 3C—SiC can be grown heteroepitaxially on small step-free mesas of α-SiC substrates. These processes are further described in U.S. Pat. Nos. 5,915,194; 6,165,874 and 6,488,771B1. However, these processes are not directly suitable for the growth of large bulk crystals because of low growth rates and extended growth that eventually leads to detrimental coalescence with the surrounding hexagonal substrate material.

No commercially-viable method for mass-producing large, reproducible single-crystals of SiC without detrimental quantities of dislocations exists to our knowledge in the prior art. This same predicament (i.e., no method of producing large single-crystals without detrimental quantities of dislocations) also plagues diamond, III-Nitride compounds and alloys, and other crystal materials with a broad variety of useful applications. A serious shortcoming in prior-art processes for the growth of bulk crystals of WPG materials is the use of large-area seed crystals with multiple extended dislocations propagating parallel to the growth direction.

Other non-commercial processes for growing SiC crystals have been reported. A SiC growth process that relates somewhat to the present invention is that described in U.S. Pat. No. 3,721,732. In this process, the objective was to grow multiple whiskers with circular cross section for use as a reinforcing material when mixed with other materials such as glass, plastic, and metals. In this process, a crystal growth process, known as the vapor-liquid-solid (VLS) process and is more fully described in U.S. Pat. No. 3,346,414, is used. In the VLS process, a liquid droplet on a substrate acts as a solvent for material introduced into the vapor contacting the droplet. For the example given in U.S. Pat. No. 3,721,732, the substrate was graphite or a SiC crystal, the droplet material was 20-μm-diameter particles of iron (Fe), or Fe plus Si, and the vapor contained Si and C. At a temperature of about 1200° C., 10-μm-diameter whiskers grew at a rate of 1 mm/h. Whiskers up to 30 mm in length were reported. According to this reference, whiskers, including those grown from droplets on the (0001) SiC Lely crystal surfaces, were mostly of the cubic SiC polytype. Whiskers of a given hexagonal polytype were achieved when the droplet was placed on prismatic ($1\bar{1}00$) or pyramidal ($11\bar{2}0$) surfaces of a SiC Lely crystal. Both prismatic and pyramidal surfaces are perpendicular (or inclined) to the SiC basal plane (i.e. the (0001) plane). So, for the experiments described in U.S. Pat. No. 3,721,732, the replication of the proper polytype stacking sequence was provided by the stacking sequence template existing on the prismatic and pyramidal planes. This is consistent with growth results wherein commercial SiC wafers are polished "off-axis" in order to provide the polytypic stacking template to the epilayer growth surface as described in the previously mentioned technical article of H. Matsunami. This is also consistent with the nucleation of 3C—SiC on the step-free basal plane surface of 4H— and 6H—SiC substrates and is more fully discussed in the previously mentioned technical article of Neudeck and Powell.

A subsequent U.S. Pat. No. 4,013,503 by Knippenberg and Verspui states that whisker growth is more pronounced on the prismatic and pyramidal SiC surfaces than on the (0001) basal plane. It is now known that, in the absence of defects, growth can only occur on the basal plane by nucleation of cubic SiC as more fully discussed in the previously mentioned technical article of Neudeck and Powell. Hence, the whisker growth methods described by the two patents by Knippenberg and Verspui do not provide or suggest a method for growing large nearly-defect free single crystal boules of non-cubic SiC polytypes and other materials. The teachings of U.S. Pat. Nos. 3,721,732 and 4,013,503 of W. F. Knippenberg et al also do not provide a method for growing a large-diameter single-crystal boule needed for semiconductor mass production.

The growth of high-quality single-crystal whiskers of 2H—SiC that are without dislocations are described in the technical articles of J. A. Powell, "Crystal Growth of 2H Silicon Carbide", J. Appl. Phys., vol. 40, pp. 4660-4662, 1969, and W. M. Vetter, W. Huang, P. Neudeck, J. A. Powell, and M. Dudley, "Synchrotron White-Beam Topographic Studies of 2H—SiC crystals," *Journal of Crystal Growth, vol.* 224, pp. 269-273, 2001. However, the growth process described is not suitable for the growth of large crystals.

A process for making GaN seed crystals is more fully described in the technical article of Philip R. Tavernier and David R. Clarke, "Progress Toward Making Gallium Nitride Seed Crystals Using Hydride Vapor-Phase Epitaxy," J. Am. Ceram. Soc., vol. 85, no. 1, pp. 49-54, 2002. These individuals describe a technique for producing seed crystals of GaN for subsequent growth into bulk crystals of GaN. In their approach, a GaN film is grown heteroepitaxially on a sapphire substrate by vapor-phase process; then the GaN film is removed from the substrate. The separated GaN film is used as a seed crystal for further GaN growth. The process as reported produces seed crystal with a high density of defects, such as threading dislocations. These defects are incorporated into any bulk crystal grown from the seed crystal.

A process for growing bulk single crystal boules of silicon (Si) by chemical vapor deposition (CVD) for use in the fabrication of solar cell arrays is more fully described in the technical article of A. Franzosi, L. Giarda, and L. Pelosini, "Process of Deposition of Single Crystal Silicon Directly from the Vapour Phase", PB82-187444, Commission of the European Communities, Energy, EUR-7093-EN, 1981. An important goal in this work was to produce large boules with a hexagonal cross section. The hexagonal shape would allow the fabrication of large arrays of solar cells with improved packing factors, compared to cells with a circular shape. The process consisted of two steps:

(1) Long (40 cm), single-crystal seed crystals, 4.5 mm in diameter, were grown in a <111> direction using a float-zone growth procedure. This float-zone process utilized a growth-from-the-melt process using liquefied silicon.

(2) Two of the long seed crystals were mounted in a large bell jar with electrical contacts on each end. In this manner the seed crystals could be heated to a suitable temperature by passing an electrical current through the seed crystals. The atmosphere in the bell jar was controlled in a manner that produced lateral growth of single crystal Si on the seed crystals. It was found that by suitable choice of gaseous precursors, seed crystal temperature, and other factors, single crystal Si boules, 2 cm in diameter and with a hexagonal cross section, could be grown. This work was reported 25 years ago and, since then, different improved crystal growth processes for Si have superceded this process.

Although some aspects of the process described in the previously mentioned technical article of Franzosi et al. are somewhat related to the current invention, it does not address important problems encountered in the growth of WBG semiconductors. One important problem is that the process of Franzosi et al. does not provide a viable process for producing a long seed crystal for the WBG semiconductor materials since the float-zone crystal growth process (using a melt of the material being grown) is not applicable to the WBG materials. The reason is that most of the WBG materials cannot be melted at any reasonable pressure. Also, their process does not address the problem of maintaining the proper crystal stacking order along the c-axis crystal direction for the hexagonal polytypes of the materials: SiC, AlN, and GaN. Finally, the fairly large diameter (4.5 mm) of their seed crystal (step no. 1) does not provide for a low-defect seed crystal for step no. 2 if applied to WBG materials.

An impurity doping method, known as site competition, is widely used to control the doping of SiC during growth of epitaxial films in the manufacture of semiconductor devices and is more fully described in U.S. Pat. No. 5,463,978. This principle requires the control of the C/Si ratio at the growth site. This principle is difficult to apply during prior-art commercial growth of bulk SiC crystals because of variations in temperature and precursor supply at various locations on the growth front during growth processes.

All commercial SiC wafers, serving as substrates, to date, contain dislocations distributed randomly across the substrate in average densities that are of the order of thousands per square centimeter of wafer area. All of these dislocations present in the wafer propagate in one form or another into the epitaxial layers making up the high field devices. These dislocation defects are difficult to observe (especially in a production environment), and it is nearly impossible to readily predict their locations on any given wafer so that the device being fabricated cannot practically be patterned and/or placed to avoid the vast majority of these defects. This greatly harms the yield, performance, cost, and commercialization of highly beneficial SiC high-field power switching devices. It is highly desirable to reduce or even eliminate the detrimental performance effects of dislocations in SiC crystals and devices.

The present-day commercial c-axis growth methods for growing large reproducible crystals of the non-cubic polytypes of SiC rely on the presence of axial screw dislocations to provide the proper crystal stacking sequence while providing steps for growth of the crystal along the crystal c-axis. If no continuous source of steps is provided (i.e. from an axial screw dislocation), the existing steps on the growth surface (i.e. the basal plane) grow themselves out of existence and growth stops in the c-axis direction, or the 3C (cubic) polytype of SiC nucleates on the surface. The role of growth steps is more fully discussed in the previously mentioned technical article of Neudeck and Powell. The mechanism of axial-screw-dislocation-assisted crystal growth is well known and documented in prior art. No c-axis growth method for mass producing large, reproducible single-crystals of SiC without axial screw dislocations exists in the prior art. This same predicament (i.e., no method of producing large single-crystals without axial screw dislocations) also plagues the III-Nitrides (e.g. GaN and AlN), and other crystal materials with a broad variety of useful applications.

In conventional SiC bulk crystal growth, the diameter of SiC seed crystals used for growth-from-vapor processes is generally planar and of the same order of, or slightly smaller, than the final diameter of the single crystal boule. Thus, the primary growth (i.e. crystal enlargement) direction generally has been approximately in the c-axis direction, which is the stacking direction of Si—C double layers for the non-cubic polytypes. In order to achieve reasonably high growth rates (the order of 0.5 mm/hour or greater) and to promote proper hexagonal stacking sequence throughout the crystal, a fairly high density of screw dislocations (greater than $10^3$ cm$^{-2}$) has been required. As the screw dislocation density in the seed crystal is reduced, it has been found that crystal growth rate must also be reduced in order to maintain the lower defect density in the growing crystal in a manner more fully described in the previously mentioned technical article of N. Schulze, D. L. Barrett and G. Pensl. Thus, the production rate of crystals with significantly lower screw dislocation density is decreased, and the cost per wafer will be disadvantageously increased using conventional prior art growth techniques.

OBJECTS OF THE INVENTION

It is a primary object of the present invention to provide a method of growing nearly-defect-free large bulk single crystals of wide bandgap (WBG) tetrahedrally-bonded semiconductor materials.

It is another object of the present invention to provide a crystal-growth method that utilizes a single screw dislocation for providing step-flow c-axis growth for the growth of large nearly-defect-free large bulk single crystals of SiC polytypes.

It is still another object of the present invention to provide a crystal-growth method that utilizes a single screw dislocation for providing step-flow c-axis growth in the growth of large nearly defect-free large bulk single crystals of WBG semiconductor materials with a hexagonal or rhombohedral crystal structure. The method is particularly suited for the growth of 4H—SiC, 6H—SiC, 15R—SiC, 2H—GaN, and 2H—AlN and hexagonal III-Nitride alloys.

It is still another object of the present invention to provide a method of growing defect-free (or nearly-defect-free) large bulk single crystals of WBG semiconductor materials with a wurtzite crystal structure. The method is particularly suited for the growth of 2H—SiC, 2H—GaN, and 2H—AlN and III-Nitride alloys with the wurtzite structure.

It is still a further object of the present invention to provide a method of growing defect-free (or nearly-defect-free) large bulk single crystals of WBG semiconductor materials with a cubic crystal structure. The method is particularly suited for the growth of 3C—SiC, cubic-GaN, cubic-AlN, and diamond.

It is still a further object of the present invention to provide a high-growth-rate crystal growth method for the growth of WBG semiconductor crystal materials.

It is still another object of the present invention to provide a high-growth-rate crystal growth method for the growth of large WBG semiconductor crystals at an axial growth rate that is independent of the diameter of the grown crystal.

It is another object of the present invention to provide crystals with low dislocation densities for the subsequent fabrication of improved semiconductor electronic devices.

It is another object of the present invention to provide large α-SiC single crystals with low dislocation densities for the subsequent fabrication large-area atomically-flat mesas for producing large-area low-defect heteroepitaxial films of 3C—SiC and III-Nitride compounds and alloys.

It is another object of the present invention to provide large α-SiC single crystals with low dislocation densities for the subsequent fabrication large-area atomically-flat mesas for producing large-area low-defect heteroepitaxial films of 3C—SiC and III-Nitride compounds and alloys for subsequent fabrication of improved electronic and optical devices.

It is another object of the present invention to provide a method for controlled growth of crystals with low-index facets.

It is another object of the present invention to provide a crystal growth method for tetrahedrally-bonded crystal materials whereby nearly all growth occurs perpendicular to one of the tetrahedral bonds.

It is another object of the present invention to provide a crystal growth method for tetrahedrally-bonded crystal materials whereby nearly all of the growth takes place in isothermal conditions so as to enable more uniform and better control of doping of the resulting crystal boule.

It is another object of the present invention to provide a crystal growth method for tetrahedrally-bonded crystal materials whereby nearly all of the growth takes place in isothermal conditions so as to enable the application of the site competition method to achieve a wide range of doping levels in the resulting crystal boule.

It is another object of the present invention to provide a crystal growth method for tetrahedrally-bonded crystal materials whereby nearly all of the growth takes place in isothermal conditions so as to enable easier scale-up to larger crystal diameters with low-defect density.

It is another object of the present invention to provide a crystal growth method whereby each growth run produces a seed crystal for a subsequent growth run.

It is another object of the present invention to provide a crystal growth method that reduces waste in cutting wafers off-axis with respect to the basal plane of crystals with a hexagonal crystal structure.

It is still another object of the present invention to provide a method of growing defect-free (or nearly defect-free) bulk single crystals of SiC polytypes for use in producing colorless and colored gemstones.

It is still another object of the present invention to provide a growth method combined with the site competition method to produce defect-free (or nearly defect-free) bulk single crystals of SiC polytypes for use in producing colorless and colored gemstones.

SUMMARY OF THE INVENTION

The present invention provides a method, a growth system (herein also called a growth reactor), and the resulting product thereof having inherent beneficial characteristics, for the growth of large, low-defect tetrahedrally bonded crystals.

The method for one embodiment of the invention comprises the steps of (a) providing a large tapered crystal (LTC) seed having a defined central axis parallel to a preferred crystal direction, a base having a center and opposite upper and lower portions and with its upper portion attached to a holder, a tapered portion having a center and that extends along the central axis from the lower portion of the base, a columnar portion having a center and that extends from the lowermost portion of the tapered portion along the central axis crystal of the LTC seed, with the diameter of the columnar portion smaller than the diameter of the base, and a lowermost end of the columnar portion defined to be the tip portion of the LTC seed, and with the central axis defined to pass through the centers of the base, the tapered portion, the columnar portion and the tip portion of the LTC seed; (b) providing a growth reactor with first, second and third chambers, arranged vertically, respectively defining region 1, region 2 and region 3, with the first chamber at the bottom, second chamber in the middle and third chamber at the top, with the chambers being arranged to provide at least a first passageway between first and second chambers and a second passageway between second and third passageways, with the passageways also being arranged substantially along a vertical axis that coincides with the central axis of the LTC seed; (c) providing the holder located inside the third chamber for holding the base of the LTC seed so that the tapered portion of the LTC seed lies between both the first and second passageways and extends completely through the region 2 and with the columnar portion of the LTC seed crystal extending into the region 1; (d) providing means within the first chamber for growth of the tip portion of the LTC seed in a preferred crystal direction along the central axis of the LTC seed; (e) providing means within the second chamber for growth of the tapered portion of the LTC seed in a lateral direction substantially perpendicular to the preferred crystal direction; and (f) providing means for moving, during the growth process, the base of the LTC seed, upward along the central axis into said region 3 which is a region of low or no-growth. The method produces a large low-defect crystal boule adjacent to the lower portion of the base; when the crystal boule (in region 3) has reached a desired length, the growth process can be interrupted and the crystal boule can be cut from the completed large low-defect crystal. The remainder of the completed crystal can be used as a new large tapered LTC seed in a subsequent growth cycle.

In order to carry out the growth cycle described in the previous paragraph, a large tapered crystal (LTC) seed must be provided. The following embodiment of the LTC process utilizing a hereinbefore described 3-chamber apparatus produces an initial LTC seed from a very small crystal seed, called a starter seed, whose dimensions are the order of a millimeter, or less, in all directions. As described in the previous paragraph, crystal growth takes place in two growth regions: (1) in an axial direction in region 1, and (2) in a lateral direction (with respect to the central axis) in region 2. The LTC seed is grown from the starter seed using a growth reactor as described in the previous paragraph with the addition of a long support rod (with a central axis parallel to the long dimension) whose upper end is attached to the holder in region 3 and whose lower end extends through region 2 and into region 1. The starter seed has dimensions in the order of one mm, or less, in all crystal directions. The starter seed is mounted on the lower end of the support rod with a preferred crystal direction parallel to the central axis. In embodiments applied to hexagonal and rhombohedral crystal materials, the preferred crystal direction is the crystal c-axis direction; in embodiments applied to cubic crystal materials, the preferred crystal direction is one of the crystal <111> directions. The support rod with the starter seed on the lowermost end is installed in a growth reactor with attributes described hereinbefore such that uppermost end of the support rod is attached to the holder in region 3 and the lowermost end with the starter seed is in region 1.

Growth of the initial LTC seed proceeds as follows. In region 1 (also called herein the first growth region), growth conditions are set so that fast epitaxial growth takes place in an axial direction on the starter seed in a manner that maintains the seed diameter (measured perpendicular to the preferred axial growth direction) relatively small and nearly constant (i.e. a columnar crystal is produced in the first growth region). As growth takes place, the support rod is moved upward toward region 3 by the holder in region 3 at a rate that is equal to the axial growth downward of the starter seed in the first growth region. This maintains the position of the growing lowermost tip portion at the same position within region 1. In region 2 (also called herein the second growth region), epitaxial growth takes place in a lateral direction at a moderate growth rate (compared to the first growth region) on the side wall of the columnar crystal as the columnar crystal is moved into and through the second growth region. Some polycrystalline growth also occurs on the support rod in region 2 (The support rod with the polycrystalline growth can be discarded later). Growth on the columnar crystal in the second region is approximately perpendicular (greater than 45°) to the preferred axial growth direction in the first growth region. The growth rates in the first and second growth regions are adjusted so that, as the crystal grows in both regions and continues to be moved through the second growth region, a large tapered crystal (LTC) is produced in the second growth region. In one preferred embodiment, the growth in the first growth region takes place by a step-flow growth mechanism using steps generated by at least one axial screw dislocation that (1) is located near the center of the starter seed and (2) is approximately parallel to the preferred crystal direction (and growth direction along the central axis) of the starter seed. In all embodiments, most of the grown crystal volume is carried out by deposition at a moderate growth rate on the side wall of the LTC in the second region. In one embodiment, the growth rates and size of the second growth region are adjusted so that when the large end of the tapered crystal reaches a desired diameter, the tapered crystal moves from the second growth region into region 3 (herein also called the third region). At this point in the growth, a large tapered crystal (LTC) seed has been produced. Herein this seed is called the LTC seed. This LTC seed can be used in a continuation of the current growth cycle, or the growth cycle can be interrupted and the LTC seed cut from the support rod and the polycrystalline growth that occurred on the support rod. The LTC seed can now be used in a subsequent growth cycle as described hereinbefore.

If growth described in the previous paragraph had been continued, a completed boule of constant diameter would have been produced at the large end of the LTC seed in the third region as the large end of the LTC seed continued to move from the second region into the third region of low or no growth.

Periodically, (1) the LTC growth process may be interrupted, (2) the entire completed boule/LTC seed combination is allowed to cool uniformly to near room temperature, (3) the whole crystal combination is removed from the growth reactor, (4) the completed boule is cut from the large end (from the third region) of the combination crystal, and is then used as a source of single-crystal wafers. The remaining LTC seed (from the second and first growth regions) can then be used as an LTC seed in a subsequent growth cycle. That is, no small starter seed crystal is required for subsequent growth cycles. In the subsequent growth cycle, the reactor can begin producing a completed boule as soon as growth conditions are reached. The growth rate of the new completed boule will take place at the fast axial growth rate of the tip portion of the LTC seed in the preferred growth direction in the first growth region. Repeating this cycle produces additional completed boules.

This process is particularly suitable for wide-bandgap semiconductors, such as SiC, III-Nitride compounds and their alloys, and diamond. In another embodiment of the current invention applied to the growth of bulk crystals with a wurtzite, zincblende, or diamond cubic structure, epitaxial axial growth can take place in the first growth region without the presence of any screw dislocations for the growth of the small seed crystal. Also, in other preferred embodiments (irrespective of the crystal structure and material), epitaxial axial growth of the tip portion of the LTC seed can take place in the first growth region by either (1) a vapor-solid (VS) process, (2) a vapor-liquid-solid (VLS) process, or (3) a combination of the traveling solvent method (TSM) and the laser heated pedestal growth (LHPG) method. In other embodiments, crystal heating methods for growth at the tip portion in region 1 include focused optical (e.g. laser) heating and shaped radiant heaters. Also, preferred temperature gradients and preferred flow patterns in the first growth region can be used to promote approximate columnar (with axis parallel to the growth direction) growth morphology in the first growth region. Additional preferred embodiments include various processes for the second growth region. These include hot-wall Chemical Vapor Deposition (CVD) using an inductively heater susceptor, or warm-wall CVD using direct inductive heating of the LTC seed. Various purge gas flows can be used to reduce unwanted deposition on surfaces other than intended crystal surfaces. Other embodiments of the invention include (1) continuous growth with removal of the completed boule accomplished in situ during the growth process, (2) with the process interrupted, removal of the completed boule in situ after interrupting the growth and cooling to some suitable temperature, (3) significant physical separation between the first and second growth regions, and (4) axial growth of the columnar portion of the LTC seed with an extended length in a first growth reactor, and lateral growth on the columnar portion of the LTC seed with an extended length at some later time in a suitable second growth reactor. In all of the embodiments described, the presence of the third region (of no growth) is optional. Mass production of large low-defect single crystals of WBG semiconductors at lower cost, that this invention enables, will in turn enable greatly enhanced performance and reliability for applications involving high power, high voltage, high frequency, and/or high temperature operating conditions.

BRIEF DESCRIPTION OF THE DRAWINGS

FIG. 6 is composed FIGS. 6(A), 6(B), 6(C), and 6(D) and serves as a schematic drawing of the essential elements of a suitable growth reactor with a large tapered crystal (LTC).

FIG. 7 is composed of FIGS. 7(A), 7(B), and 7(C) and serves as an overall schematic drawing of 7(A) the LTC seed 58 before growth and the completed crystal 72 after growth, 7(B) the new LTC seed 72B, and 7(C) the completed boule 72A after cutting off the completed boule.

FIG. 9 is composed of FIGS. 9(A), 9(B), and 9(C), wherein FIG. 9(A) is a partial schematic cross-section showing part of a growth reactor for carrying out the growth and FIGS. 9(B) and 9(C), respectively, illustrate two preferred embodiments (Option VS1 and Option VLS) for the growth of the tip portion of the LTC seed in region 1 of the growth process.

FIG. 12 is composed of FIGS. 12(A), 12(B) and 12(C) and illustrates schematically the use of the growth reactor of FIG. 6 to grow an LTC seed from a starter seed. FIG. 12(A) illustrates the reactor before the start of growth, FIG. 12(B) illustrates the mounting of the starter seed on a support rod, and FIG. 12(C) illustrates the resultant new LTC seed in the reactor at the end of a starter growth cycle.

DETAILED DESCRIPTION OF THE PREFERRED EMBODIMENTS

Figure 1:
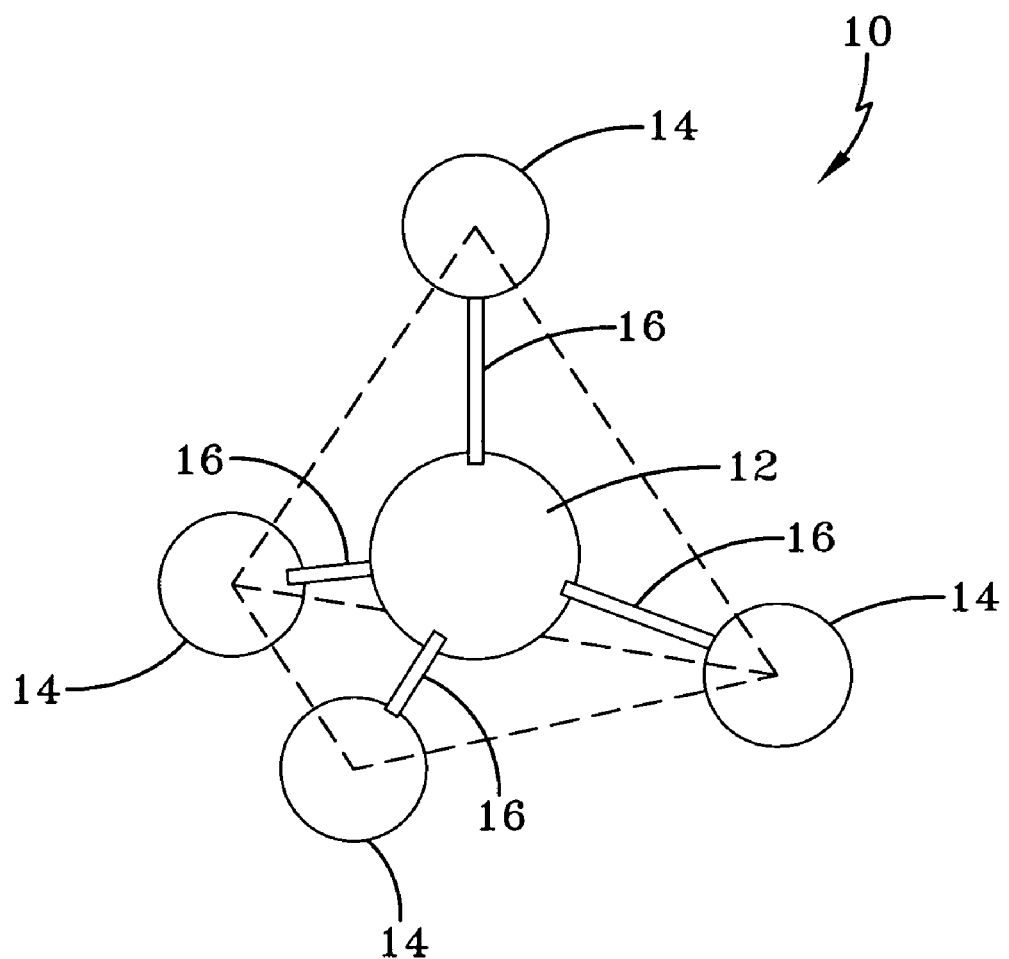
FIG. 1 is a schematic drawing illustrating tetrahedral bonding in a SiC crystal.

In general, the present invention provides methods, growth reactors, and the beneficial products resulting therefrom for the crystal growth of large, low-defect tetrahedrally-bonded single crystals. The inventive process utilizes a large tapered crystal seed, herein referred to as an LTC seed, that has a defined central axis parallel to a preferred crystal direction, a base having a center and opposite upper and lower portions and with the base's upper portion attached to a holder, a tapered portion that extends downward along the central axis from the lowermost portion of the base, a columnar portion having a center and that extends downward from the lowermost portion of the tapered portion along the central axis of the LTC seed, with a defined diameter of the columnar portion smaller than a defined diameter of the base, and with lowermost end of the columnar portion defined to be the tip portion of the LTC seed, and with the central axis of the LTC seed defined to pass through the centers of the base, the tapered portion, the columnar portion and the tip portion of the LTC seed. In a first growth region, growth takes place substantially along the central axis in a preferred crystal direction downward on the tip portion of the LTC seed, and in a second growth region, growth takes place on the relatively large tapered portion of the LTC seed in a primarily lateral direction substantially perpendicular to the central axis of the LTC seed. In one process implementation, dislocation-assisted crystal growth is carried out at a fast growth rate in the first growth region on the tip portion of the LTC seed in a downward direction parallel to the central axis of the LTC seed, while the growth in the second growth region is carried out at a moderate growth rate on the side wall of the tapered portion in a substantially lateral direction (i.e., perpendicular) relative to the LTC seed's central axis. The LTC seed is supported at the uppermost portion of the base of the LTC seed in region 3, which is a region of no-growth. Each growth cycle creates (1) a large, low-defect, completed crystal boule, comprising the initial base and selected crystal material adjacent to the lowermost portion of the initial base of the LTC seed, and (2) a new LTC seed (the remaining crystal material below the completed crystal boule) that can be used in a subsequent growth cycle. Periodically, the process may be interrupted and the completed boule is cut off and used as a source of single-crystal wafers. A subsequent growth cycle can then be carried out with the newly created LTC seed. Repeating this cycle produces additional boules. This process is particularly suitable for wide bandgap semiconductors, such as SiC, GaN, AlN, and diamond.

Further, in general, the present invention produces defect-free (or nearly defect-free) single crystals of relatively large size. The crystals that are produced by the present invention may be directly employed in a fabrication of single-crystal devices or gemstones, or they can be used as seed crystals for subsequent growth of larger defect-free (or nearly defect-free) single crystals that can be employed to fabricate single-crystal devices or gemstones.

As described herein, the process of the present invention and all of its embodiments are termed Large Tapered Crystal (LTC) process or method. With reference to the drawings, wherein the same reference number indicates the same element throughout, there is shown in FIG. 1 through FIG. 18, various definitions, various steps and various intermediate results thereof associated with various embodiments of the present invention.

Figure 2B:
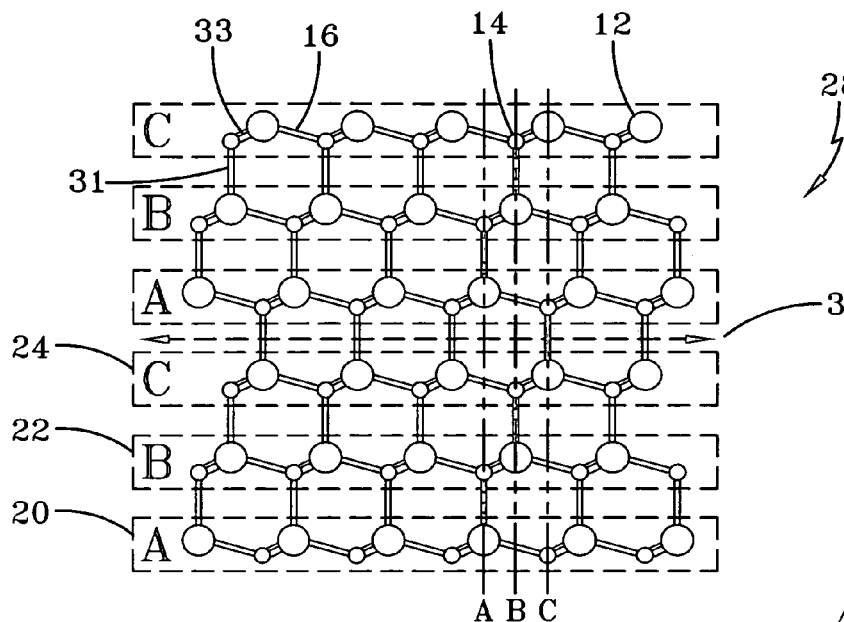
FIG. 2 is composed of FIGS. 2(A), 2(B) and 2(C) and overall act as a schematic representation of the stacking of crystal bilayers in two SiC polytypes, wherein the shown reference letters A, B, and C, represent the three possible relative positions for the silicon atoms in the bilayers.
Figure 2C:
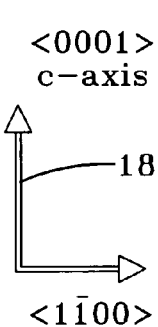
Figure 2A:
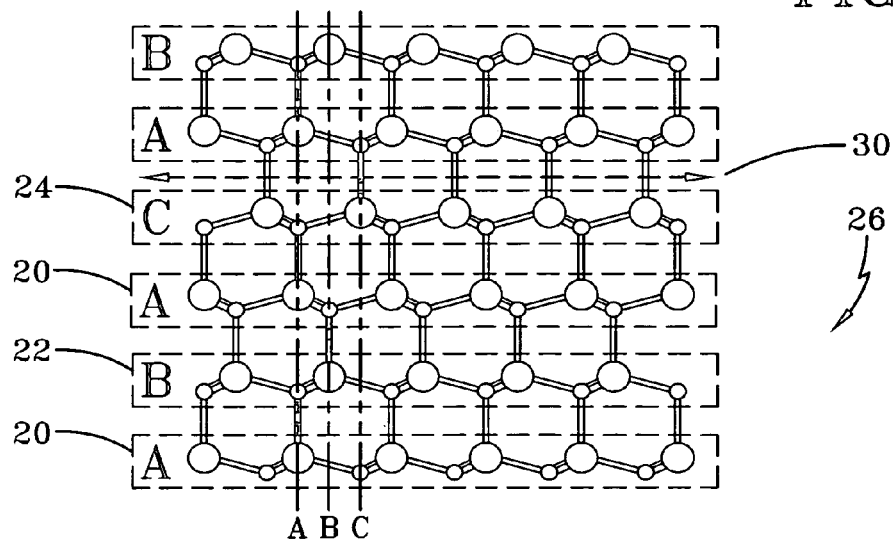
Figure 3:
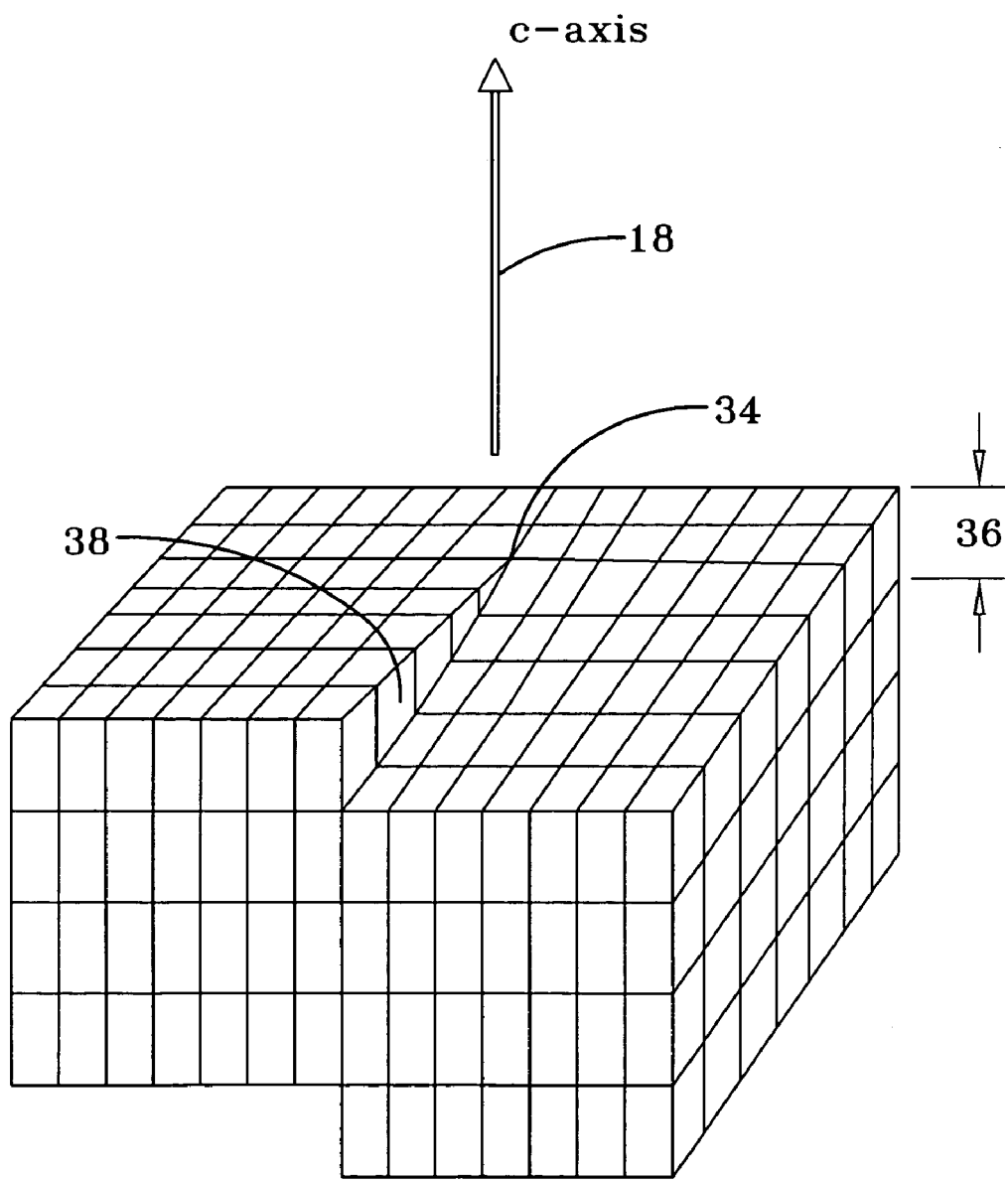
FIG. 3 is a schematic representation of an axial screw dislocation.

Reference is first made to FIGS. 1-3, in order to better understand the invention. More particularly, FIGS. 1-3 illustrate some terms and crystal configurations that are used in the following descriptions of detailed embodiments of the invention to be further described with reference to FIGS. 4-18.

FIG. 1 schematically illustrates tetrahedral bonding 10 in a compound crystal structure, where an atom 12 of one type is bonded to four atoms of the opposite type 14 by four bonds 16. For the case of a SiC crystal, atom 12 is a silicon (Si) atom and 14 is a carbon (C) atom. This basic tetrahedral bonding structure also applies to other compound semiconductors. For example, FIG. 1 would apply to a GaN crystal by denoting 12 as a gallium (Ga) atom and 14 as a nitrogen (N) atom. For the case of diamond, all atoms are carbon atoms.

FIG. 2 is composed of FIGS. 2(A), 2(B) and 2(C) and schematically illustrates the stacking in the c-axis direction 18, shown most clearly in FIG. 2(C), of the SiC double layers in relative positions A 20, B 22, and C 24 to form the polytypes 4H—SiC 26 of FIG. 2(A) and 3C—SiC 28, shown in FIG. 2(B). The crystal plane (i.e. the phantom arrow 30 in FIG. 2(A) and the phantom arrow 32 in FIG. 2(B)) is perpendicular to the c-axis 18 and passes through vertical bonds 31 and is known as the basal plane.

FIG. 3 schematically illustrates an axial screw dislocation 34 in the c-axis direction 18. The vertical dimension 36 in the schematic drawing represents the repeat height of a SiC polytype (e.g. ABAC for 4H—SiC as shown in FIG. 2). By taking a circular path around the screw dislocation 34 on the top surface it can be seen that the top surface is displaced by an amount 36. This creates a growth step 38 on the top surface. The screw dislocation 34 and the growth step associated with the screw dislocation 34 play an important role in crystal growth. More particularly, as atoms are added to the surface during crystal growth, the growth step becomes a preferred site of deposition. As deposition continues the growth step winds around the screw dislocation 34 and the surface grows in the direction of the c-axis. The vertical displacement of the growth step remains constant throughout such growth so that, at a distance from the screw dislocation 34, the crystal lattice is defect-free. Further details of screw dislocations are given in the previously mentioned three technical articles of M. Dudley et al; J. A. Powell, P. Pirouz and W. J. Choyke; and P. G. Neudeck and J. A. Powell; and U.S. Pat. No. 6,783,592.

Figure 4:
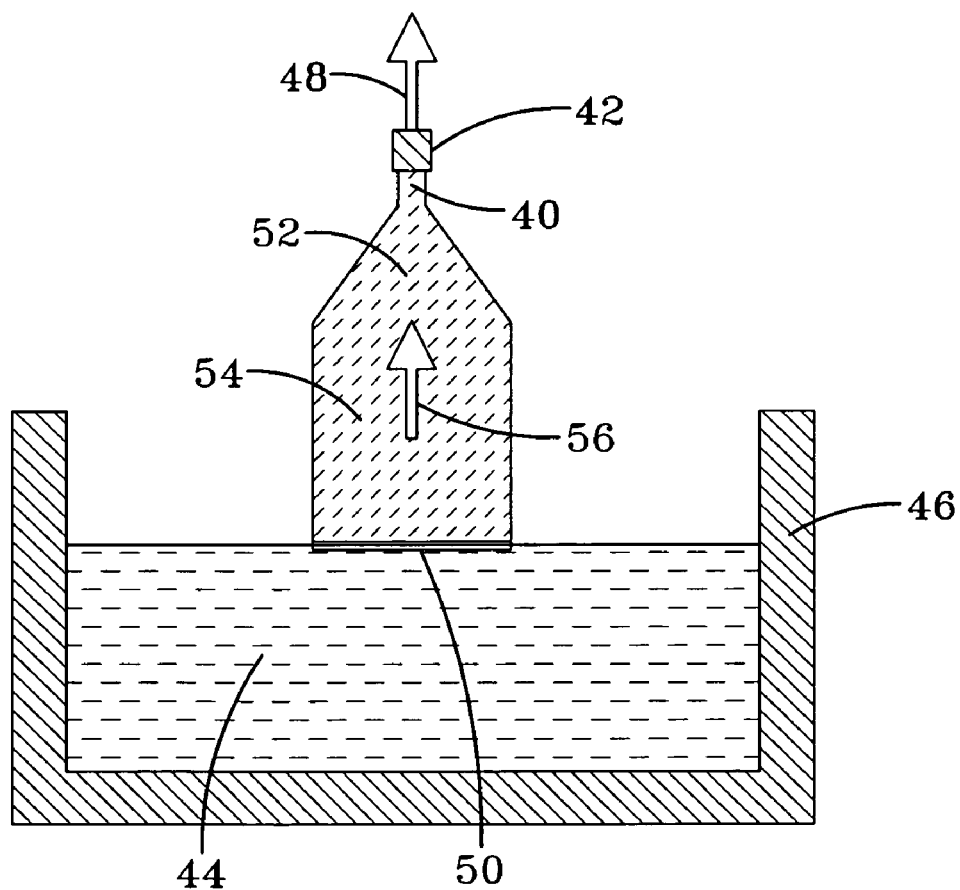
FIG. 4 is a schematic drawing that represents the overall process for a prior-art crystal growth process of Czochralski.

To better appreciate the benefits of the present invention, reference is first made to FIG. 4 to describe some aspects of a commonly-practiced prior-art crystal growth process commonly referred to as the Czochralski process and further described in the technical article of H. J. Scheel, "Historical Aspects of Crystal Growth Technology," J. Crystal Growth, Vol., 211, pp. 1-12, 2000. More particularly, reference is briefly made to FIG. 4 herein, so that a proper distinction can be made between the present invention (i.e. the LTC process) and prior art of Czochralski. FIG. 4 illustrates important features of the Czochralski process. This process starts by selecting a small-diameter, high-quality seed crystal 40 of the desired crystal material (e.g. Si). The seed crystal 40 (attached to a holder 42) is dipped into a melt 44 (contained in a crucible 46) of the material (same as the seed material), and then slowly pulled upward in a direction 48 from the melt. If conditions are set properly, the seed crystal 40 begins to "grow" in size at the liquid-to-solid interface 50 in a manner that the added crystal material will be of the same high quality as the initial seed crystal. As the crystal grows, conditions (including the upward pull rate indicated by directional arrow 48) are set so that the diameter increases to some desired size, then conditions are adjusted so that vertical growth continues for a specified time with the diameter remaining constant. This creates a high-quality large single-crystal boule of given length and diameter. As shown in FIG. 4, at the end of a growth run, the entire crystal consists of the small-diameter seed crystal 40, a tapered section 52, and the desired boule 54.

Generally, for semiconductor device applications, the boule 54 of FIG. 4 is sawed into thin wafers, which are then polished and cleaned, making them suitable for semiconductor device fabrication processes. Note that the crystal being grown is supported at the small end (i.e., at the seed 40 end) and that crystal growth takes place at the large end (at the growth front interface 50). In between the seed end 40 and the growth front interface 50, there are surfaces of no-growth (i.e., the side wall of the tapered section 52 and the sidewall of the boule 54 with constant diameter). It should be noted that, generally, the Czochralski-grown crystal and the growth reactor exhibit substantially cylindrical symmetry (not including growth facets that can occur on the crystal sidewalls). Hence, the crystal has a central axis of cylindrical symmetry 56 through the long axis of the crystal parallel to the pull direction 48.

In addition to the general approach of the Czochralski process, many other commercial crystal growth processes are based on variants of this general approach. These include the commonly referred to Verneuil (flame fusion), Bridgman, and Stockbarger growth processes all of which are further described in the previously mentioned technical article of H. J. Scheel. All of these processes involve growth from the melt and are not suitable for WBG materials because most WBG materials cannot be melted and contained in a crucible at any practical growth conditions.

Overall LTC Process

In general, the present invention provides methods, growth reactors, and the beneficial products resulting therefrom of the crystal growth of large, low-defect tetrahedrally-bonded single crystals. Some of these methods start with a pre-existing large tapered crystal (LTC) seed 58, which may be further described with reference to FIG. 5. The crystal growth of 4H—SiC will be used as an example to illustrate the steps of the LTC process.

Figure 5:
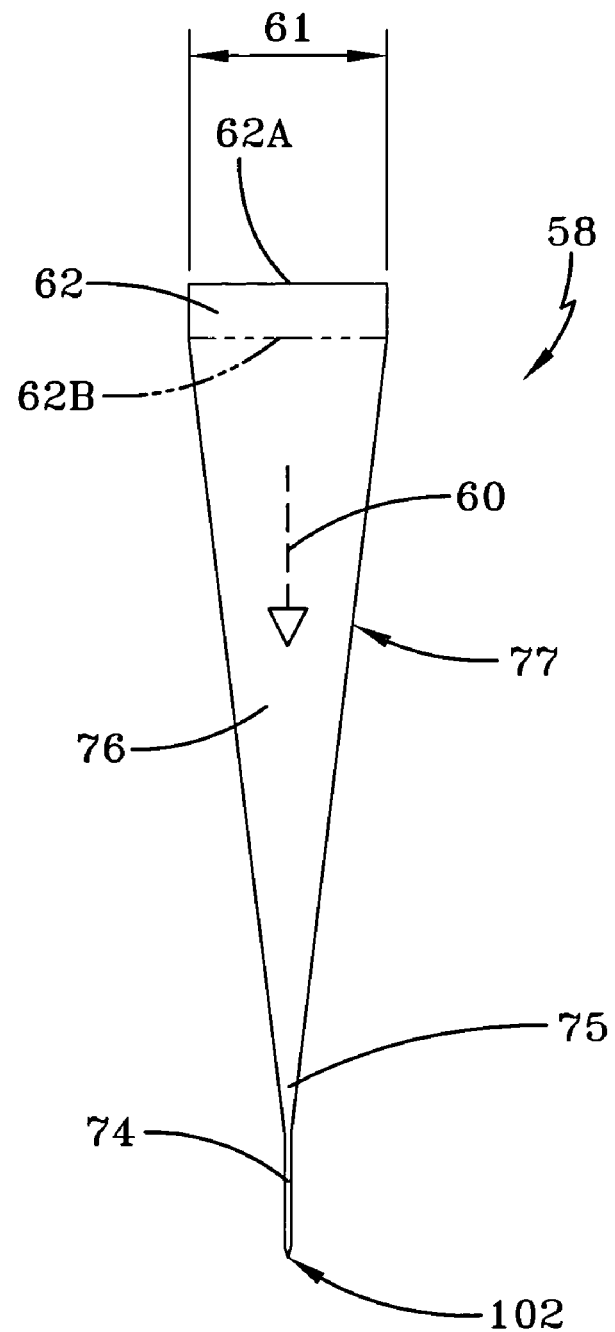
FIG. 5 illustrates the initial large tapered crystal seed utilized by the Large Tapered Crystal (LTC) process of the present invention.

The LTC seed 58 illustrated in FIG. 5 generally has four connected major portions that are substantially cylindrically symmetric about the central axis 60. Herein, "substantially cylindrically symmetric" shall include shapes that deviate from exact cylindrical symmetry. It is known by those skilled in the art of crystal growth that real single crystals generally grow into shapes that exhibit the crystal symmetry of the particular single crystal material. For example, a 4H—SiC crystal boule growing in a c-axis direction often exhibits facets with hexagonal symmetry about the c-axis. Hence, herein, "substantially cylindrically symmetric" or "substantially cylindrical symmetry" will also include non-cylindrical shapes that include facets that are distributed around the central axis.

As shown in FIG. 5, (a vertical cross-sectional view) the four substantially cylindrically symmetric connected portions of the LTC seed 58 are the following: (1) At the top of the LTC seed 58 is a base 62 having a diameter 61 measured perpendicular to the central axis 60 and having opposite upper and lower portions 62A and 62B (shown in phantom), respectively, and with its uppermost portion 62A to be attached to a holder (not shown in FIG. 5) for physical support of the LTC seed 58. (2) A tapered portion 76 of the LTC seed 58 extends along the central axis from the lowermost portion 62B of the base 62. (3) The lowermost end 75 of the tapered portion 76 extends into a columnar portion 74 (along the central axis and smaller in diameter than the diameter 61 of the base 62). (4) The lowermost end of the columnar portion 74 of the LTC seed 58 is designated to be the tip portion 102. More specifically, the tip portion 102 is defined to the crystal surface at the lowermost end of the columnar portion whose geometric surface normals are inclined less than 45 degrees from the central axis. The central axis 60 passes through the centers of the base 62, the tapered portion 76, the columnar portion 74, and the tip portion 102 of the LTC seed 58. Preferably, surface normals of the columnar portion are substantially 90° (i.e., perpendicular) to the central axis. By definition, surface normals of the tapered portion 76 are inclined greater than 45° from the central axis 60.

A large low-defect crystal boule can be grown using a hereinbefore described LTC seed 58 in the following manner. The selected LTC seed 58 is inserted into preferably a three-chamber apparatus 70 to be further described hereinafter with reference to FIGS. 6-12 or a four-chamber apparatus 214 to be further described hereinafter with reference to FIG. 18.

Figures 6A, 6B:
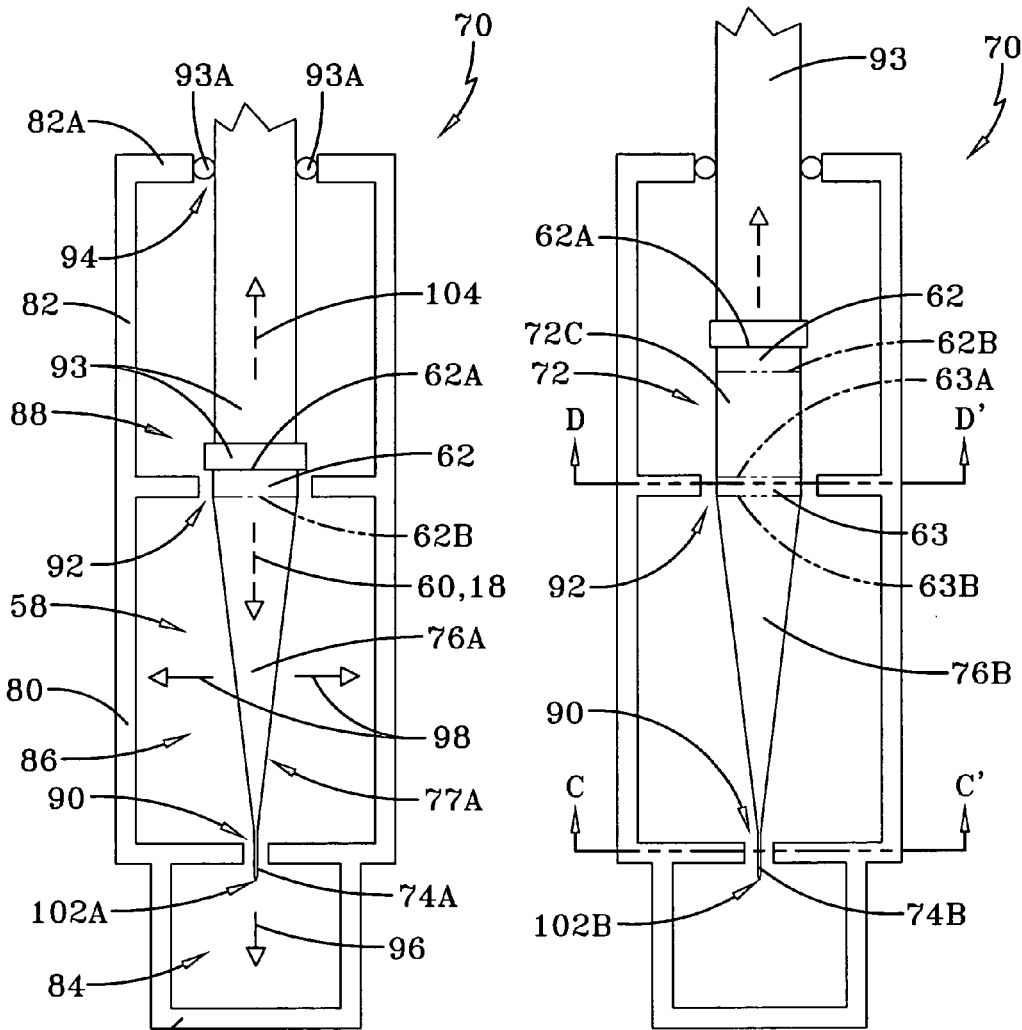
FIG. 6(A) is vertical schematic cross-section of the reactor and the large tapered crystal (LTC) seed before growth.
FIG. 6(B) shows the vertical cross-section after growth in the growth reactor of the present invention, resulting in a combination of a completed crystal boule and a new LTC seed.
Figure 6C:
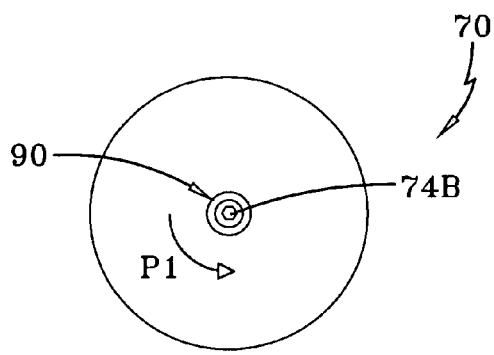
FIG. 6(C) shows a horizontal cross-section at lines C-C' in FIG. 6(B), illustrating the substantially cylindrical symmetry of the columnar region of the LTC seed and first reactor passageway between regions 1 and 2.
Figure 6D:
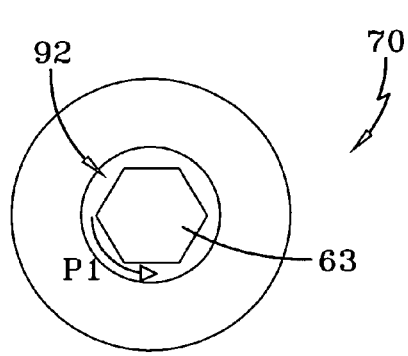
FIG. 6(D) shows a horizontal cross-section at lines D-D' in FIG. 6(B), illustrating the substantially cylindrical symmetry of the base region of the LTC seed and second passageway between regions 2 and 3.

FIG. 6 is composed of FIGS. 6(A), 6(B), 6(C), and 6(D). FIG. 6(A) is a vertical schematic cross section that illustrates an LTC seed 58 installed in a growth reactor 70 at the start of a growth cycle and FIG. 6(B) is a vertical cross-sectional schematic that illustrates the resultant completed crystal 72 in the growth reactor 70 at the end of a growth cycle. At the end of the growth cycle, the base 62 will have moved from the passageway 92 to region 3 (88, shown in FIG. 6(A), which is a region of no-growth), upward to a position shown in FIG. 6(B). Herein, the term "growing crystal 72" shall be used to designate the crystal (during a growth cycle) that is composed of the LTC seed 58 plus additional growth (i.e., deposited crystal material) that has occurred on the LTC seed 58 up to that point in the growth cycle.

FIG. 6(C) shows a horizontal cross-section of the reactor 70 and LTC seed 58 at lines C-C' in FIG. 6(B), illustrating the substantially cylindrical symmetry of the columnar portion 74B of the grown crystal 72 and first reactor passageway 90 to be further described. FIG. 6(D) shows a horizontal cross-section at lines D-D' in FIG. 6(B), illustrating the substantially cylindrical symmetry of the base portion 63 of the grown crystal and second passageway 92 to be further described.

Further, FIG. 6 is used to define some terms that are used to describe various embodiments of the invention. As an example of a preferred embodiment, FIG. 6 is used to illustrate essential steps of the LTC growth process applied to the growth of a 4H—SiC bulk crystal. The LTC seed 58 and the growing crystal 72 have substantially cylindrical symmetry (excluding possible facets likely to form on the external sidewall surface of the growing crystal 72) about the central axis 60 (a vertical axis in this example) that coincides with the long axis of the crystal. As an example, a grown crystal, whose horizontal cross section perpendicular to the central axis forms a hexagon, such as 63 shown in FIG. 6(D), would be considered to have substantially cylindrical symmetry for discussions herein. Also, herein, the central axis 60 of axial symmetry is referred to as the central axis of the growing crystal 72 being grown by the LTC process. FIG. 6(A) and FIG. 6(B), as well as most of the FIGS. 8-18, illustrate vertical cross-sectional schematic views through the center of the growth reactor and growing crystal 72. Herein, the growth direction at a point on a crystal surface shall be defined as the geometric normal to the surface at that point.

As defined hereinbefore, the central axis 60 passes through the tip portion 102 (shown in FIG. 5) of the LTC seed. Herein, the phrase "first growth surface" (also called herein the tip portion 102) shall designate that portion of the crystal surface contiguous to the lowermost end of the of the columnar portion 74 of the LTC seed 58 of FIG. 5 that satisfies the condition that the geometrical surface normals at all points on the surface are inclined within 45° of the central axis 60. Herein, the first growth surface (also called the tip portion) shall be designated by the element number 102. The magnitude of the diameter (measured perpendicular to the central axis 60) of the first growth surface is defined to be twice the distance from the central axis 60 within which all points of the first growth surface are contained. Further, by definition, the columnar portion 74 is that portion of the LTC that extends vertically from the uppermost part of the tip portion 102 to the lowermost part 75 (shown in FIG. 5) of the tapered portion 76 and which satisfies the condition that the maximum diameter of the LTC in the columnar portion is less than 1.5 times the diameter of the tip portion. The phrase "second growth surface" is defined to be all points on the crystal surface (of a crystal that is being grown, or has been grown by the LTC process) that lie outside the diameter of the first growth surface and fall within the boundaries of the columnar portion 74 or the tapered portion 76. Hence, the geometrical surface normals of all points on the second growth surface are inclined 45°, or more from the central axis 60.

To further clarify descriptions presented herein, the following two additional definitions are included: (1) Any crystal growth on a surface whose surface normals are inclined within 45 degrees of the central axis shall be considered as axial crystal growth. (2) Any crystal growth on a surface whose surface normals are inclined more than 45 degrees from the central axis shall be considered as lateral crystal growth. Hence, based on the definitions and descriptions presented herein, crystal growth on the tip portion 102 shall be called axial crystal growth and crystal growth on the columnar portion 74 and the tapered portion 76 shall be called lateral crystal growth.

Preferably, the growth reactor 70 of FIG. 6 has first, second and third chambers 78, 80 and 82, respectively, arranged vertically, defining interlaced first growth region (84) located at the bottom, second growth region (86) located in the middle and third region (88) located at the top, respectively, shown in FIG. 6(A). The first, second, and third chambers 78, 80, and 82 are arranged to provide at least a first passageway 90 between first and second chambers 78 and 80, and a second passageway 92 between second and third chambers 80 and 82. Preferably the third chamber 82 has an upper portion 82A provided with a passageway 94. Preferably, all of the passageways shall be aligned along a vertical axis.

The growth reactor 70 has a holder 93, preferably having rotatable seals 93A, located inside the third chamber 82 for holding the base 62 of the LTC seed 58 (shown most clearly in FIG. 6A), so that the tapered portion (76A in FIG. 6(A)) of the LTC seed 58 lies between both the first and second passageways 90 and 92, respectively, and extends completely through the second growth region 86 and with its tip portion 102 extending into the first growth region 84. The purpose of the holder 93 shall be to support the LTC seed and to move the LTC seed along the central axis as needed during the LTC process. Preferably, the holder 93 also provides means for the LTC seed 58 to be rotated about the central axis 60 during growth as shown by rotational arrow P1 in FIGS. 6(C) and 6(D) in order to ensure high cylindrical growth uniformity on the LTC seed 58 (and the growing crystal 72) countering the possible presence of slight axial non-symmetries in crystal growth conditions (i.e., precursor concentration, flow, temperature, to be described). It is important to note, however, that uniform growth conditions will probably not lead to an LTC seed 58 (or completed crystal 72) with a horizontal cross-section that exhibits perfectly cylindrical symmetry about the central axis 60, as growth facets, well-known to those skilled in the art, will form on the crystal. For example, 6 growth facets corresponding to the hexagonal crystal symmetry of 4H—SiC are expected to evolve on a growing LTC seed 58 (or a growing crystal 72) comprised of 4H—SiC, making the horizontal cross-section of the LTC seed 58 somewhat hexagonal as shown in FIG. 6(C). Hence, the completed crystal 72 exhibits substantially cylindrical symmetry.

The growth reactor 70 further has means, not shown in FIG. 6, but to be further described hereinafter, associated with the first chamber 78 (first growth region 84) for growth of the tip portion 102 of the LTC seed 58 in a preferred crystal direction 96 along the central axis 60, and means, not shown in FIG. 6, but to be further described, associated with the second chamber 80 (second growth region 86) for growth along the tapered portion 76, in a lateral direction 98 substantially perpendicular to the central axis 60.

FIG. 6(A) shows a growth reactor with the three regions, 84 (the first growth region), 86 (the second growth region) and 88 (a region of low or no growth) to designate three separate process actions taking place during the LTC process. However, this does not necessarily imply that the process of the present invention must take place in an apparatus with three separate physical regions. FIG. 6(B) shows the configuration of the completed crystal 72 at the end of a growth cycle. Herein, the region of low or no-growth 88 shall also be referred to as the no-growth region. In the example shown in FIG. 6, the orientation of the 4H—SiC crystal is with the crystal c-axis 18 (see FIG. 2(C)) parallel to and coincident with the central axis 60 of the LTC seed 58 being grown. The preferred orientation of the central axis 60 of the LTC seed 58 is vertical with the tip portion 102 pointing downward, but other orientations could also be used.

The first growth action (shown in FIG. 6(A), taking place in the first growth region 84 is, in one embodiment, a fast dislocation-assisted axial growth (the order of 0.5 mm/h) of the first growth surface (with a diameter of the order of 1 mm, or less) on the tip portion 102 of the LTC seed 58. Growth takes place downward, shown by arrow 96 in the c-axis 18 direction along the central axis 60. For the case of 4H—SiC, the dislocation is an axial screw dislocation with a Burgers vector (known to those skilled in the art, and described in the previously mentioned article of Powell, Pirouz, and Choyke) equal to one or more multiples of the repeat distance of the 4H—SiC polytype and in a direction parallel to the crystal c-axis 18 (either the <0001> or the <000$\bar{1}$> crystal directions). In another embodiment, more than one axial screw dislocation could be present in the tip portion 102 of the LTC seed 58 that is being grown to the completed crystal 72. For other embodiments, hereinafter described, no dislocation is needed. It is preferred that the columnar portion 74 of the LTC seed 58 maintain an approximately columnar shape in the vicinity of the tip portion 102 (i.e., in the vicinity of the first growth surface). This requires that the growth rate decreases away from the first growth surface.

The dislocation-assisted axial growth takes place in the first growth region 84. Under isothermal, or near isothermal conditions, the growth habit (morphology) of the hexagonal polytypes of SiC generally favors a laterally-enlarging platelet perpendicular to the c-axis 60 (instead of the preferred columnar shape) with the large surface of the platelet parallel to the basal (0001) plane. This is well documented in prior art that is disclosed in the previously mentioned U.S. Pat. No. 5,746,827. For the case of the LTC process, undesired lateral growth (that is generally observed in prior art) in the vicinity of the first growth surface, that is, the tip portion 102, would be perpendicular to the central axis 60. Therefore, a specific temperature profile and/or flow profile and/or growth process is employed in the region of the tip portion 102 of the LTC seed 58, to ensure that the morphology maintains the preferred (for the LTC process) small-diameter columnar shape (rather than an evolving platelet shape) with the long axis of the columnar portion oriented parallel to the central axis 60. There are various growth process options, all to be discussed hereinafter, that can be used for carrying out this axial columnar crystal growth in the first growth region 84.

The present invention has alternate embodiments for achieving the preferred small-diameter columnar shape in the growth of columnar portion 74. These are: (a) two vapor-solid processes (herein named Options VS1 and VS2) to be further described hereinafter with reference to FIGS. 9(B) and 10(B) respectively, (b) an option employing the vapor-liquid-solid (VLS) process (herein named Option VLS) to be further described with reference to FIG. 9(C), and (c) an option employing a combination of the traveling solvent method (TSM) and the laser heated pedestal growth (LHPG) method (the combination herein named Option TSM/LHPG) to be further described with reference to FIG. 11(B).

Growth conditions during the first growth action are set so as to (1) establish a higher vertical axial c-axis (for the case 4H—SiC crystal growth) growth rate in the first growth region 84 on the first growth surface (i.e., the tip portion 102) compared to the lateral growth rate of the second action growth in the second growth region 86 on the second growth surface (i.e. the tapered portion 76), and (2) maintain a relatively small diameter at the tip portion 102 compared to the desired largest diameter 61 of the completed crystal 72 of FIG. 6(B) (i.e. less than 10%, or preferably less than 1%, of the desired diameter 61 of the base 62 of the completed crystal 72. It is important that the diameter of this tip portion 102 be kept as small as possible during growth in the first growth region 84 (in contrast to the platelet growth morphology commonly observed with α-SiC crystal growth) in order to achieve high axial (vertical) growth rates in the first growth region 84. To achieve this, it is preferable that a columnar portion 74 be maintained between the tip portion 102 and the lowermost end 75 (shown in FIG. 5) of the tapered portion 76 during the entire growth cycle.

For all embodiments of the invention, the "side wall" of the LTC seed 58 of FIG. 5 and for the growing crystal 72, shall be defined as any surface (of the crystal 58 or 72) that has a surface normal that is inclined more than 45° from the crystal central axis 60. The growth surface in the second growth region 86 is, by definition, the "side wall" 77 of the tapered portion 76. Herein, the crystal growth on the sidewall of the growing crystal 72 in the second growth region is called lateral crystal growth.

As the enhanced dislocation-assisted growth is occurring on the tip portion 102 in the first growth region 84 of the growth reactor 70, the holder 93 of the LTC seed 58, shown most clearly in FIG. 6(A), is moved upward 104 at a velocity equal to the first action growth rate in the downward axial direction 96, in order that the tip portion 102 (i.e., the first growth surface) of the growing crystal 72 remains at the same vertical position with respect to the first growth region 84 throughout the duration of a growth cycle. It is desired that the direction of the geometric surface normal of the side wall of the columnar portion 74 be nearly perpendicular to the central axis 60. Hence, it is desirable to produce a small-diameter columnar-shaped crystal within the first growth region 84.

With reference to FIG. 6, the second growth action of the LTC process is used to produce a gradual increase in the diameter of the tapered portion 76 of the LTC seed 58 (called the growing crystal 72 during growth) as it passes through the second growth region 86. This occurs by lateral crystal growth on the tapered side wall 77 of the growing crystal 72 as it passes through the second growth region 86. This second action growth is denoted by lateral directions 98 in FIG. 6(A). The second action growth in region 86 may take place at a lower temperature and lower linear growth rate than that of the first action growth in region 84 to ensure good crystal quality under non-dislocation assisted growth. As will be further discussed hereinafter, the dislocation-assisted axial (i.e., vertical) crystal growth rate parallel to the central axis 60 direction in the first growth region 84 ultimately controls the number of wafers per unit time that can be produced by the growth reactor. Growth conditions in the second growth region 86 are set to achieve a continuous lateral growth 98 at moderate growth rates on the side wall 77 of the tapered portion 76, as it passes through the second growth region 86.

In one embodiment, the lateral growth occurring within the second growth region 86 of apparatus 70 can be carried out using chemical vapor deposition (CVD) utilizing a hot-wall growth reactor to be further described hereinafter with reference to FIGS. 8-10. Precursors used within the apparatus 70 could include silane ($SiH_4$) and propane ($C_3H_8$) for silicon and carbon containing gases. A chlorine-containing precursor could also be used to increase growth rate and reduce (1) spurious nucleation on the side wall of the seed crystal and (2) gas-phase nucleation of Si particles. The crystal growth of SiC with chlorine-containing precursors is further described in the two technical articles of R. L. Myers, O. Kordina, S. Rao, R. Everly, and S. E. Saddow, "Increased Growth Rate in a SiC Reactor Using HCl as an Additive," Mat. Sci. Forum, Vols. 483-485, pp. 73-76, 2005, presented at ECSCRM 2004, and J. A. Powell and H. A. Will, "Epitaxial Growth of 6H Silicon Carbide in the Temperature Range 1320° to 1390° C.," J. Appl. Phys, vol. 44, pp. 5177-5178, 1973.

Since the SiC crystal stacking sequence along the c-axis crystal direction 18 (i.e. the stacking sequence of a given SiC polytype) is established during the growth of the tip portion 102 of the growing crystal 72 in the first growth region 84, the side wall growth in the second growth region 86 will maintain the same stacking sequence via lateral growth extension of the existing crystal stacking. Additionally, it is preferable to maintain a uniform growth temperature in the second growth region 86 in order to avoid undesired stress in the growing crystal 72 due to thermal gradients that could, in turn, generate undesired dislocations and other defects. Additionally, lower growth temperature in the second growth region (compared to that of the first growth region) should reduce dislocations compared to higher temperature growth processes, as physical mechanisms for dislocation generation and motion within crystals are generally known to increase with temperature.

The third action of the LTC process is for the large end of the growing tapered portion 76 to move into the third region 88, which is a region of no-growth (or low growth), when the diameter 61 of the uppermost end 62B of the tapered portion 76 has reached a desired diameter.

With reference to FIGS. 6 and 7, under proper uniform growth conditions, the diameter of the expanding tapered portion 76 of the growing crystal 72 increases to maintain the approximate same tapered shape as it moves in an upward direction 104 through the second growth region 86. It is expected that the side walls of the columnar portion 74, the tapered portion 76, and the completed boule 72A will exhibit growth facets. The lateral growth rate, the speed of passage through the second growth region 86, and the height (vertical length) of the second growth region 86 can be adjusted so that, as the growing crystal 72 leaves the second growth region 86 and moves into the third region (the no-growth region 88), it has reached the desired boule diameter 106, to be further described hereinafter with reference to FIGS. 6(B) and 7.

As shown in FIG. 6(B), the growth cycle produces a new LTC seed and a completed low-defect crystal boule. The new LTC seed, shown in FIG. 6(B), is comprised of a base 63 bounded by an uppermost limit 63A (shown in phantom) and a lowermost limit 63B (shown in phantom), a tapered portion 76B, a columnar portion 74B, and a tip portion 102B (all shown in FIG. 6(B)). The completed crystal boule is comprised of the combination of the base 62 from the initial LTC seed 58 and the crystal 72C of constant diameter 106 between the lowermost limit 62B of the initial base 62 and the uppermost limit 63A of the base 63 of the new LTC seed.

FIG. 7, composed of FIG. 7(A), 7(B), and 7(C), further illustrates the initial LTC seed 58 at the beginning of a growth cycle and the completed crystal 72 at the end of a growth cycle. In FIG. 7(A), the LTC seed 58 at the beginning of a growth cycle is shown in phantom with beginning (initial) tip portion 102A, initial columnar portion 74A, initial tapered portion 76A, and initial base portion 62. The base 62 is shown with the uppermost end 62A and the lowermost end 62B. At the end of the growth cycle, the LTC seed has enlarged to completed (or final) crystal 72 with newly grown final tip portion 102B, final columnar portion 74B, and final tapered portion 76B. After completion of a growth cycle, the completed crystal 72 of FIG. 7(A) is cut into two pieces as shown in FIG. 7(B) and FIG. 7(C). The new LTC seed indicated as 72B in FIG. 7(B) has the same physical shape and properties as the initial LTC seed 58 with a base 63 with an uppermost end 63A and a lowermost end 63B, and a tapered portion 76B, a columnar portion 74B, and a tip portion 102B. The remainder of the completed crystal 72 is termed the completed boule 72A (shown in FIG. 7(C)) and is comprised of the initial base 62 from the initial LTC seed 58 at the beginning of the growth cycle and some of the crystal material that was grown during the growth cycle. Thus, the original base plus some of the additionally grown crystal material forms a crystal boule 72A with a length 108 and with a substantially constant diameter 106. This boule 72A can be cut into wafers, to be further described hereinafter, for use in electronic and optical applications.

For "on-axis" wafers of SiC, the wafers are cut perpendicular to the c-axis 18. In this example for 4H—SiC, the uppermost portion 62A of the base 62 is cut perpendicular to the c-axis 18 (i.e. the central axis 60 of the LTC seed 58 used for growth of the completed crystal 72). Often 4H—SiC wafers, used for electronic applications, are cut at angle of 8° from the basal plane (30 in FIG. 2(A)). It is preferable that the end faces of completed boules 72A of 4H—SiC, that are used for such applications, be grown by the LTC process with end faces inclined 8° from the basal plane. In order to accomplish this desired result, the LTC seed 58 prepared for such LTC process growth cycles should be cut at the desired off-cut angle of 8°. LTC seeds 58 for other SiC polytypes can be offcut at other desired angles (e.g. 3.5° often used for 6H—SiC). Compared to conventional practice of cutting off-axis wafers from currently available SiC boules, the use of LTC seeds 58 with the uppermost portion of the base cut at a desired off-cut angle would significantly reduce waste in cutting off-axis wafers from the subsequently-grown boules.

The new LTC seed 58 (termed 72B of FIG. 7(B)), resulting from the remainder of the completed crystal 72 of the previous growth cycle after the completed boule is removed, can be installed in the apparatus 70 and an additional growth cycle can be carried out. Repeating the LTC process in this manner will enable a new completed boule 72A to be produced at the axial (vertical) growth rate 96 of the dislocation-assisted growth in a manner as previously described. An important benefit of the LTC process of the present invention is that a large low-defect boule 72A will begin to be grown (at the fast growth rate of the tip portion 102 of the new LTC seed 58) as soon as growth conditions are reached in a subsequent growth run.

Preferably, the completed crystal 72 of FIG. 7(A) is kept at the same temperature in third region 88 as in second growth region 86 and in a suitable inert atmosphere that minimize thermal gradients that might otherwise induce stress, dislocations, or other undesired changes in the completed boule 72A of FIG. 7(C). Growth continues in the first and second growth regions, 84 and 86 respectively, until the portion of the growing crystal 72 in the no-growth region 88 has reached a desired length 108 (see FIG. 7(C)). Then, the LTC growth process can be interrupted and the entire completed crystal 72 of FIG. 7(A) can be controllably cooled to room temperature. The entire completed crystal 72 of FIG. 7(A) can then be removed from the apparatus 70. The completed crystal boule 72A is then cut from the completed crystal 72 and as mentioned previously the remainder (termed 72B of FIG. 7(B)) of the completed crystal 72) is used as a new LTC seed 58 in a subsequent growth cycle.

In several aspects, the LTC crystal growth approach is radically different from conventional crystal growth approaches (e.g. Czochralski, Verneuil, Bridgman, Stockbarger, etc.,) described in the previously mentioned technical article by H. J. Scheel. More particularly, in conventional crystal growth approaches: (1) each growth cycle starts with a new small seed crystal, (2) growth takes place under relatively uniform growth conditions on a single, relatively planar growth front that moves away from the small end of the seed crystal, (3) as growth proceeds, a tapered region is produced as the growth front becomes larger, (4) as growth proceeds further, a single crystal boule of constant cross-section is produced on the large end, and (5) the entire growing crystals are supported at the seed end (i.e. the small end) of the crystals (for crystals not grown in a crucible).

In contrast to the above, after an initial growth cycle, the LTC growth process of the present invention is different in at least six (6) ways, which are: (1) utilizes a large seed (crystal 72B of FIG. 7(B)) that is produced by a previous growth cycle, (2) the LTC seed 58 is supported at the large end, (3) growth takes place on two surface areas of the LTC seed that are significantly inclined from each other by more than 45° with two different growth conditions: (a) on the tip portion 102 of the LTC seed 58 (in the axial direction 96), whereby the diameter of the tip portion 102 of the LTC seed 58 remains less than some preset value, and (b) on the tapered portion 76 of the LTC seed 58 (in approximately lateral directions 98), (4) the desired crystal boule is grown on the support end of the completed crystal 72, (5) each new growth cycle produces a new LTC seed 58 for a subsequent growth cycle, and (6) the axial growth rate of the completed crystal boule 72A can be made independent of the diameter of the completed crystal boule 72A.

Growth Reactor Configuration for Implementing the LTC Process

The apparatus 70 of FIG. 6, also termed growth reactor 70, may be further described with reference to FIG. 8 composed of FIGS. 8(A) and 8(B), and which schematically illustrate one growth reactor configuration that can be used for implementing two preferred embodiments of the LTC growth process. A comparison between the schematic vertical cross-sections of FIGS. 6 and 8 reveals that the first chamber 78 of FIG. 8(A) is the lower chamber of a multi-chamber growth reactor having a box-like configuration. In addition, the growth reactor has substantially cylindrical symmetry about a vertical central axis that is coincident with central axis of the growing crystal 72, consistent with FIGS. 6(C) and 6(D).

As used herein, the carrier or purge gas may be referred to herein by the reference number associated with their respective inlet or outlets.

Figures 8A, 8B:
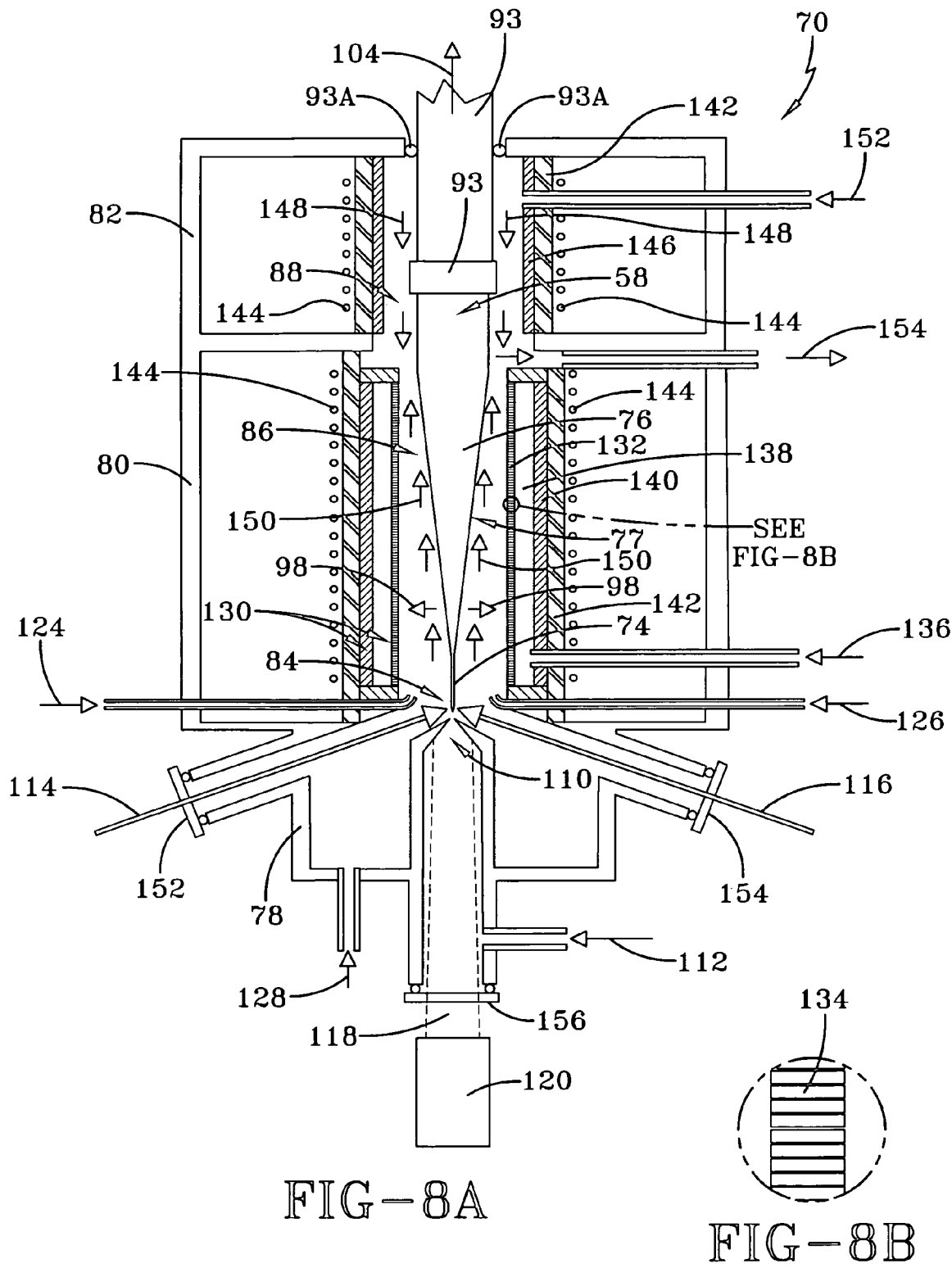
FIG. 8 is a schematic cross-sectional drawing illustrating one preferred embodiment of a growth reactor for carrying out the inventive growth method of the present invention.

For the axial (vertical) growth (i.e. parallel to the central axis) embodiment, a small diameter flow (FIG. 8(A)) of precursors, provided through the flow nozzle 110 (supplied by precursors 112, also referred to as inlet 112) impinges on the very small-diameter tip portion 102 (preferably less than 1 mm) of the LTC seed 58 (also called the growing crystal 72 during a growth cycle) to provide axial growth at a high growth rate. In the embodiments shown in FIGS. 8 and 9, to be further described hereinafter, some localized heating on the tip portion 102 and on the columnar portion 74 in the vicinity of the tip portion 102 can be provided by laser sources (not all shown) (emitting laser beams 114, 116, and/or 118) (or other suitable means) in order to shape the temperature profile near the tip portion 102 to promote columnar growth (i.e. for the columnar portion 74 of the growing crystal 72) rather than lateral platelet growth morphology near the tip portion 102. Preferably, the average temperature near the tip portion 102 of the LTC seed 58 should be in the range 1600° to 2100° C. for the growth of α-SiC. Most likely, this average temperature near the tip portion 102 will be somewhat higher than the crystal temperature maintained in the second growth region 86. An external heater (not shown) that preheats the gaseous precursors 112 that impinge on the tip portion 102 in the first growth region 84 can be an inductively heated TaC-coated graphite heater. Other materials that minimize SiC deposition on the heater could also be used. Other sources of energy for maintaining the temperature of the gaseous precursors in inlet 112 could be the laser beam 118 generated by laser source 120 that is used to also heat the flow nozzle 110 to reduce unwanted material deposition on the flow nozzle 110. This laser beam 118 can also provide some energy to the tip portion 102 of the growing crystal 72. In any case, the distribution of energy sources would be optimized for the proper temperature profile near the tip portion 102 of the growing crystal 72, and the preheating of gaseous growth precursors in nozzle 110. Further details of providing heat and growth precursors to the tip portion 102 of the crystal 72 are to be discussed hereinafter.

As previously discussed in previous sections, lateral growth (crystal enlargement), now shown in FIG. 8(A) by reference number 98, actually takes place on the tapered portion 76 in the second growth region 86. For this growth, suitable precursors mixed with a carrier gas are provided through inlets 124, 126 and 128. As used herein, the carrier or purge gas may be referred to herein by the reference number associated with their respective inlet or outlets. Separate inlets for Si-containing and C-containing precursors could also be used (e.g. one through inlet 124, and one through inlet 126). Additional inlets could be used to distribute precursors along the length of the tapered portion 76. The temperature of the tapered portion 76 and the completed crystal 72 in the no-growth region 88, should preferably be uniform and estimated to be in the range 1500° C. to 2000° C. for hexagonal SiC. In some embodiments, there will be a short distance along the columnar portion 74 and lower end of the tapered portion 76 of the growing crystal 72 where the temperature drops from the temperature at the tip portion 102 (see FIG. 6) down to the temperature maintained in the second growth region 86 shown in FIG. 8(A).

FIG. 8, in particular the growth reactor 70, illustrates a hot-wall method for heating the LTC seed 58 of FIG. 5 and/or the growing crystal 72 of FIG. 7(A). This type of heating is sometimes called a "chimney" growth reactor because of the vertical upflow of reactants through a hot-wall configuration. Typically, with chemical vapor deposition (CVD) of thin epitaxial films on wafers in a hot-wall chimney growth reactor 70, the wafers are mounted on a hot inside wall. In this case, bulk crystal growth is desired on a vertical tapered cylindrical substrate (i.e. tapered portion 76 in the second growth region 86) located along the center axis of the hot-wall reactor 70 (i.e. coincident with the central axis 60 of the growing crystal 72). Hence, some suitable means must be provided to minimize deposition on the surrounding hot wall of the reactor. One approach, shown in FIG. 8(A) utilizes an inductively-heated, two-cylinder susceptor 130 comprised of inner cylinder 132 and outer cylinder 140 in the second growth region 86 with several special features. First, an inside wall of the inner cylinder 132 (the wall facing the tapered portion 76) is coated with a material that resists SiC deposition (e.g. TaC). Second, the inner cylinder 132 of susceptor 130, in particular the inside wall, has small flow channels 134 (see FIG. 8(B)) oriented radially to allow a purge gas entering in inlet 136 to be introduced to the space 138 between the two susceptor cylinders (132 and 140) and then through the flow channels 134 shown in FIG. 8(B). This allows a purge flow to be introduced, via inlet 136 along the inside wall of the inner susceptor cylinder 132 in the second growth region 86. This purge gas flow, via inlet 136, can be a mixture of hydrogen plus an inert gas and/or other gases. This purge gas, via inlet 136, along the inside wall of the inner cylinder 132 has two purposes: (1) to minimize contact of the inside wall of the inner cylinder 132 with the gaseous growth precursors that are directed along the tapered portion 76, and (2) to etch away any unwanted solid deposition that may nucleate on the hot inner wall of the inner cylinder 132 of the two-cylinder susceptor 130. An alternate to the inner wall with channels 134 is to utilize an inner susceptor cylinder 132 with a permeable wall that would allow a similar purge gas flow.

The outer wall of the outer cylinder 140 of the two-cylinder susceptor 130 (comprising cylinders 132 and 140), in the second growth region 86, shown in FIG. 8(A), is surrounded by a thermal insulating material 142 which, in turn, has inductive coils 144 wrapped therearound. The susceptor 146, shown in the third region 88, is comprised of a single cylinder. Similarly, shown in third region 88 is the holder 93 having rotary seals 93A. The holder 93 may comprise a thermally insulated rotating type holder for the LTC seed of FIG. 6(A) and hence also for the completed crystal 72 of FIG. 6(B).

As shown in FIG. 8(A) the preferred direction of flow of the various gases in the third region 88 is indicated by directional arrows 148, whereas the preferred direction of flow of the various gases in the second region 86 is indicated by directional arrows 150.

Following the principles of the present invention, once growth conditions have been set up properly, the large end of the tapered portion 76 will have reached the desired diameter 106 as it enters no-growth region 88. In this region 88, a purge gas introduced via inlet 152, similar to the purge gas 136 used for the second growth region 86, is utilized. The purpose of the purge gas 152 is to prevent precursors from entering the no-growth region 88, so that neither deposition nor significant etching will occur on the portion of the completed crystal 72 residing in the no-growth region 88. The temperature in the no-growth region 88, should preferably be nearly the same as in the second region 84, so as not to cause thermal gradient stress that could otherwise trigger dislocations, or other unwanted defects, in the growing crystal 72. Since there are no growth precursors in the no-growth region 88, there is no need to use a two-cylinder susceptor for heating the portion of growing crystal 72 that resides in the no-growth region 88.

A further option for heating the second growth region 86 is to use a single-cylinder inductively-coupled susceptor (not shown) with added flow of suitable etching/purge gases along the inner wall to minimize undesired solid deposition on the inner wall of the single-cylinder susceptor.

An additional desirable capability of the growth reactor 70 is to provide holder 93 so as to rotate the growing crystal 72 about the central axis 60 during growth to improve the uniformity and symmetry of the completed crystal 72. This holder would also provide motion in direction 104 in order to maintain the proper fixed position of the tip portion of the growing crystal 72 relative to the first growth region 82.

The reactor configuration described hereinbefore has referred to the tip portion 102 and the first growth region 84 as preferably residing below the rest of the crystal and growth regions. However, the principles of the present invention could also be practiced with the growth apparatus and crystal illustrated in FIGS. 6(A), 6(B), and 8(A) flipped vertically. Although such a flipped configuration might have some disadvantages with respect to gas flows required for crystal growth, it would enable simplification of holder 93 as the large end of the growing crystal would be resting on a broad surface, hence placing much less stress on the crystal. It is conceivable that a gravity pedestal might better suppress dislocation generation due to crystal weight force in the case of a very large (i.e., heavy) growing crystal 72.

Dislocation Assisted Growth Options

There are several options for carrying out the screw-dislocation-assisted growth (i.e., the growth on the tip portion 102 of the LTC seed 58 of FIG. 5) in the first growth region 84. Four of these options VS1, VS2, VLS, and TSM/LHPG, have details that are respectively illustrated in FIGS. 9(B), 10(B), 9(C) and 11(B) and provide additional features for the first growth region 84 on the vicinity of the tip portion 102.

Dislocation-Assisted Growth: Vapor-Solid Growth (Option VS1)

FIG. 9(A) is similar to that illustrated in the bottom portion of FIG. 8(A), but is partially cut-away, so as to more clearly show some details of one possible growth reactor for the first growth region 84. Further, FIG. 9(A) shows provisions 152, 154, and 156, such as windows, lens, and/or other optical components for assisting in the focussing of lasers 114, 116 and 118, respectively, also shown in FIG. 8(A), but not previously described.

A schematic diagram of dislocation-assisted growth by a vapor-solid growth mechanism (Option VS1) in the first growth region 84 is shown in FIG. 9(A) and, more particularly, in FIG. 9(B). The preheated flow, indicated by directional arrows 158 of FIG. 9(B), of gaseous precursors impinges on the tip portion 102 of the growing crystal 72. In addition to being partially heated by two-cylinder inductively heated susceptor 130, additional heating can be provided by focused laser beams (e.g., 114 and 116) (or other suitable focused energy beams). A somewhat higher temperature (compared to that of the second growth region 86) and a suitable temperature profile near the tip portion 102 and the columnar portion 74 near the tip portion 102 is maintained by the laser beams 114 and 116 that are focused on the side (not shown) of the growing crystal 72. The region of maximum temperature should be an approximate ringed region around columnar portion 74 of the growing crystal 72 near the axially (i.e., vertically) growing tip portion 102. A suitable temperature profile will promote the migration of growth adatoms toward the tip portion 102 resulting in enhanced axial (vertical) growth of the tip portion 102. The laser beams 114 and 116 can be scanned axially along the columnar portion 74 to produce an optimum temperature profile for the desired crystal growth. Optimum growth conditions will maintain the diameter of the columnar portion 74 of the growing crystal 72 constant and less than 1 mm (or preferably less than or about 200 µm in diameter). It is expected that real-time control of laser power and position will help enable optimization of the process.

The presence of at least one axial screw dislocation, to be further described hereinafter with reference to FIGS. 13 and 14, in a small central area of the tip portion 102 of the growing crystal 72 for this hexagonal SiC embodiment of the invention will provide a continuous source of spiral steps for the rapid step-flow axial (vertical) growth of the tip portion 102. The LTC process eliminates the problem of coalescence of growth steps from multiple step sources that occurs with prior-art SiC bulk crystal growth processes which utilize seed crystals with a large-area, c-axis, growth-front surface with hundreds or thousands of screw dislocation step sources. More importantly, the LTC process approach allows the growth of a completed crystal boule 72A of FIG. 7(C) that is defect free except for the very small diameter (less than the diameter of the tip portion 102) of the axial core of the completed boule 72A.

In general, for the Option VS1 of FIG. 9(B) (and for Option VLS of FIG. 9(C)), to be further described hereinafter, methods are provided for preheating suitable gaseous precursors that contain Si and C (for the example of 4H—SiC), and then directing a flow of the preheated gaseous precursors toward the tip portion 102 of the growing crystal 72. First, the gaseous precursors are preheated by suitable heaters so as to produce gaseous species that are suitable for deposition of SiC on the growing crystal 72 at the tip portion 102. These gaseous species are shaped into a small diameter flow by passing the gas mixture through the flow nozzle 110, which in the embodiments shown in FIG. 9 has an orifice 110 in the end of a cone-shape structure. In order to eliminate unwanted deposition on the flow nozzle 110, a suitable laser beam, such as laser beam 118 shown in phantom, is focused on the inside of the nozzle 110 in order to (1) evaporate (sublime) unwanted deposition on the nozzle 110 housing (not shown), and (2) also provide some energy for heating the tip portion 102 of the growing crystal 72. Additionally, this laser beam 118 also can supply some of the energy for heating the nozzle 110 housing for preheating the gaseous precursors supplied via inlet 112 for the desired axial growth.

Dislocation-Assisted Growth Option: Vapor-Solid Growth (Option VS2)

Figure 10B:
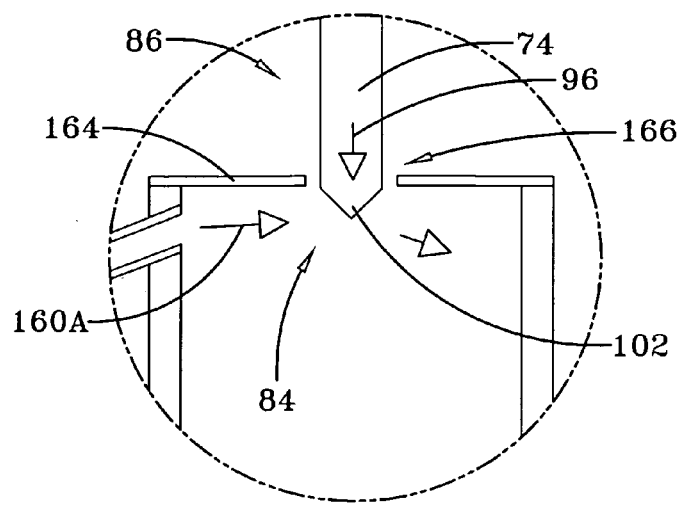
FIG. 10 is composed of FIGS. 10(A) and 10(B) and is a partial schematic cross-sectional drawing illustrating a third preferred embodiment (Option VS2), shown most clearly in FIG. 10(B), for the growth of the tip portion of the LTC seed in region 1 of the growth process.
Figure 10A:
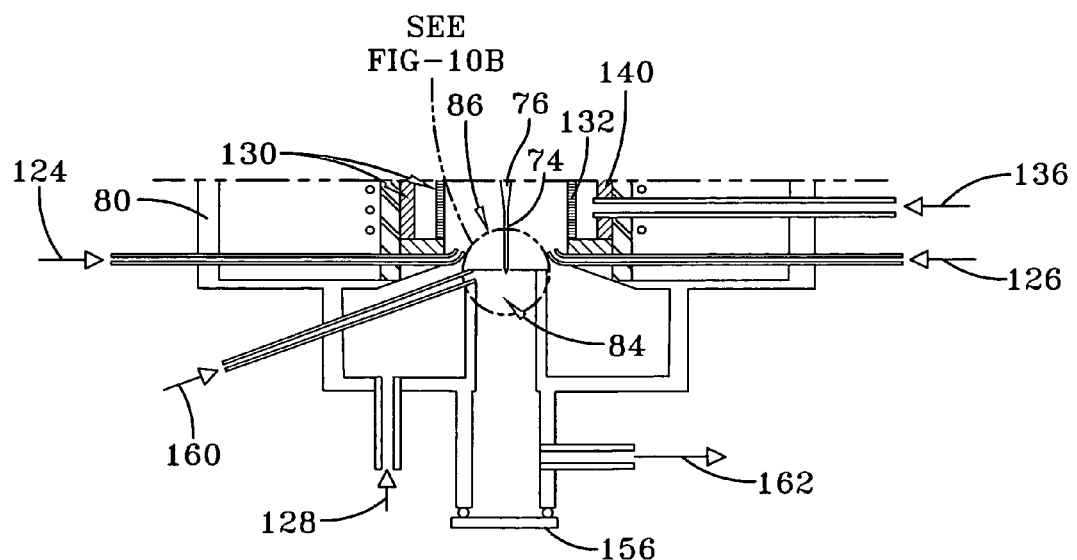

The growth option (Option VS2) may be further described with reference to FIG. 10(B) and uses a physical partition to separate the first growth region 84 from the second growth region 86 to allow more effective separation of paths for gaseous precursors for the two growth regions. FIG. 10 is composed of FIGS. 10(A) and 10(B), wherein FIG. 10(A) is similar in many respects to FIG. 9(A). However, FIG. 10(A) is devoid of lasers 114, 116 and 118 and laser source 120, but has added inlet 160 and outlet 162. FIG. 10(B) illustrates the flow out of inlet 160 by the use of directional arrow 160A.

As shown in FIG. 10(B), a heated separation plate 164 with a small orifice 166 allows the tip portion 102 of growing crystal 72, to be exposed only to the precursors in the first growth region 84. The vertical position of the tip portion 102 of the growing crystal 72 relative to the orifice 166 is optimized to maintain a fast axial growth of the tip portion 102. As the tip portion 102 grows axially (indicated by arrow 96 in the arrangement of FIG. 10(B)), the position of the holder 93, shown in FIG. 8(A), is moved vertically indicated by arrow 104 to maintain the optimum relative position of tip portion 102 fixed relative to the orifice 166.

Dislocation-Assisted Growth Option: Vapor-Liquid-Solid Growth (Option VLS)

A schematic diagram of dislocation-assisted growth of the tip portion 102 by a vapor-liquid-solid (VLS) growth process (Option VLS) is shown in FIG. 9(C). The VLS process has been known for many years, is described in the previously mentioned U.S. Pat. No. 3,346,414, and has been used to grow fibers of many different crystalline materials. Some of the early prior art SiC results are those of Knippenberg and Verspui disclosed in the previously mentioned U.S. Pat. Nos. 3,721,732 and 4,013,503. When Knippenberg and Verspui attempted to grow SiC fibers in the c-axis direction on non-cubic polytype of SiC substrates, the most often produced fibers were of the cubic polytype. Thus, their result is not useful for the present invention. More recently, other workers have used the VLS process to grow SiC epitaxial layers on commercial SiC wafers. This recent effort is more fully disclosed in the technical article of; C. Jacquier, G. Ferro, C. Balloud, M. Zielinski, J. Camassel, E. Polychroniadis, J. Stoemenos, F. Cauwet, and Y. Monteil, "Growth and Characterization of Heavily Al-Doped 4H—SiC Layers Grown by VLS in an Al—Si Melt," Mat. Sci. Forum, Vols. 457-460, pp. 735-738, 2004, (presented at ICSCRM 2003). In these recent processes, step-flow epitaxial growth of existing steps on the surface was achieved by solution growth using various solvent solutions (e.g. Si and Al). However, these processes are also not applicable to the requirement of the present invention, which is to continuously grow a small-diameter single crystal columnar portion 74 of a desired SiC polytype in the c-axis direction, preferably using a single axial screw dislocation.

As with options VS1 of FIG. 9(B) and VS2 of FIG. 10(B) (options involving vapor-solid growth), option VLS of FIG. 9(C) starts with selecting an LTC seed 58 with a tip portion that has a small diameter (preferably less than 1 mm in diameter) and that contains at least one (preferably just one) axial screw dislocation in the vicinity of the central axis through the tip portion to act as a continuous source of steps during growth. This is to ensure that the desired hexagonal (or rhombohedral) SiC polytype will be produced.

In general, the LTC seed 58 of FIG. 5 for this VLS option will have a solid solvent 168 attached to the tip portion 102 of the growing crystal 72. At the growth temperature, the solvent 168 becomes liquid and remains attached (due to surface tension) to the tip portion 102 to act as a solvent for solution growth of the tip portion 102 in the axial direction. Material for the growing tip portion 102 is provided by gaseous precursors that react with the liquid solvent 168. For this example (i.e. 4H—SiC), of this embodiment of the invention, the LTC seed 58 contains an axial screw dislocation along the central axis 60 that provides steps for the continued growth of the proper SiC polytypic stacking sequence.

As shown in FIG. 9(C), focused laser beams (114 and 116) can also be used to provide the proper temperature and temperature profile for the VLS process. In addition, Option VLS of FIG. 9(C) requires that additional precursors be added to the input gases, entering via inlets 112 and 128, so that solvent material can be added to the liquid solvent 168 during growth, because at least some of the solvent material 168 will be incorporated into the growing crystal. Sufficient solvent material 168 should be added to maintain a proper amount and shape of the liquid solvent 168 for optimized growth.

Dislocation-Assisted Growth Option: Combination of the Traveling Solvent Method TSM and the Laser Heated Pedestal Growth LHPG Method (Option TSM/LHPG)

Figure 11B:
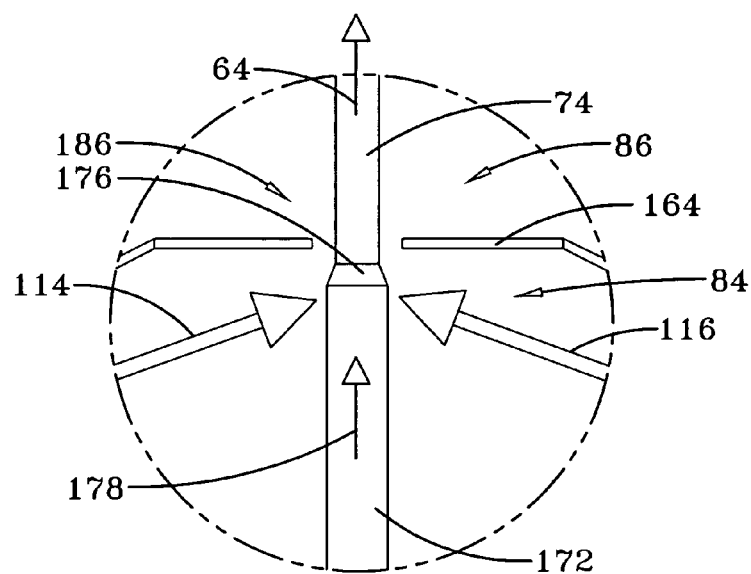
FIG. 11 is composed of FIGS. 11(A) and 11(B) and is a partial schematic cross-sectional drawing illustrating a fourth preferred embodiment (Option TSM/LHPG), shown most clearly in FIG. 11(B), for the growth of the tip portion of the LTC seed in region 1 of the growth process.
Figure 11A:
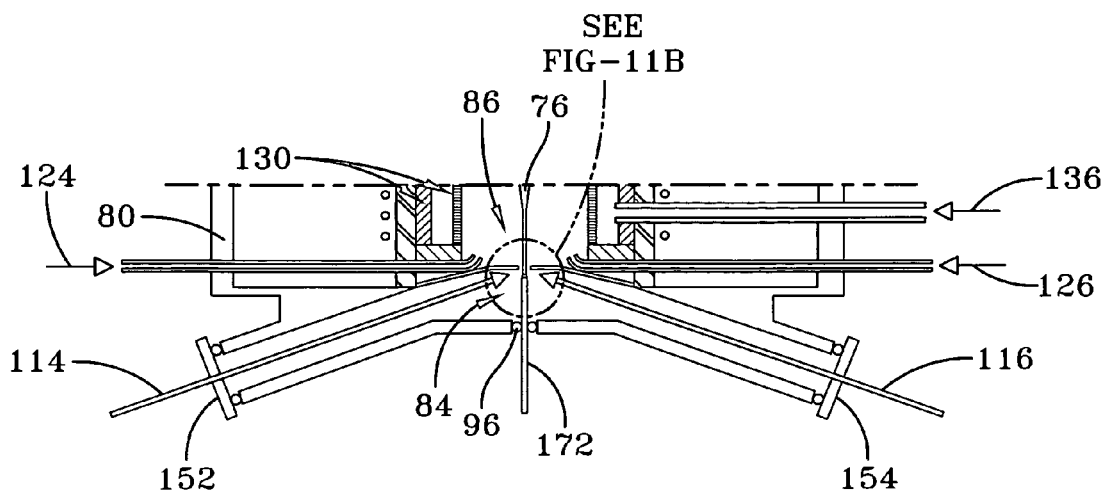

Another option (TSM/LHPG) for the axial growth of the tip portion 102 of the growing crystal 72 in the first growth region 84 is based on a new application of two prior-art growth processes (TSM) and (LHPG). Both of these prior art processes can be illustrated by FIG. 11 composed of FIGS. 11(A) and 11(B). FIG. 11(A) is similar to FIG. 10(A), except that FIG. 11(A) eliminates the showing of inlet 160 and adds the showing of laser-related elements 114, 116, 152 and 154, previously described with reference to FIG. 9(A).

The first of the two prior art growth processes, combined by the practice of the present invention, is the traveling solvent method (TSM), which has been known for many years and is further discussed in the technical article of L. B. Griffiths and A. I. Mlavsky, "Growth of α-SiC Single Crystals from Chromium Solution," J. Electrochem, Soc., Vol. 111, No. 7, pp. 805-810, 1964. As illustrated in FIG. 11 for the LTC process, the TSM process uses a solid source rod 172 (not necessarily single crystal) as the source of SiC for the growth of a SiC single crystal rod 74 (i.e. the columnar portion 74 of the growing crystal 72 in the LTC process for SiC as shown in FIG. 11(B)). A suitable liquid solvent 176 (e.g., Cr) is located between the columnar portion 74 and the source rod 172. The source rod 172 in the region of the solvent 176 can be heated by a suitable means to both melt the solvent and to provide a proper temperature gradient for epitaxial growth to occur on the single crystal rod 172. Growth conditions are set, so as to provide a desired growth rate downward of the columnar portion 74. As the columnar portion 74 grows, it is moved upward 64; as the source rod 173 is consumed, it also is moved upward 178. The motions 64 and 178 are balanced to provide a stable solvent zone that is stationary relative to the orifice 186 in the first growth region 84. Typically, the TSM process is used to grow larger diameter crystals (e.g. greater than 1 mm in diameter) than is desired for the LTC method. So, it is being combined with the Laser Heated Pedestal Growth (LHPG) process described in the following paragraph.

The second of the two prior art growth processes, combined by the practice of the present invention, is more fully described in U.S. Pat. No. 3,944,640. The purpose of this process is to grow single crystal fibers (i.e., small diameter rods 74) from a melt of the material being grown. In this process, more recently called the Laser Heated Pedestal Growth (LHPG) process, a small-diameter solid source feed rod 172 is used. The LHPG process is more fully described in the technical article of D. R. Ardila, M. R. B. Andreeta, S. L. Cuffini, A. C. Hernandes, J. P. Andreeta, Y. P. Mascarenhas, "Single-Crystal SrTiO$_3$ Fiber Grown by Laser Heated Pedestal Growth Method: Influence of Ceramic Feed Rod Preparation in Fiber Quality", Mat. Res., Vol. 1, No. 1, pp. 11-17, 1998. The LHPG process is different than the TSM process in that, instead of a solvent as in the TSM, a melt of the material is maintained by optical (usually a laser) means. High-quality single-crystal fibers (less than 1 mm in diameter) of many materials have been grown by the LHPG method.

By combining features of the TSM and LHPG methods, the desired growth of the tip portion 102 of the growing crystal 72 in the first growth region 84 of the LTC method can be accomplished. For example, by substituting a proper solvent (e.g. Cr or Al—Si for SiC growth), formed single-crystal fibers of SiC can be grown in the first growth region 84 of the LTC process. The solvent Cr is more fully described in the previously mentioned technical article of L. B. Griffiths et al, and the solvent Al—Si is more fully described in the previously mentioned technical article of C. Jacquier et al. Other suitable solvent and source materials can be selected for other WBG semiconductor materials to carry out the LTC process. The substitution of these materials produces a process, involved in the practice of the present invention, and herein termed the Option TSM/LHPG. This option can be used with LTC seeds with dislocations in the vicinity of and parallel to the central axis.

Overall Considerations for the Dislocation-Assisted Growth Options

Some aspects of both options VS1 of FIG. 9(B) and VS2 of FIG. 10(B) could be combined to provide advantageous growth conditions. For example, a heated partition plate 164 (shown in FIG. 10(B)) could be used to preclude unwanted deposition of crystal material in the vicinity of the orifice 166. The plate 164 could be heated directly or indirectly with focused light beams and/or other means.

The configuration described for Option VS2 of FIG. 10(B) could also be applied to the VLS growth of FIG. 9(C) of the tip portion 102 of the growing crystal 72; wherein the presence of the heated partition plate 164 could more effectively isolate the fast-growth, first-growth region 84 from the second growth region 86.

It has been shown disclosed in the technical paper by S. Nakamura, T. Kimoto, and H. Matsunami, "Effect of C/Si Ratio on the Spiral Growth on 6H—SiC (0001)," Jpn. J. of Appl. Phys., vol. 42, pp. L846-L848, 2003, that during the chemical vapor deposition (CVD) of SiC, the shape of spiral steps emanating from axial screw dislocations on the (0001) surface of the 6H—SiC substrates is affected by the C/Si ratio of the gaseous precursors. In addition, the C/Si ratio affects the cross-sectional shape of the c-axis growing hillock that is produced. Hence, the C/Si ratio of the input gaseous precursors should be optimized for the all of LTC growth process of the present invention applied to SiC crystal growth.

Additionally, instead of using gaseous precursors for options VS1 of FIG. 9(B) and VS2 of FIG. 10(B), solid source materials could be sublimed from a source (or sources) in close proximity to the tip portion 102 of the growing crystal 72 to produce advantageous growth conditions.

General Considerations for the Growth of the LTC Seed Crystals

An important aspect of the dislocation-assisted growth of an initial LTC seed is the crystal habit (shape) produced by the growth. The desired habit for this process in the first growth region 84 is a relatively small diameter, relatively small seed crystal, that grows at a rapid rate (the order of 0.5 mm/h, or greater) in the c-axis (vertical) direction. This is particularly challenging, because the normal crystal growth habit of non-cubic SiC is a platelet expanding perpendicular to the c-axis. It is also essential that the desired polytypic (in particular, for SiC) crystal stacking sequence be generated during this growth. Initially, a small diameter (preferably less than 1 mm in diameter) starter seed 57, such as that shown in FIG. 12(B), is selected and suitably mounted on the end 95A of a support rod 95 that can accommodate the high temperatures and chemistry of the growth processes. It is desired that the starter seed for growth of hexagonal SiC polytypes crystal contains at least one axial screw dislocation parallel to the c-axis so as to provide growth steps for the proper crystal stacking sequence as the LTC seed crystal is grown in the c-axis direction. However, dislocations may not be necessary for growth of 3C—SiC or other materials with a cubic crystal structure. More details of the selection and mounting procedures for a starter seed 57 are described hereinafter.

Preparation of an Initial Large Tapered Crystal Seed 58 for the LTC Method

The embodiments of the LTC method described hereinbefore have assumed the existence of a large tapered crystal seed 58 as the starting point for each growth cycle to produce a large low-defect crystal boule in specially configured growth reactor 70. The projected initial size of a typical LTC seed 58 is 100 mm in diameter at the base 62 and a length of about 500 mm. As the LTC process is developed further, the initial size could be even larger. The following embodiments describe the use of the growth reactor 70 to produce an initial LTC seed 58 from a very small starter seed that has dimensions of the order of 1 mm, or less, in all directions. As an example, the growth of an initial SiC LTC seed 58 from a very small starter seed 57 is to be described below with reference to FIG. 12 composed of FIGS. 12(A), 12(B), and 12(C).

A SiC starter seed 57 of FIG. 12A, shown most clearly in FIG. 12(B) can be prepared from an "on-axis" SiC wafer prepared by prior-art processes. An on-axis SiC wafer is one in which the polished face of the wafer is oriented within 0.5° (preferably 0.10 or less) of the basal plane (the (0001) crystal plane). Prior-art "on-axis" SiC wafers are available with diameters in the range 25 to 50 mm in diameter and have a thickness of less than 1 mm. As is well-known, prior art SiC wafers have a dislocation density (including axial screw dislocations) of the order of $10^4$ cm$^{-2}$. A starter seed 57, preferably containing one axial (relative to the crystal c-axis 18 shown in FIG. 2(C)) screw dislocation, can be obtained from an on-axis wafer by first identifying locations on the polished surface where axial screw dislocations intersect the surface. A common method of decorating dislocations intersecting the polished wafer surface is to etch the surface in molten KOH (potassium hydroxide) at approximately 550° C. When properly etched, the surface will exhibit hexagonal pits at the location of screw dislocations. With the dislocations properly decorated, small starter seed 57 containing an axial screw dislocation can be cut from the wafer.

For use in the growth reactor 70 shown in FIG. 12, a suitable starter seed 57, such as the starter seed 57 of FIG. 12(B), can be mounted with a selected orientation on the end 95A of a suitable support rod 95 as shown in FIG. 12B. The support rod 95 should be made of a material (e.g., TaC-coated refractory material) that can withstand the conditions of a growth cycle as described for previous embodiments. As with the LTC seed 57, the support rod 95 has a central axis 60 which extends along the length of the support rod 95 with the lowermost end of the central axis 60 passing through and along the vicinity of the axial screw dislocation of the 4H—SiC starter seed 57. The support rod 95 (with a starter seed 57 attached) is installed in the growth reactor 70 with its lowermost end 95A containing the starter seed 57 extending from the second growth region 86 through passageway 90 and into the first growth region 84. The uppermost end 95B of the support rod 95 is attached to the holder 93 in the third chamber 82 in a manner that provides rigid support for the support rod 95. Preferably, the diameter of the support rod 95 should taper from a larger diameter (the order of the diameter of the holder 93) at the uppermost end 95B to a smaller diameter (the order of diameter of the starter seed 57) at the lowermost end 95A.

With the support rod 95, with starter seed 57 attached, installed in the growth reactor 70, a growth cycle as described hereinbefore for other embodiments is carried out. A growth cycle utilizing a starter seed 57 will be termed herein as a "starter growth cycle".

A starter growth cycle using a starter seed 57 attached to a support rod 95 would proceed somewhat the same as a normal growth cycle for the previously described LTC seed 58. However, the difference would be that the growth on the support rod 95 would be polycrystalline material 99 as shown in FIG. 12(C). The growth on the starter seed 57 would be analogous to growth previously described on tip portion 102 for a completed LTC seed 58. Thus, the axial growth on the lowermost end of the starter seed 57 would proceed in a manner that would form a columnar crystal (i.e. the columnar portion of the LTC seed that is being grown in the starter growth cycle). As the columnar crystal moves into the second growth region 86, lateral growth 98 would occur. As the support rod 95 passes through the second growth region 86, polycrystalline growth would continue on the support rod 95 and lateral single crystal growth would continue on the tapered portion 76 that is forming on the growing starter seed 57. When lowermost portion 95A of the support rod 95 reaches the passageway 92 to the third chamber 82, an LTC seed now termed LTC seed 58 and shown in FIG. 12(C), will have been formed. An LTC seed 58 prepared as the result of a starter growth cycle shall be termed herein as an "initial LTC seed". It should be noted that the material formed on the support rod 95 above that for the "initial LTC seed" is polycrystalline as a result of growing on the support rod 95. It should also be noted that an "initial LTC seed", produced in a starter growth cycle, should have the same qualities (i.e. low-defect density) as an LTC seed produced in any growth cycle hereinbefore described. In fact, the terms LTC seed and initial LTC seed can and are herein used interchangeably.

The starter growth cycle described hereinbefore could be carried out in several stages (i.e. several growth cycles) instead of one. This may allow better optimization of the process for producing an initial LTC seed 58.

There are numerous methods of preparing a starter seed 57 for a starter growth cycle. Another method of preparing a starter seed 57 of FIG. 12(B) is to first locate axial screw dislocation on an "on-axis" prior-art SiC wafer by growing an epitaxial film on a properly prepared on-axis 4H—SiC wafer in a manner as more fully described in the previously mentioned technical article of P. G. Neudeck and J. A. Powell. If properly grown, an epitaxial film will exhibit hillocks generated by step-flow growth from axial screw dislocations as shown in FIG. 8.5 of the Neudeck and Powell article. The hillocks can be seen by Nomarski differential interference contrast (NDIC) optical microscopy. Thus located, a starter seed 57 including the hillock, (i.e., the screw dislocation providing the growth steps) can be cut from the wafer. This starter seed 57 is then used in the method of the present invention in a manner as previously described.

The present invention provides a further improved process for preparing prior-art SiC wafers to provide a starter seed 57 for a starter growth cycle of the LTC process. It is based on a technique for growing atomically flat mesa surfaces on prior-art on-axis SiC wafers as described in U.S. Pat. No. 5,915, 194. First, an array of hexagonally-shaped mesas is formed on the growth surface. The crystallographic orientation of the mesas may be further described with reference to FIG. 13 composed of FIGS. 13(A), 13(B), and 13(C) and to FIG. 14 composed of FIGS. 14(A) and 14(B).

Figure 13A:
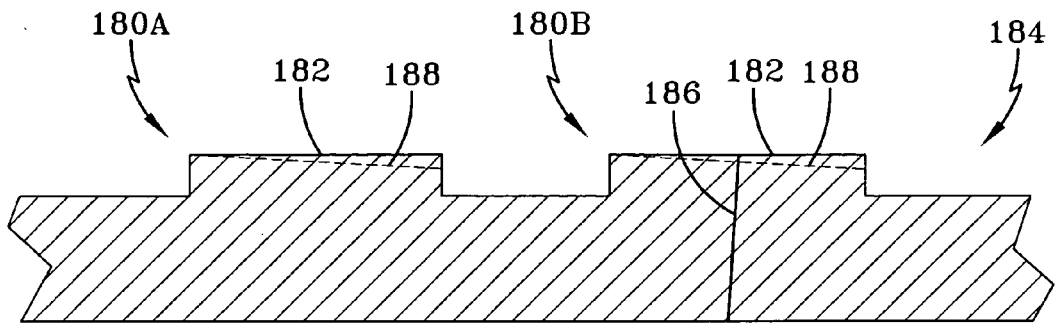
FIG. 13 is composed of FIGS. 13(A), 13(B) and 13(C) and presents several schematic cross-sectional drawings illustrating preparation of a mesa containing a selected axial screw dislocation (approximately perpendicular to the mesa top) that can be used as the starter seed (e.g. for Option VS1 and Option VS2) to produce an LTC seed.

FIG. 13(A) illustrates a cross-sectional view of mesas 180A and 180B formed on surface 182 of on-axis SiC wafer 184. Mesa 180A is dislocation free, whereas mesa 180B has a screw dislocation 186 that is perpendicular to the basal plane 188. From FIG. 13(A), it should be noted that top surface 182 of the mesas 180A and 180B is slight off-axis relative to the basal plane (0001) (188) of the SiC wafer 184.

Figure 13B:
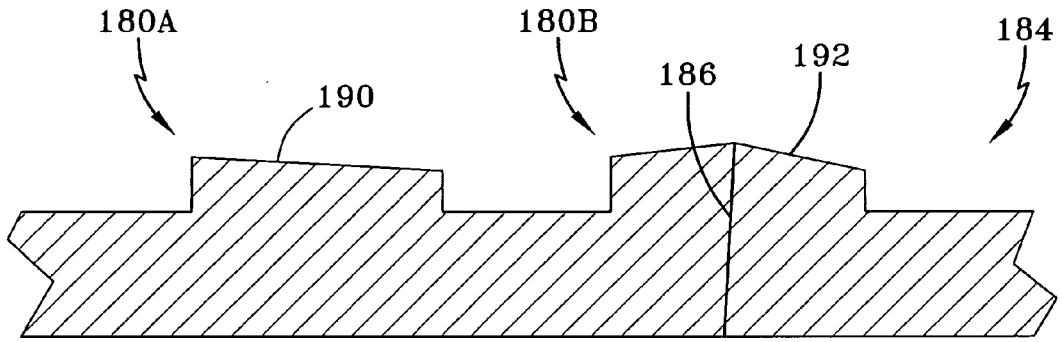

FIG. 13(B) illustrates a cross-section view of mesas 180A and 180B after epitaxial growth. It should be noted that at least one mesa 180A has a step-free surface 190 and at least one mesa 180B includes a screw dislocation 186 and a hillock 192. From the previously mentioned technical article of P. G. Neudeck and J. A. Powell, it should be understood that epitaxial growth on mesas without defects produces step-free surfaces, and epitaxial growth on mesas with a screw dislocation produces a hillock due to step growth of steps emanating from the screw dislocation.

Figure 13C:
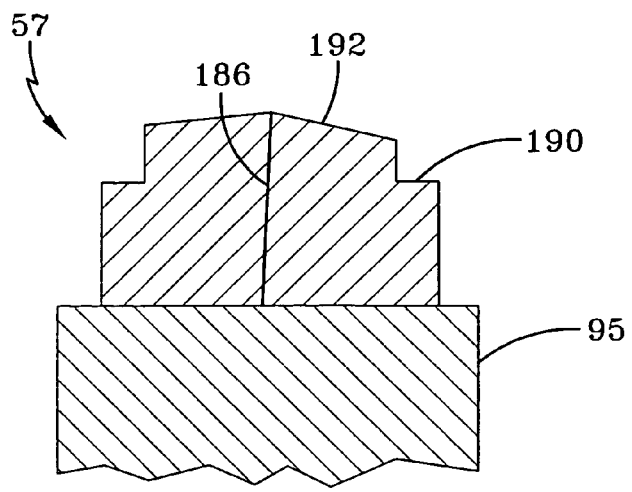

FIG. 13(C) is a vertical cross-sectional view of starter seed 57 (formed from mesa 180B of FIG. 13(C) after it has been cut from the wafer) mounted by a suitable means on the support rod 95.

Figure 14B:
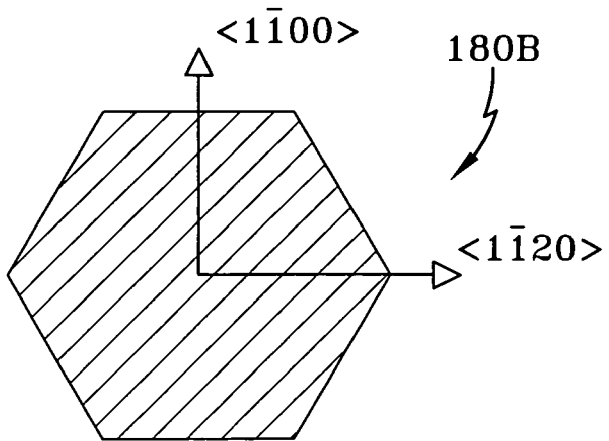
FIG. 14 is composed of FIGS. 14(A) and 14(B) and presents two schematic drawings illustrating a preferred shape, orientation, and mounting of a mesa containing an axial screw dislocation (approximately perpendicular to the mesa top) that is used as the starter seed (e.g. for Option VS1 and Option VS2) to produce an LTC seed.
Figure 14A:
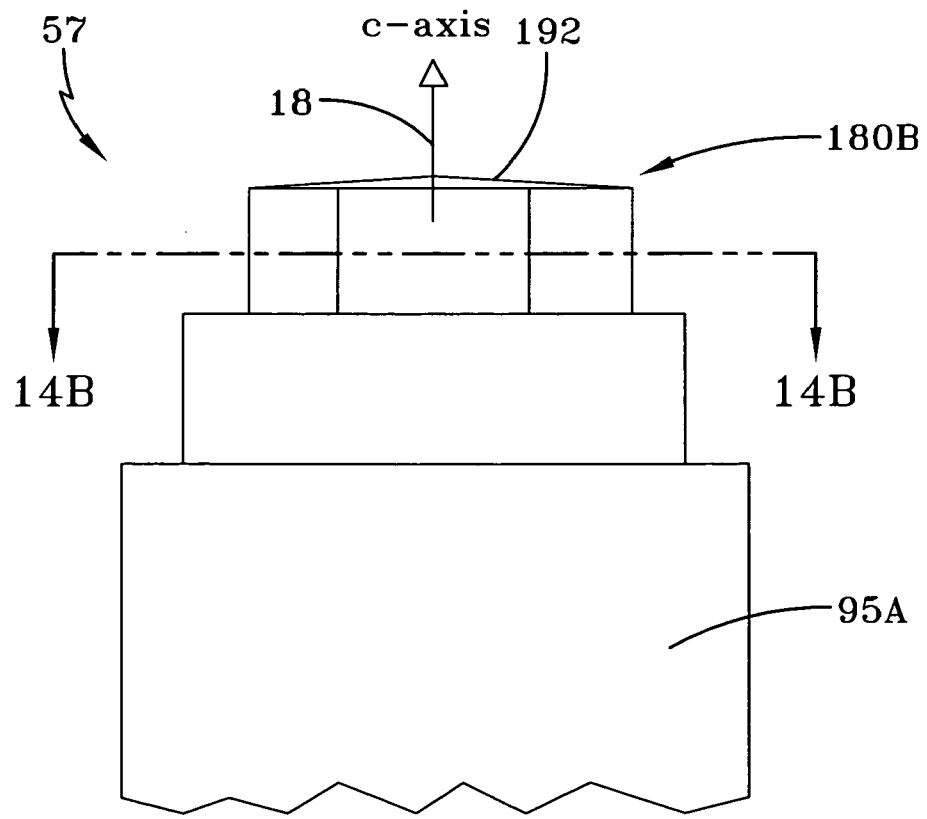

FIG. 14(A) illustrates a side view (instead of cross-section illustrated in FIG. 13(C)) of a starter seed 57 mounted on support rod 95 as shown by a front view of the support rod 95. The starter seed 57 of FIG. 14(A) is used in the starter growth cycle. The starter seed 57 of FIG. 14(A) has a hexagonally-shaped mesa 180B along with a hillock 192, and is shown as being oriented along the c-axis 18 (also shown in FIG. 6A).

FIG. 14(B) is a horizontal cross-sectional view taken along lines 14(B)-14(B) of FIG. 14(A) showing the shape and orientation of the hexagonal mesa 180B of the starter seed 57. The hexagonal shape and orientation relative to <1$\bar{1}$00> and <1$\bar{1}$20> crystallographic directions shown in FIG. 14(B) are chosen because epitaxial crystal growth on such a mesa maintains the hexagonal cross-sectional shape and orientation throughout the growth of hexagonal SiC polytypes. Mesas with screw dislocations 186 (i.e. like mesa 180B) can be identified by etching with KOH in a manner as previously described, or mesas with screw dislocations can be identified after epitaxial growth by the presence of a hillock.

Hence, after epitaxial growth, a mesa 180B with a screw dislocation 186, a growth hillock 192 can be selected, patterned, and cut from the wafer 184 to form the starter seed 57. The starter seed 57 can then be suitably mounted on a support rod 95. With this approach, a starter seed 57 with an axial screw dislocation 186 in the center and which has the desired size, shape and orientation, shown and described with reference to FIGS. 13 and 14, can be identified, selected, patterned, and cut from the wafer 184 and used for the starter seed 57 for the starter growth cycle. Also, additional epitaxial material can be grown on a selected mesa 180B to increase the size of the mesa before cutting the starter seed 57 from the wafer 184.

Still another method of preparing a starter seed 57 for the LTC process is to use techniques known in the art, which provide methods for locating screw dislocations in the middle of mesa structures. These techniques are discussed in the previously mentioned technical article of P. G. Neudeck and J. A. Powell entitled "Homoepitaxial and Heteroepitaxial Growth on Step-Free SiC Mesas," and in the previously mentioned U.S. Pat. No. 6,783,592B2. This technique of locating screw dislocations would allow optimized small starter seeds with a single dislocation (preferably located at the center of a mesa) to be fabricated for use with the LTC process.

Preparation of a Starter Seed for the Option VLS or Option TSM/LHPG Dislocation-Assisted Growth in the First Chamber If the Option VLS or Option TSM/LHPG process is used for the dislocation-assisted growth in a starter growth cycle, the preparation of the starter seed 57 of FIG. 12(B) may be described with reference to FIG. 15 composed of FIGS. 15(A), 15(B), 15(C) and 15(D) and to FIG. 16 composed of FIGS. 16(A), 16(B) and 16(C).

Figure 15A:
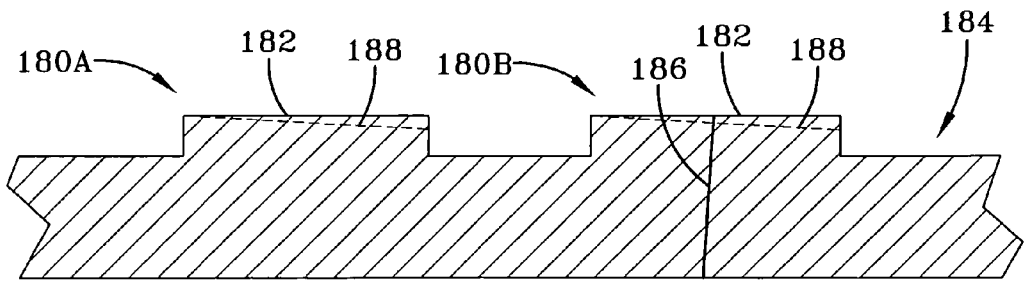
FIG. 15 is composed of FIGS. 15(A), 15(B), 15(C) and 15(D) and presents several schematic cross-sectional drawings illustrating preparation of a mesa containing a selected axial screw dislocation (approximately perpendicular to the mesa top) that can be used as a starter seed (e.g. for Option VLS and Option TSM/LHPG) to produce an LTC seed.

FIG. 15(A) is the same as FIG. 13(A) and uses the same reference numbers thereof.

Figure 15B:
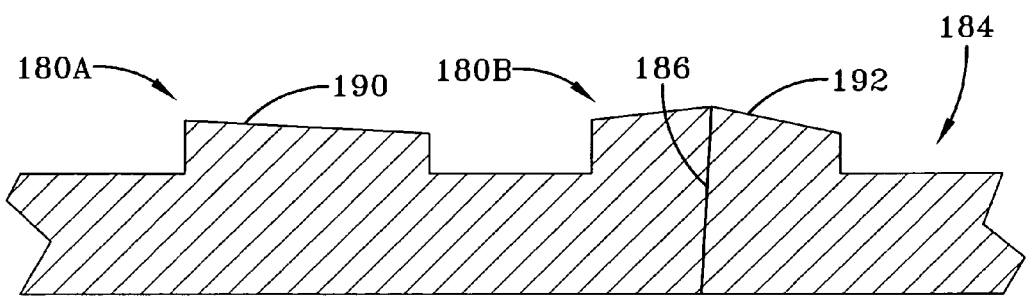

FIG. 15(B) is similar to FIG. 13(B), but is primarily meant to be shown the identification of mesas 108B with suitably positioned screw dislocations 186.

Figure 15C:
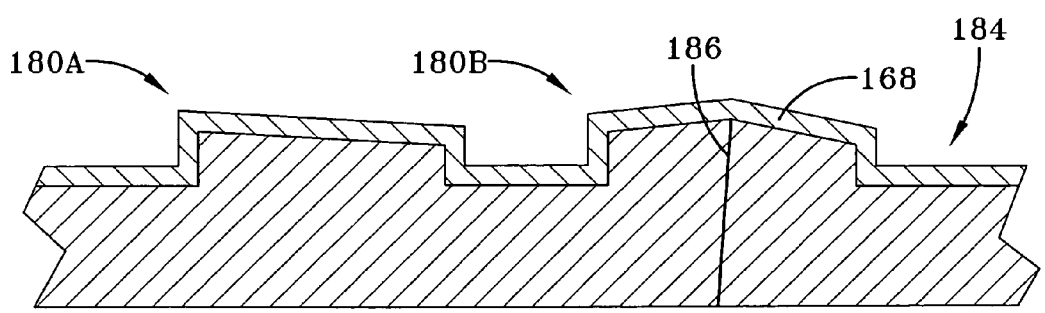

FIG. 15(C) is a cross-sectional view of the mesa 108B of FIG. 15(B) after applying the solvent material 168, previously described with reference to FIG. 9(C), to epitaxial growth using the Option VLS, and to FIG. 11(B), to using the Option TSM/LHPG.

Figure 15D:
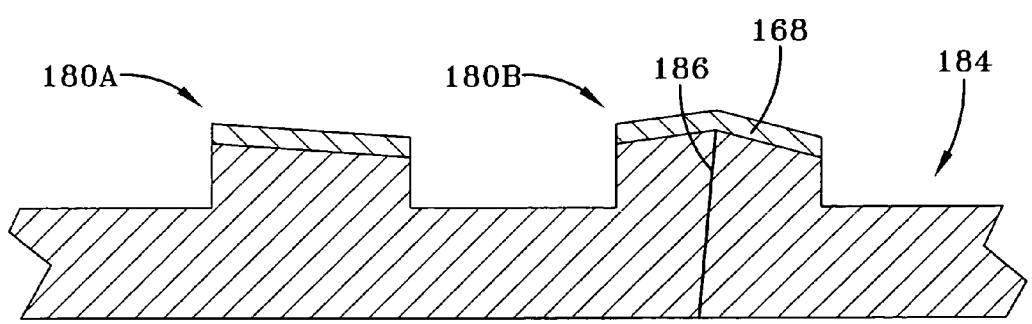

FIG. 15(D) is a cross-sectional view of mesas 180A and 108B after removal of excess solvent material 168 from the trench regions between mesas. It is preferred that the solvent material be left only on the top of the mesas 180A and 180B. From FIG. 15(D) it should be noted that a mesa 180B is selected as having a screw dislocation 186 that is required for the practice of the present invention toward growing hexagonal SiC polytypes.

Figure 16C:
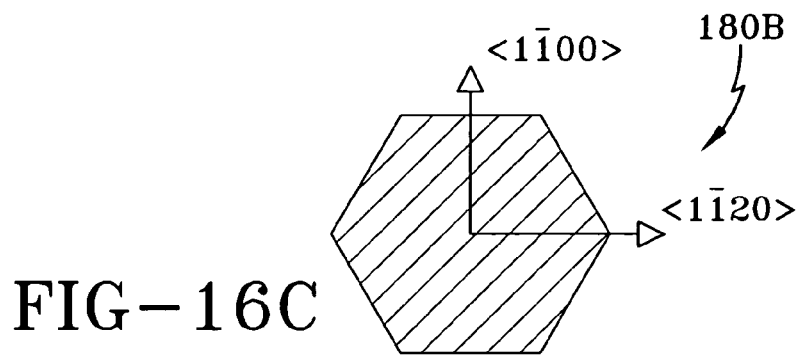
FIG. 16 is composed of FIGS. 16(A), 16(B), and 16(C) and presents three schematic drawings illustrating preferred shape, orientation, and mounting of a mesa containing an axial screw dislocation (approximately perpendicular to the mesa top) that is used as a starter seed (e.g. for Option VLS and Option TSM/LHPG) to produce an LTC seed.
Figure 16B:
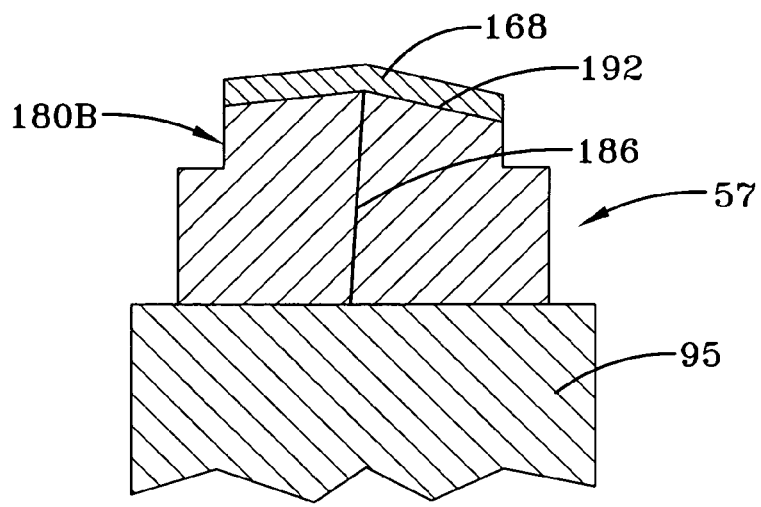
Figure 16A:
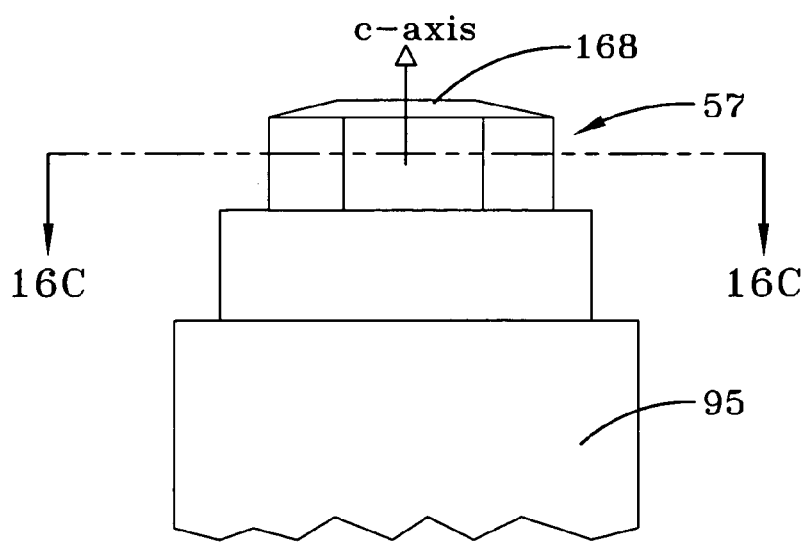

FIG. 16(A) is similar to FIG. 14(A) except for the solvent material 168 being placed on top of the selected mesa used as the starter seed 57.

FIG. 16(B) is a vertical cross-sectional view of starter seed 57 cut from the wafer 184 and mounted on support rod 95, while also showing the solvent material 168 placed on mesa 180B, which also includes a hillock 192 and a screw dislocation 186.

FIG. 16(C) is a horizontal cross-sectional view taken along lines 16(C)-16(C) of FIG. 16(A) and shows the shape and orientation of the starter seed 57. FIG. 16(C) also illustrates a top view of hexagonal mesa 180B on starter seed 57 showing shape and orientation with axis <1$\bar{1}$00> and <1$\bar{1}$20> which represent the equilibrium growth shape and orientation for crystal materials with a hexagonal crystal structure.

As shown in FIGS. 15(C) and 15(D), a selected solvent material 168 is deposited on the mesas 180A and 180B after the epitaxial growth. Then, using suitable photolithography patterning procedures and etching procedures (known to those skilled in the art), material (including wafer material and solvent material) is removed from the sample being processed in order produce a sample with solvent material 168 only on top of the mesas 180A and 180B. A selected starter seed 57 with the solvent material 168 can then be cut from the wafer 184 and mounted on support rod 95 as shown in FIG. 16(A). FIG. 16(A) illustrates the solvent 168 after it has been melted by heating in the LTC growth reactor.

In addition to the sequential steps illustrated in FIGS. 15 and 16, it is desired to locate axial screw dislocations in an on-axis SiC wafer 184, and cutting starter seed 57 with appropriately positioned screw dislocations from the wafer 184. A suitable solvent 168 should be applied to the top of the mesa 180B of the starter seed 57. A suitable solvent material, such as chromium, or an alloy thereof, should be chosen that (1) will act as a suitable solvent for solution growth of SiC at the desired growth temperature and (2) will properly wet and stay attached to the small end of the seed crystal. The chosen solvent material 168 must be applied to the top of the starter seed 57, in a manner that the solvent material 168 forms a satisfactory bond to the SiC surface. The measure of a satisfactory bond is that when the solvent material 168 is melted (near the desired crystal growth temperature), the liquid solvent wets and adheres to the surface nearly perfectly. The reason is to ensure that when growth from solution begins and continues, uniform growth will occur at the liquid-solid interface.

Growth of Bulk Crystals of Other Hexagonal Crystal Materials

The growth procedure and growth reactor 70, previously described with reference to FIGS. 5-16 are suitable for the growth of hexagonal crystal materials other than SiC. For example, with suitable modifications (i.e. using materials and conditions known to those skilled in the art), low-defect bulk crystals of GaN, AlN, and other WBG materials could be produced. As an example of a modification, much lower crystal growth temperatures are normally used for GaN and AlN, compared to that used for SiC crystal growth. Other embodiments (e.g. involving localized sublimation, or laser ablation of source materials) could be used for not only SiC, but also for other WBG materials at growth temperatures as high as 2100° C.

Growth of Bulk Cubic Crystals

Most aspect of the processes and growth reactor 70 previously described with reference to FIGS. 5-16 also apply to the growth of large low-defect completed crystal 72 of cubic SiC (3C—SiC) crystals. The only change is that references to the crystal structure and crystal axis need to be changed in accordance with cubic crystal notation. For example, the corresponding crystal axis for the <0001> c-axis in hexagonal (or rhombohedral) SiC is the <111> axis in 3C—SiC. Also, the corresponding crystal plane for the (0001) basal plane in hexagonal SiC is the {111} plane in 3C—SiC. Perhaps the most significant change is that the methods can be applied to 3C—SiC without screw-dislocation-assisted growth (which is required for 4H—SiC and 6H—SiC). It has been found that 3C—SiC will nucleate along crystal facet edges to produce faceted three dimensional (3D) crystals. This discovery is more fully described in the technical article of P. G. Neudeck, A. J. Trunek, and J. A. Powell, "Atomic Force Microscope Observation of Growth and Defects on As-Grown (111) 3C—SiC Mesa Surfaces," Mat. Res. Soc. Symp. Proc., Vol. 815, pp. Materials Research Society, 2004. It is also known that the 3C—SiC is the stable SiC polytype at temperatures less than about 2000° C. Hence, all the procedures described herein with reference to FIGS. 5-16 for the growth of low-defect hexagonal SiC can also be applied to 3C—SiC and other cubic crystals (e.g. diamond, cubic GaN) with tetrahedral bonding. Even though axial screw dislocations are not necessary for desired growth of the cubic SiC polytype, their presence may nevertheless assist the desired fast axial (vertical) growth of cubic SiC, and other cubic crystals of WBG materials.

Preparation of a Starter Seed for the Growth of Cubic Crystals

A method, known as step-free surface heteroepitaxy can be used with certain modification thereof by the present invention for the preparation of a low-defect cubic starter seed 57 composed of SiC. Step-free surface heteroepitaxy is more fully described in the previously mentioned technical article of P. G. Neudeck and J. A. Powell and U.S. Pat. Nos. 5,915,194; 6,165,874; and 6,488,771B1. The method for the preparation of low-defect starter seed 57 may be further described with reference to FIG. 17 composed of FIGS. 17(A), 17(B), 17(C) and 17(D).

Figure 17A:
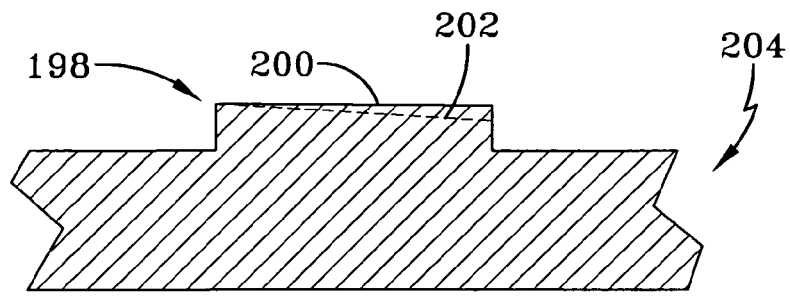
FIG. 17 is composed of FIGS. 17(A), 17(B), 17(C) and 17(D) and presents several schematic cross-sectional drawings illustrating preparation and mounting of step-free SiC mesa with a heteroepitaxially-grown defect-free (or nearly defect-free) crystal layer (e.g. either a cubic crystal structure, or a III-Nitride compound or alloy) on the top of the mesa. The <111> axis (for a cubic structure) or the c-axis (for a hexagonal structure) of the crystal layer is perpendicular to the atomically-flat interface. The crystal layer is used as a starter seed to produce an LTC seed.
Figure 17B:
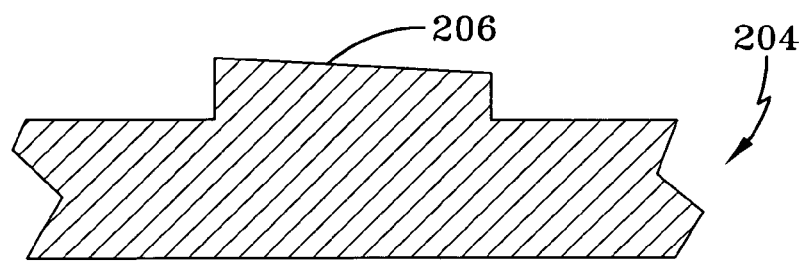
Figure 17C:
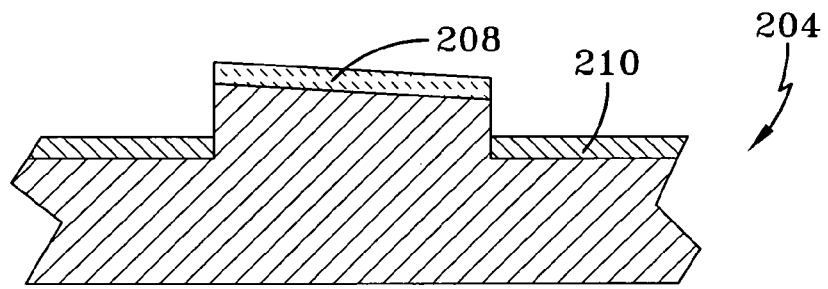
Figure 17D:
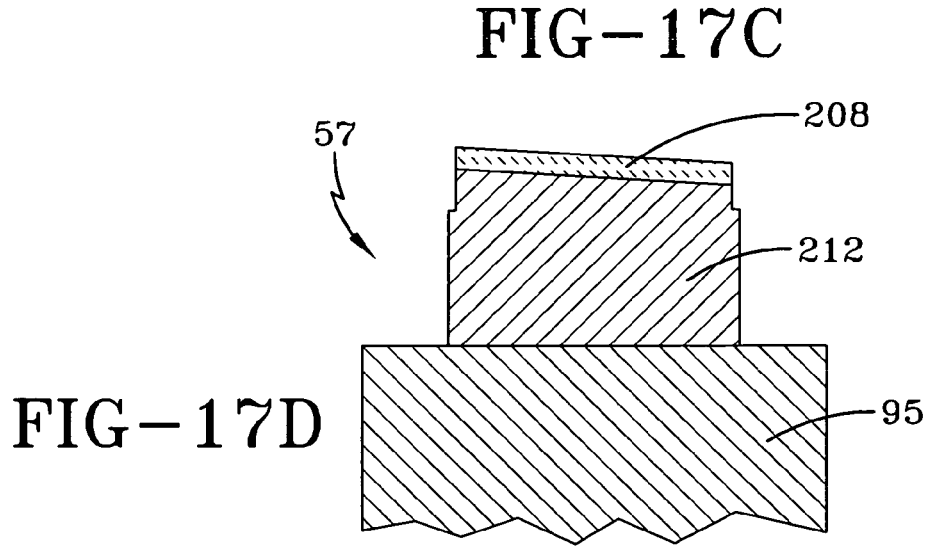

In this method, as seen in FIG. 17(A), mesas 198 are prepared on the surface of an on-axis (i.e., the tilt angle of polished surface 200 that is less than 0.5° from the basal plane 202) α-SiC (e.g. 4H—SiC, or 6H—SiC) wafer 204. Under suitable conditions, atomic surface steps (not shown) on the polished surface 200 are grown out of existence to produce a step-free surface 206, as shown in FIG. 17(B) and more fully described in U.S. Pat. No. 5,915,194. Under a second set of suitable conditions, a low-defect (or zero-defect) heteroepitaxial crystal layer 208 of 3C—SiC is grown on the step-free surface 206 as shown in FIG. 17(C). Further details of a step-free surface are given in the previously mentioned technical article of P. G. Neudeck and J. A. Powell, entitled; "Homoepitaxial and Heteroepitaxial Growth on Step-Free SiC Mesas," and in U.S. Pat. No. 6,488,771B1. Material 210 grown on the wafer in trenches between the mesas is typically defective 3C—SiC. A suitable sample 212 with a low-defect 3C—SiC crystal layer can be cut from the wafer 204 and mounted on a suitable support rod 95 (see FIG. 17(D)) for use as a starter seed 57 for a starter growth cycle utilizing the LTC process.

A 3C—SiC starter seed 57 that is defect-free (i.e. no screw dislocations and no stacking faults) could be chosen. Also, with this same approach, a 3C—SiC starter seed 57 with a single screw dislocation could be selected and used. Cubic starter seed crystals of other WBG materials could be prepared in a similar fashion using α-SiC wafers, or hexagonal wafers of other materials. Although the same basic procedure would be the same, different growth conditions and precursor materials (known to those skilled in the art) would have to be used for other WBG materials.

Cutting of Wafers from Completed Boules

As discussed hereinbefore, completed boules (72A of FIG. 7(C)) of hexagonal SiC polytypes can be cut at an angle to the basal plane (e.g., 3.5° for 6H—SiC and 8° for 4H—SiC). With the LTC growth process of the present invention, the saw cut to remove the completed crystal boule 72A of FIG. 7(C) from the completed crystal 72 of FIG. 7(A) can be at a desired angle. The desired angle and direction of cut would match that required for the selected SiC polytype and wafer specification. This procedure would significantly minimize waste of crystal material known to plague prior art SiC wafer boule production processes in cutting wafers from the grown boules.

Extended (or Continuous) Growth by the LTC Process

With the embodiments of the LTC process described herein with reference to FIGS. 5-17, it has been assumed that the completed crystal 72 of FIG. 7(A) would be removed from the growth reactor 70, at the end of a growth cycle in order to cut the completed boule 72A of FIG. 7(C) from the completed crystal 72. Other various embodiments are now described, which allow the completed boule 72A to be cut from the completed crystal 72 in situ in order to reduce down-time between growth cycles. One such embodiment is schematically shown in FIG. 18, which is similar to FIG. 6.

Figure 18:
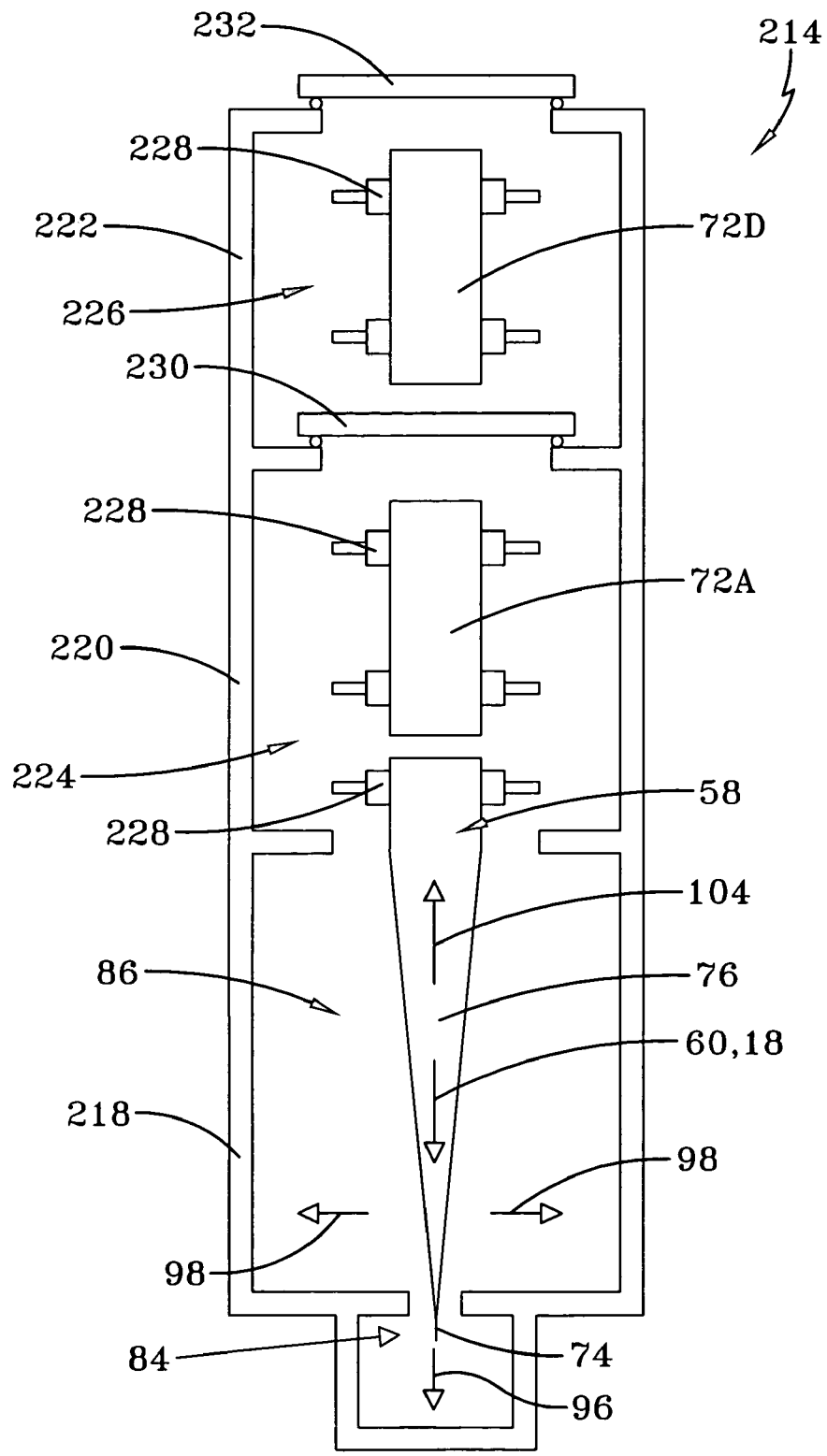
FIG. 18 is a schematic drawing that represents the overall process steps and the regions of growth (or no growth) of the present invention under conditions of continuous growth of the crystal boule, including the showing of an optional fourth chamber and region.

In FIG. 18, the growth reactor has been modified from that of FIG. 6 in several ways that are revealed in a comparison between FIGS. 6 and 18, wherein FIG. 18 illustrates a growth reactor 214 comprised of first, second, third and fourth chambers 216, 218, 220 and 222. First, the no-growth region 88 of FIG. 6 has been modified to no-growth region 224 of FIG. 18 to (1) allow the cutting of the completed crystal 72, while the growth is in-progress or in situ, while the growth has been interrupted, and (2) allow for the storage of a completed boule 72A of FIG. 7(C) (after being cut from the completed crystal 72) in the no-growth region 224. Second, a storage region 226 has been added to allow the removed completed boule 72A to be cooled to near room temperature before it is removed from the growth reactor 214. Third, the crystal holders 228 of FIG. 18 have been added, and coordinated with the holder 93 (not shown), to allow transferring of completed boules 72A within the reactor 214 of this embodiment.

An example of this embodiment is that a completed crystal 72 is grown as previously described with reference to FIG. 6. Then the gaseous precursors are turned off and growth interrupted. At this point, rotation by holder 96 of the completed crystal 72 about the central axis 60 is also stopped. However, the temperature is held at the same or near that of the growth temperature. The crystal holders 228 are positioned on either side of a desired cut that would separate the completed boule 72A of FIG. 7(C) from the completed crystal 72 of FIG. 7(A). The desired cut is then made with a suitable saw mechanism (not shown in FIG. 18). At this stage, the completed boule 72A of FIG. 7(C), that has been cut, is held by suitable crystal holders 228. With storage region 226, at the same temperature, pressure and atmosphere as the no-growth region 224, door 230 is then opened and the completed boule 72A is moved to the storage region 224 and transferred to crystal holders 228 that reside in storage area 226. In this storage region 226, the completed boule is designated as 72D. Door 230 is then closed and the completed boule 72D in storage 224 is cooled to near room temperature. When the completed boule 72D has been cooled to room temperature and the atmosphere changed to air (or an inert gas), door 232 is opened and the completed boule 72D is removed from the reactor. Door 232 is then closed to complete the removal cycle.

After removal of the completed boule 72D from the growth reactor 214, the conditions for growth in the first 84, and second 86 growth regions can be "turned on" in a suitable manner, and growth in both regions can be continued. This cycle can be repeated as long as desired, or as long as the state of the reactor remains acceptable.

Other approaches to improving the output of a growth reactor can be used. For example, the time of growth cycles could be increased to as long as the growth reactor can accommodate the size of a completed boule and/or until the condition of the growth reactor allows the continued growth of a completed boule.

Additional Preferred Embodiments of the LTC Process

In preferred embodiments of the LTC process described hereinbefore, the first and second growth regions 84 and 86, respectively, are closely coupled. That is, the length of the columnar portion 74 (measured parallel to the central axis) is very short (i.e. less than or the order of 1% of the length of the completed crystal 72). However, in another preferred embodiment, the length of the columnar portion 74 could be extended to any desired length, thus forming a single crystal in the shape of a small-diameter fiber of extended length. As this small-diameter fiber grows in length, the end could be moved into a second growth region 86 that is located at any convenient selected location relative to the first growth region 84. Growth could then continue in both growth regions 84 and 86, as previously described herein for other preferred embodiments. Changes required for the implementation of this embodiment are that the first and second growth regions 84 and 86, respectively, would be physically separated and suitable temperature, atmospheric, and physical conditions would be established to maintain the integrity of the fiber as it moved from one location to the other. Still another preferred embodiment would be for the shape of the second growth surface, such as the tapered portion 76 of the growth crystal 72, to be any selected shape (e.g. cylindrical instead of a tapered shape as described in previous sections) as long as the second growth surface meets the definition of the practice of the present invention.

In another preferred embodiment, the length of the single-crystal fiber (i.e. a columnar portion 74 with an extended length) could be grown to any desired length in a first growth region 84 in a first growth reactor and saved in suitable manner for use at a later time in a second growth reactor with a suitable second growth region 86. The various LTC methods described hereinbefore for the first growth region could be incorporated into a first growth reactor and the various growth procedures described hereinbefore for the second growth region could be incorporated in a second growth reactor. If the diameter of the single-crystal fiber is small enough (i.e. much smaller than 1 mm), the single-crystal fiber could be cooled in a suitable manner, coiled in a suitable manner, and then stored for later use. This embodiment allows for the growth of a low-defect crystal boule to be carried out in two distinct steps (i.e. in two separate growth reactors). This also allows for more flexibility in the application of preferred embodiments previously described herein. As in the previous paragraph, suitable temperature, atmospheric, and physical conditions would be established to maintain the integrity of the single-crystal fiber as it was moved, handled, and stored. Suitable etching of the single-crystal fiber may be required to establish the proper surface condition prior to lateral epitaxial growth (i.e. on the second growth surface in the second growth region) that is carried out in the second growth reactor.

Estimated and Calculated Growth Parameters

Some assumed and estimated parameters can be calculated in order to evaluate the method of the present invention to produce 100 4H—SiC wafers, 100-mm in diameter, per week in a single growth reactor. Some parameters and results are given as follows:

Part A: Growth of an initial LTC Seed 58 from a Starter Seed 57

Assume:
 (1) a starter seed 57 with dimensions of less than 1 mm;
 (2) a projected initial LTC seed 58 with a base diameter of 100 mm and an overall length of 500 mm and a columnar portion 74 diameter of less than 1 mm;
 (3) a screw-dislocation-assisted fast growth rate (along c-axis direction parallel to the central axis) of 0.5 mm/h (temperature in the range (1600° to 2100° C.) in the first growth region; and
 (4) a lateral linear growth rate (perpendicular to the central axis) of 0.05 mm/h (temperature in the range: 1500° to 2000° C.) in the second growth region.

With these assumed and estimated parameters, the required length of the second growth region 86 would be 500 mm and the time of passage through the second growth region 86 for a given point on the moving seed crystal would be 42 days. That is, 42 days are required to produce the initial LTC seed 58.

Part B: Growth of Completed Boules 72A

Once an initial LTC seed is produced, subsequent growth cycles will start producing completed boules 72A with a diameter of 100 mm as soon as the start-up time is accomplished. The growth rate parallel to the central axis of the completed boule 72A will be the fast growth rate of the dislocation-assisted growth in the first growth region 84. If a growth reactor 70 or 214 was operated 6 days per week, with a one-day turn around for unloading an entire completed crystal 72 and reloading the produced new LTC seed 58 for the subsequent growth cycle, a suitable growth reactor could produce at least 100 wafers (100 mm in diameter) per week. This assumes that a polished wafer thickness plus losses due to cutting and polishing the wafers would be about 0.7 mm per wafer.

In addition to producing a large quantity of 100-mm-diameter, nearly-defect-free SiC wafers per week, the LTC method of the present invention has an additional very important impact on wafer production. That is, the diameter 106 of the boules 72A of FIG. 7(C) produced is independent of the c-axis growth rate of the boules. The impact is that the size of the reactor can be scaled up to produce larger (150 and 200 mm diameters) wafers without losing the quality or quantity calculated for the above example. It should be pointed out, however, that it would take longer to produce the initial LTC seed 58 for the first full scale growth cycle. After that, the same number of wafers per week (as for the 100 mm wafers) for a growth reactor should be obtainable.

Also, from a production viewpoint, it should be recalled that each completed boule 72A of FIG. 7(C) is cut from the completed crystal 72 at the same off-axis angle that is desired for the subsequent wafers that will be cut from the boule. This dramatically reduces wasted boule material that is characteristic of prior-art SiC boule growth processes.

Application of the LTC Process to Materials Other than SiC

The LTC method hereinbefore discussed with reference to FIGS. 1-18 can be applied to III-V compounds (e.g. hexagonal and cubic GaN and AlN) and diamond. This application requires changes in the precursors and growth conditions specific to each material. These changes are known in the art of the epitaxial crystal growth of specific materials.

Advantages of the LTC Method of the Present Invention Over Prior Art Processes

It should now be appreciated that with the LTC method of the present invention, the wafers cut from boules 72A of FIG. 7(C) are defect-free (or nearly defect-free) except for a very small area in the center of the wafers. With prior art, the defect density is high over all or a large portion of the wafers cut from boules.

It should also be appreciated that with the LTC method of the present invention, nearly all of the growth is perpendicular to the c-axis using conventional chemical vapor deposition (CVD) and a hot-wall reactor at uniform moderate temperature and a moderate growth rate. With prior art, growth is predominantly in the c-axis direction with detrimentally multiple screw dislocations providing the steps for step-flow growth and detrimentally higher growth temperatures, resulting in wafers with high dislocation densities throughout the resulting wafer area.

Furthermore, it should be appreciated that with the LTC method of the present invention, growth in the c-axis direction requires only one axial screw dislocation to achieve a high growth rate because only a very small area of the growth front is oriented in the c-axis direction. With prior art, most of the growth front is oriented within a few degrees of the c-axis. This prior art requires multiple screw dislocations in order to achieve high growth rates and multiple screw dislocations disadvantageously lead to problems of coalescence of steps from multiple step sources.

In addition, it should be appreciated that with the LTC method of the present invention, the seed crystal 58 shape remains the same (i.e. growth front remains the same) throughout growth cycle. Current sublimation or CVD processes involve significant change in growth front. This requires modification of the temperature profile during the growth.

Still further in addition, it should be appreciated that with the LTC method of the present invention, there is very little waste in cutting wafers from the boule 72A of FIG. 7(C). With prior art, much waste is incurred because of the varying diameter and non-symmetrical shape of the boule.

Moreover, it should be appreciated that with the LTC method of the present invention, mounting of the seed crystal 58 is simple because the back side of the seed crystal 58 is at a great distance from c-axis growth. With prior art, the mounting of the thin planar seed crystal requires very careful mounting to eliminate defects from propagating from imperfect bonding of the wafer backside to wafer holder.

It should also be appreciated that with the LTC method of the present invention, growth continues (after the first growth cycle) using a new LTC seed generated from the previous growth cycle. With prior art, a new seed crystal must be prepared and very carefully mounted for each growth run.

Also, it should be appreciated that with the LTC method, the method can easily be scaled up to produce larger diameter boules because most of the growth occurs in a uniform temperature field. With prior art, controlling and modifying the temperature profile at the growth front during growth becomes increasingly difficult as the diameter increases.

The invention has been described with reference to preferred embodiments and alternates thereof. It is believed that many modification and alterations to the embodiments as described herein will readily suggest themselves to those skilled in the art upon reading and understanding the detailed description of the invention. It is intended to include all modifications and alterations insofar as they come within the scope of the present invention.

What we claim is:

1. A method for crystal growth of a low-defect, tetrahedrally-bonded, single crystal comprising the steps of:
   a) providing a crystal seed having a defined vertical central axis with said central axis having a top and said central axis being parallel within 5 degrees to a selected crystal direction, with said crystal seed having several connected major portions substantially cylindrically symmetric about said central axis, and said major portions comprising of (1) a base located at the top of said central axis and having a diameter and opposite lower and upper ends, (2) a tapered portion extending downward from said lower end of said base, said tapered portion having a lower end that is smaller in diameter than said diameter of said base, (3) a columnar portion extending downward from said lower end of said tapered portion, and (4) a tip portion at the lowermost end of said columnar portion;
   b) providing a growth apparatus with first, second and third chambers respectively defining interlaced region 1, region 2, and region 3, with the first, second and third chambers being arranged vertically with said first chamber at the bottom, said second chamber in the middle, and said third chamber at the top, and said chambers providing at least a first passageway between first and second chambers and a second passageway between second and third chambers with said passageways arranged along said central axis;
   c) providing a holder located inside said third chamber for holding said base of said crystal seed so that said tapered portion of said crystal seed lies between both said first and second passageways and extends completely through said region 2, and with said columnar portion extending into said region 1;
   d) providing means within said first chamber for axial crystal growth of said tip portion of said crystal seed in a manner that maintains the diameter of said tip portion as measured perpendicular to said central axis, to be less than 10 percent of the diameter of said base of said crystal seed;
   e) providing means within said second chamber for lateral crystal growth of said tapered portion of said crystal seed; and
   f) providing means for moving said base of said crystal seed along said central axis and in a manner that maintains the location of the growing said tip portion fixed within 1 cm relative to said first growth chamber.

2. The method according to claim 1, wherein said single crystal has a desired length dimension defined to be the distance along said central axis from the uppermost portion of said base to said tip portion and wherein:
   a) said axial crystal growth and said lateral crystal growth are continued until said length of said single crystal has reached said desired length; and
   b) said single crystal is cut into two pieces comprising (1) said base and a selected portion of said single crystal that is adjacent to said base, wherein said base and said selected portion are designated as the crystal boule, and (2) remainder of said single crystal, wherein said remainder is used as said crystal seed in a subsequent growth run according to claim 1.

3. The method according to claim 2, wherein said cutting of said single crystal is comprised of cutting at a desired angle relative to said central axis.

4. The method according to claim 1, wherein said tip portion has a diameter measured perpendicular to said central axis and wherein said diameter of said tip portion is less than 1 mm, and said axial crystal growth of said tip portion is carried out in a manner that maintains said diameter of said tip portion to be less than 1 mm.

5. The method according to claim 1, wherein said crystal seed contains at least one axial screw dislocation that (1) is located approximately in the center of said tip portion, and (2) is parallel within 5 degrees to said central axis, and wherein said axial crystal growth in said first chamber takes place by a step-flow growth mechanism from steps created by said at least one axial screw dislocation.

6. The method according to claim 5, wherein said crystal seed is comprised of 4H—SiC, and wherein said selected crystal direction is in the <0001> or the <000$\overline{1}$> crystal direction.

7. The method according to claim 6, wherein said diameter of said tip portion is less than 5 mm.

8. The method according to claim 7, wherein said diameter of said tip portion is less than 1 mm, and wherein said at least one axial screw dislocation is a single axial screw dislocation.

9. The method according to claim 7, wherein said tip portion has a temperature and wherein said means within said first chamber for said crystal growth of said tip portion of said crystal seed is selected to be chemical vapor deposition carried out by impinging one or more gaseous precursors upon the said tip portion wherein said temperature of said tip portion is greater than 1400° C., and wherein said one or more impinging gaseous precursors provide silicon atoms and carbon atoms to the said tip portion of said crystal seed.

10. The method according to claim 6, wherein said means within said first chamber for said crystal growth of said tip portion provides a vertical axial crystal growth rate measured in millimeters per hour (mm/hour) parallel to said central axis that exceeds 1 mm/hour.

11. The method according to claim 6, wherein said tapered portion has a temperature and wherein said means within said second chamber for said lateral crystal growth of said tapered portion of said crystal seed is selected to be chemical vapor deposition carried out by impinging one or more gaseous precursors upon the said tapered portion wherein the temperature of said tapered portion is less than 2000° C., and wherein said one or more impinging gaseous precursors provide silicon atoms and carbon atoms to the said tapered portion of said crystal seed.

12. The method according to claim 1, wherein said crystal seed has said selected crystal direction in the <0001> or the <000$\bar{1}$> crystal direction and is of a material selected from the group comprising the hexagonal and rhombohedral polytypes of SiC, and wurtzite crystal forms of the Group III-Nitrides and alloys thereof.

13. The method according to claim 1, wherein said crystal seed has said selected crystal direction in the <111>, <110>, or <100> crystal directions and is a material selected from the group comprising 3C—SiC, zinc blende crystal forms of Group III-Nitrides and alloys thereof, and diamond.

14. The method according to claim 1, wherein said crystal seed is selected from a group of material that includes the polytypes of SiC, the Group III-Nitrides, and alloys thereof, and diamond.

15. The method according to claim 1, wherein said means within said first chamber for said axial crystal growth of said tip portion of said crystal seed is selected to provide a deposition method selected from the group of crystal growth methods consisting of chemical vapor deposition (CVD), vapor-liquid-solid (VLS) crystal growth method, and a combination of the traveling solvent method (TSM) and the laser heated pedestal growth (LHPG) method.

16. The method according to claim 15, wherein said combination of the traveling solvent method (TSM) and the laser heated pedestal growth (LHPG) method comprises a TSM method that provides growth on said tip portion of said crystal seed, and a LHPG method that comprises one or more lasers that are used as a source of energy to maintain and control temperature of the crystal growth on said tip portion of said crystal seed.

17. The method according to claim 15, wherein said vapor-liquid-solid (VLS) crystal growth method, and a combination of the traveling solvent method (TSM) and the laser heated pedestal growth (LHPG) method utilize liquid chromium, or a liquid solution of several materials, as a solvent for growing a crystal selected from the polytypes of SiC.

18. The method according to claim 15, wherein said vapor-liquid-solid (VLS) crystal growth method utilizes one or more lasers that are used as a source of energy to maintain and control temperature and temperature gradient of said axial crystal growth on said tip portion of said crystal seed.

19. The method according to claim 1, wherein said means within said second chamber for growth of said tapered portion of said crystal seed is selected to provide deposition on said tapered portion of said crystal seed by using chemical vapor deposition (CVD).

20. The method according to claim 19, wherein said chemical vapor deposition is high-temperature chemical vapor deposition (HTCVD).

21. The method according claim 20, wherein said high temperature chemical vapor deposition is provided by hot-wall chemical vapor deposition.

22. The method according to claim 1, wherein said first chamber has a box-like configuration with said first passageway being located in an upper-central portion of said box-like configuration and wherein said means within said first chamber provided for said axial crystal growth of said tip portion of said crystal seed comprises;
   first inlet located in said first chamber at a position which is lower than said first passageway and receives a gaseous precursor from an external source;
   second inlet located in said first chamber at a position which is lower than said first passageway and receives a carrier gas for said gaseous precursor from an external source;
   a flow nozzle located near said first passageway and near said tip portion of said crystal seed and controlling the flow of said gaseous precursor; and
   a heater located in a said first chamber at a position which is lower than said first passageway so as to provide heat to said flow nozzle.

23. The method according to claim 22, wherein said heater comprises a laser source that emits at least one laser beam that is directed onto said flow nozzle.

24. The method according to claim 22, further comprising directing at least one laser beam from an external source onto said tip portion and said columnar portion of said crystal seed.

25. The method according to claim 22, further comprising a second heater located near said tip portion of said crystal seed.

26. The method according to claim 1, wherein said tip portion of said crystal seed is provided with a solvent thereon.

27. The method according to claim 1, wherein said first chamber has a box-like vertical cross-sectional configuration with an approximate cylindrical horizontal cross-section configuration perpendicular to said central axis and with said first passageway being located in an upper-central portion of said box-like configuration and wherein said means within said first chamber provided for said growth of said crystal seed in said region 1 comprises;
   first inlet located in said first chamber at a position lower than, but near said first passageway and receives a gaseous precursor from an external source;
   second inlet located in said first chamber at a position which is lower than said first passageway and receives a carrier gas for said gaseous precursor from an external source;
   a first exhaust outlet provided to exhaust gases from said first chamber;
   a plate with an orifice located near said first passageway and with said tip portion of said crystal seed extending through said orifice, with said orifice controlling said diameter of said tip portion of said crystal seed receiving said gaseous precursors.

28. The method according to claim 1, wherein said growth apparatus and said crystal seed are vertically flipped (about a horizontal axis of rotation), so that said third chamber and said base reside closer to the surface of the Earth than said first chamber, and wherein said holder is aided by Earth gravity holding said base of said crystal seed to a movable support residing inside said third chamber.

29. The method according to claim 1, wherein said means within said second chamber provided for said growth of said crystal seed in said region 2 comprises;
- an inductively heated two-cylinder susceptor having an inner cylinder and a substantially concentric outer cylinder with the inner cylinder being located adjacent to said tapered portion of said crystal seed, and with the outer cylinder having at least one opening and having thermal insulation on said outer cylinder, and with induction coils for heating said susceptor being placed about said thermal insulation;
- at least one inlet located near said first passageway for receiving gaseous precursor from an external source;
- at least one inlet connected to said opening in said outer wall of said susceptor for receiving a purge gas from an external source; and
- at least one outlet located near said second passageway for exhausting gas from said second chamber.

30. The method according to claim 29, wherein said inner cylinder of said two-cylinder susceptor comprises an arrangement selected from the group consisting of small channels and a permeable plate.

31. The method according to claim 1, wherein said third chamber comprises;
- a single-cylinder heater having an inside wall and an outside wall with the inside wall being located adjacent to said base portion of said crystal seed and with the outside wall having thermal insulation thereon, and with induction coils being placed about said thermal insulation; and
- at least one inlet connected to said third chamber for receiving a purge gas from an external source.

32. The method according to claim 31, further comprising providing a fourth chamber located above and interlaced to said third chamber by a fourth passageway therebetween.

33. The method according to claim 1, wherein said holder is a thermally-insulated rotary holder for providing rotation to the crystal seed.

34. The method according to claim 1, wherein said third chamber has an upper portion and wherein said method further comprises providing a third passageway at said upper portion of said third chamber.

35. A method for the crystal growth of a low-defect tetrahedrally-bonded single crystal comprising the steps of:
a) providing a starter crystal seed having crystal directions and having a defined tip portion and having a defined vertical central axis parallel within 5 degrees to a selected crystal direction and having dimensions perpendicular to said selected crystal direction that are less than 5 mm;
b) providing a growth apparatus with first, second and third chambers respectively defining interlaced region 1, region 2, and region 3, with the first, second and third chambers being arranged (1) substantially vertically along said central axis with the first chamber being lowest thereof and the third chamber being the highest thereof and; (2) to provide at least a first passageway between first and second chambers and a second passageway between second and third chambers with said passageways arranged along said vertical central axis;
c) providing an elongated support rod having a lowermost end, a long axis and a defined length;
d) mounting said starter crystal seed on said lowermost end of said elongated support rod such that said central axis of said starter crystal is parallel to said long axis of said support rod and such that said defined length of said support rod is sufficient to span a distance from said region 3 to said region 1 through said first and second passageways;
e) providing a holder located inside said third chamber for holding the uppermost end of a support rod in a manner that said support rod extends completely through said region 2, and with the lowermost end of said support rod with said starter crystal seed attached extending into said region 1;
f) providing means within said first chamber for axial crystal growth of the tip portion of said starter crystal seed and in a direction downward along said central axis and in a manner that produces a columnar crystal having an axis which is parallel within 5 degrees to said central axis;
g) providing means within said second chamber for the epitaxial lateral crystal growth of the growing said columnar crystal;
h) providing means for moving said holder and said support rod upward along said central axis and in a manner that maintains the location of the growing said tip portion fixed within 1 cm relative to said first chamber and said vertical central axis; and
i) continuing (1) said crystal growth in said first and second chambers and (2) said movement of said holder and support rod until said lowermost end of said support rod moves into said third chamber.

36. The method according to claim 35, wherein said crystal seed contains at least one axial screw dislocation that (1) is located approximately in the center of said tip portion, and (2) is parallel within 5 degrees to said central axis, and wherein said axial crystal growth in said first chamber takes place by a step-flow growth mechanism from steps created by said at least one axial screw dislocation.

37. The method according to claim 36, wherein said crystal seed is comprised of 4H—SiC, and wherein said selected crystal direction is in the <0001> or the <000$\bar{1}$> crystal direction.

38. The method according to claim 35, wherein said crystal seed has said selected crystal direction in the <0001> or the <000$\bar{1}$> crystal direction and is of a material selected from the group comprising the hexagonal and rhombohedral polytypes of SiC, and wurtzite crystal forms of the Group III-Nitrides and alloys thereof.

39. The method according to claim 35, wherein said crystal seed has said selected crystal direction in the <111>, <110>, or <100> crystal direction and is a material selected from the group comprising 3C—SiC, zinc blende crystal forms of Group III-Nitrides and alloys thereof, and diamond.

40. The method according to claim 35, wherein said diameter of said tip portion is less than 1 mm, and wherein said at least one axial screw dislocation is a single axial screw dislocation.

41. A method for the crystal growth of a low-defect WBG single crystal of predetermined diameter and predetermined length of a tetrahedrally-bonded WBG crystal material, comprising the steps of:
a) providing a starter crystal seed of said tetrahedrally-bonded WBG crystal material having crystal directions and having a tip portion and having a defined central axis parallel within 5 degrees to a selected crystal direction and having dimensions perpendicular to said selected crystal direction that are less than 5 mm;

b) providing two separate crystal growth reactors, designated as growth reactor 1 and growth reactor 2;

c) installing said starter crystal seed in said growth reactor 1 and providing means in said growth reactor 1 whereby axial crystal growth of the tip portion of the said starter crystal seed is carried out in a manner that maintains the diameter of said starter crystal, measured perpendicular to the central axis, to less than a first predetermined diameter;

d) continuing said axial crystal growth in said growth reactor 1 until a columnar crystal of said first predetermined diameter and a predetermined length is produced;

e) removing said columnar crystal from growth reactor 1, installing said columnar crystal in growth reactor 2, and providing means in said growth reactor 2 whereby lateral crystal growth of the said columnar crystal is carried out until a low-defect crystal of a second predetermined diameter is produced.

42. The method according to claim 41, wherein said tip portion has a center and wherein said starter crystal seed contains at least one axial screw dislocation that (1) is located approximately in the center of said tip portion and (2) is parallel within 5 degrees to said central axis, and wherein said axial crystal growth in said growth reactor 1 takes place by a step-flow growth mechanism from steps created by said at least one axial screw dislocation.

43. The method according to claim 42, wherein said crystal seed is comprised of 4H—SiC, and wherein said selected crystal direction is in the <0001> or the <000$\bar{1}$> crystal direction.

44. The method according to claim 41, wherein said crystal seed has said selected crystal direction in the <0001> or the <000$\bar{1}$> crystal direction and is of a material selected from the group comprising the hexagonal and rhombohedral polytypes of SiC, and wurtzite crystal forms of the Group III-Nitrides and alloys thereof.

45. The method according to claim 41, wherein said crystal seed has a selected crystal direction in the <111>, <110>, or <100> crystal direction and is a material selected from the group comprising 3C—SiC, zinc blende crystal forms of Group III-Nitrides and alloys thereof, and diamond.

46. The method according to claim 41, wherein said dimensions of said starter crystal are less than 1 mm.

* * * * *